(12) United States Patent
Sukekawa et al.

(10) Patent No.: US 11,139,302 B2
(45) Date of Patent: Oct. 5, 2021

(54) INTEGRATED ASSEMBLIES COMPRISING SPACES BETWEEN BITLINES AND COMPRISING CONDUCTIVE PLATES OPERATIONALLY PROXIMATE THE BITLINES, AND METHODS OF FORMING INTEGRATED ASSEMBLIES

(71) Applicant: Micron Technology, Inc., Boise, ID (US)

(72) Inventors: Mitsunari Sukekawa, Hiroshima (JP); Hiroaki Taketani, Hiroshima (JP)

(73) Assignee: Micron Technology, Inc., Boise, ID (US)

( * ) Notice: Subject to any disclaimer, the term of this patent is extended or adjusted under 35 U.S.C. 154(b) by 20 days.

(21) Appl. No.: 16/435,924

(22) Filed: Jun. 10, 2019

(65) Prior Publication Data

US 2020/0388619 A1      Dec. 10, 2020

(51) Int. Cl.
| | |
|---|---|
| *H01L 27/108* | (2006.01) |
| *H01L 23/532* | (2006.01) |
| *H01L 29/10* | (2006.01) |
| *H01L 29/40* | (2006.01) |
| *H01L 21/768* | (2006.01) |

(Continued)

(52) U.S. Cl.
CPC .... *H01L 27/10814* (2013.01); *H01L 21/0217* (2013.01); *H01L 21/02164* (2013.01); *H01L 21/02282* (2013.01); *H01L 21/7682* (2013.01); *H01L 23/528* (2013.01); *H01L 23/53257* (2013.01); *H01L 23/53295* (2013.01); *H01L 27/10873* (2013.01); *H01L 27/10885* (2013.01);

(Continued)

(58) Field of Classification Search
CPC ......... H01L 27/10814; H01L 27/10891; H01L 27/10873; H01L 27/10885; H01L 21/7682
See application file for complete search history.

(56) References Cited

U.S. PATENT DOCUMENTS 5,990,509 A * 11/1999 Burns, Jr. ......... H01L 27/10808
                                                             257/296
6,867,125 B2    3/2005 Kloster et al.
(Continued)

OTHER PUBLICATIONS

Hidaka et al., "Twisted Bit-Line Architectures for Multi-Megabit DRAM'S", IEEE Journal of Solid-State Circuits, vol. 24 (1), Feb. 1989, pp. 21-27.

*Primary Examiner* — Bac H Au
(74) *Attorney, Agent, or Firm* — Wells St. John P.S.

(57) ABSTRACT

Some embodiments include an integrated assembly having bitlines spaced from one another by intervening voids. Insulative supports are over the bitlines. A conductive plate is supported by the insulative supports and is proximate the bitlines to drain excess charge from the bitlines. Some embodiments include a method of forming an integrated assembly. A stack is formed to have insulative material over bitline material. The stack is patterned into rails that extend along a first direction. The rails include the patterned bitline material as bitlines, and include the patterned insulative material as insulative supports over the bitlines. The rails are spaced from one another along a second direction, orthogonal to the first direction, by voids. Sacrificial material is formed within the voids. A conductive plate is formed over the insulative supports and the sacrificial material. The sacrificial material is removed from under the conductive plate to re-form the voids.

26 Claims, 41 Drawing Sheets

(51) Int. Cl.
*H01L 21/02* (2006.01)
*H01L 29/66* (2006.01)
*H01L 29/78* (2006.01)
*H01L 23/528* (2006.01)

(52) U.S. Cl.
CPC .... *H01L 27/10891* (2013.01); *H01L 29/1037* (2013.01); *H01L 29/402* (2013.01); *H01L 29/66666* (2013.01); *H01L 29/7827* (2013.01)

(56) References Cited

U.S. PATENT DOCUMENTS

| | | | |
|---|---|---|---|
| 8,097,949 B2 | 1/2012 | Gosset et al. | |
| 9,659,998 B1* | 5/2017 | Lung | H01L 45/1608 |
| 2003/0064581 A1 | 4/2003 | Pan et al. | |
| 2010/0285662 A1* | 11/2010 | Kim | H01L 21/76831 |
| | | | 438/675 |
| 2011/0215396 A1* | 9/2011 | Tang | H01L 29/861 |
| | | | 257/329 |
| 2012/0056148 A1* | 3/2012 | Kakegawa | H01L 45/144 |
| | | | 257/4 |
| 2014/0231892 A1* | 8/2014 | Song | H01L 21/76897 |
| | | | 257/296 |
| 2016/0197092 A1* | 7/2016 | Hong | H01L 27/11582 |
| | | | 257/314 |
| 2016/0268500 A1* | 9/2016 | Furuhashi | H01L 27/228 |
| 2019/0088739 A1* | 3/2019 | Lee | H01L 27/10814 |
| 2019/0103302 A1* | 4/2019 | Yoon | H01L 27/10855 |
| 2019/0355903 A1* | 11/2019 | Lung | H01L 27/2427 |

* cited by examiner

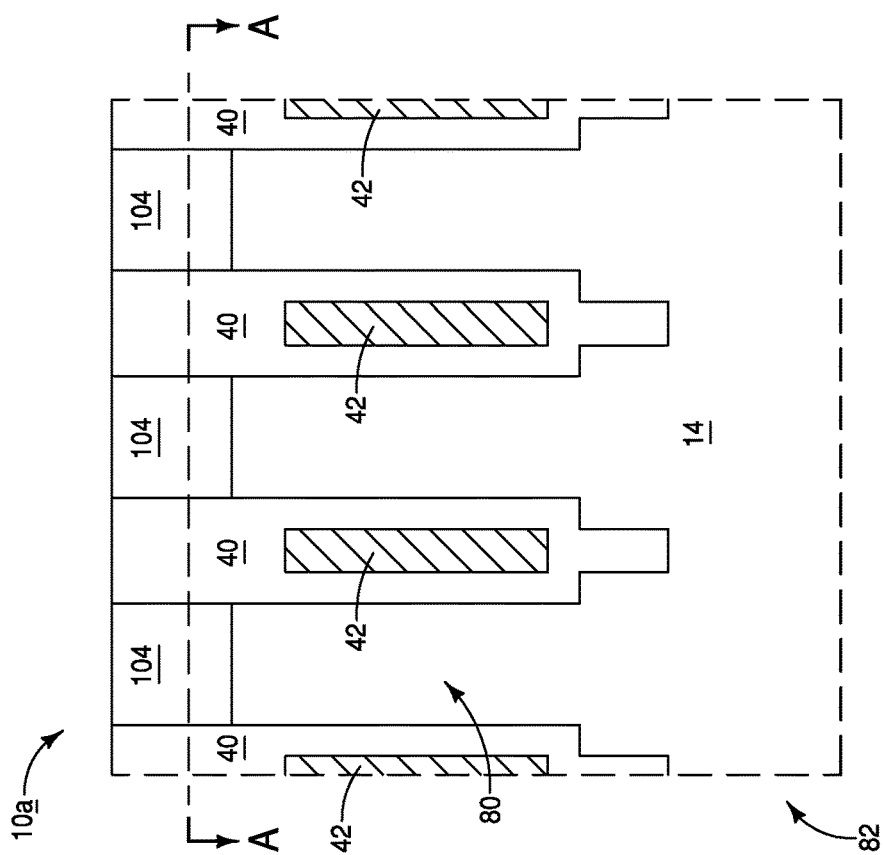
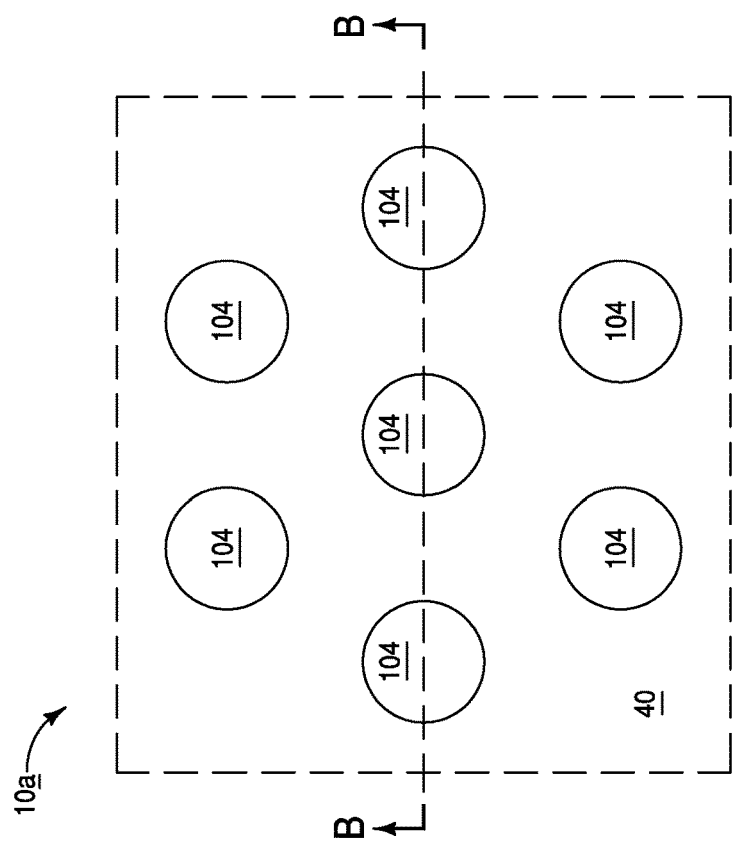
FIG. 8B
FIG. 8A

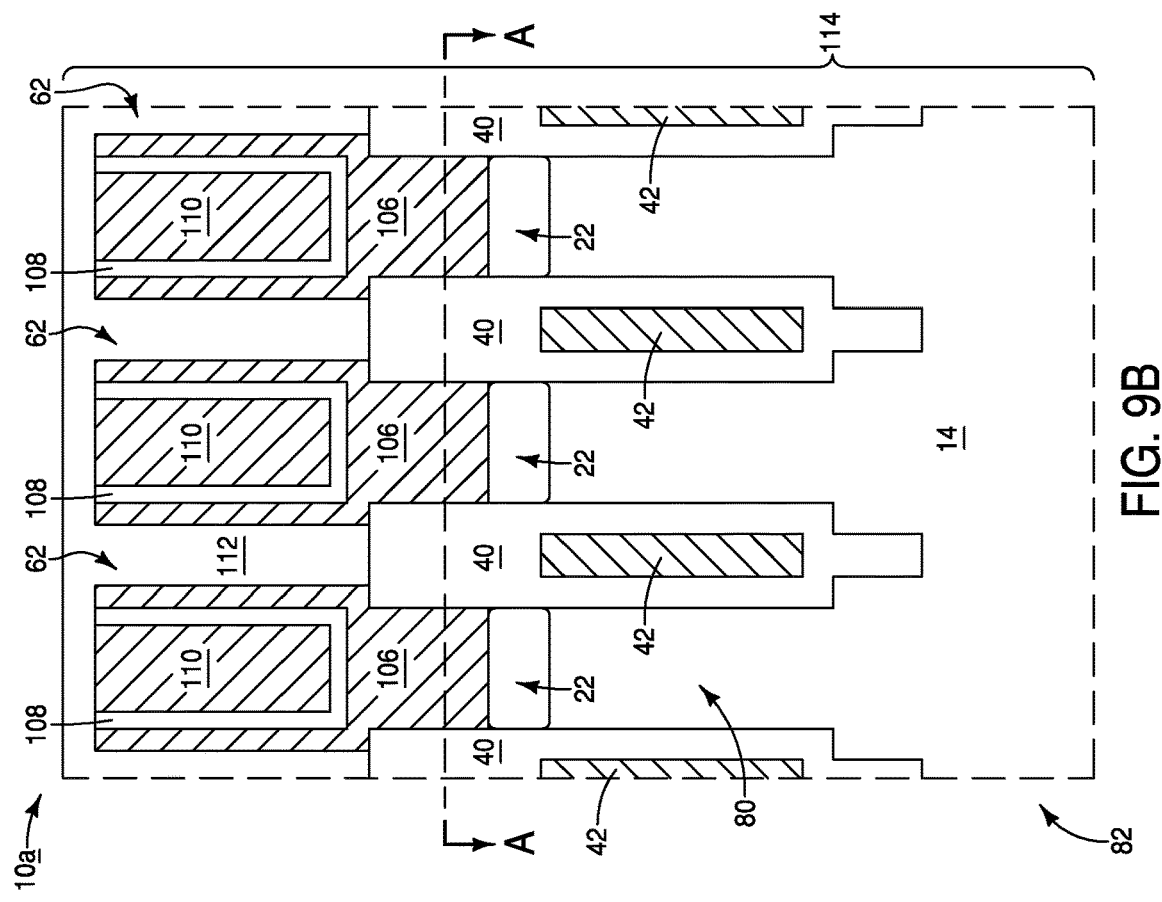
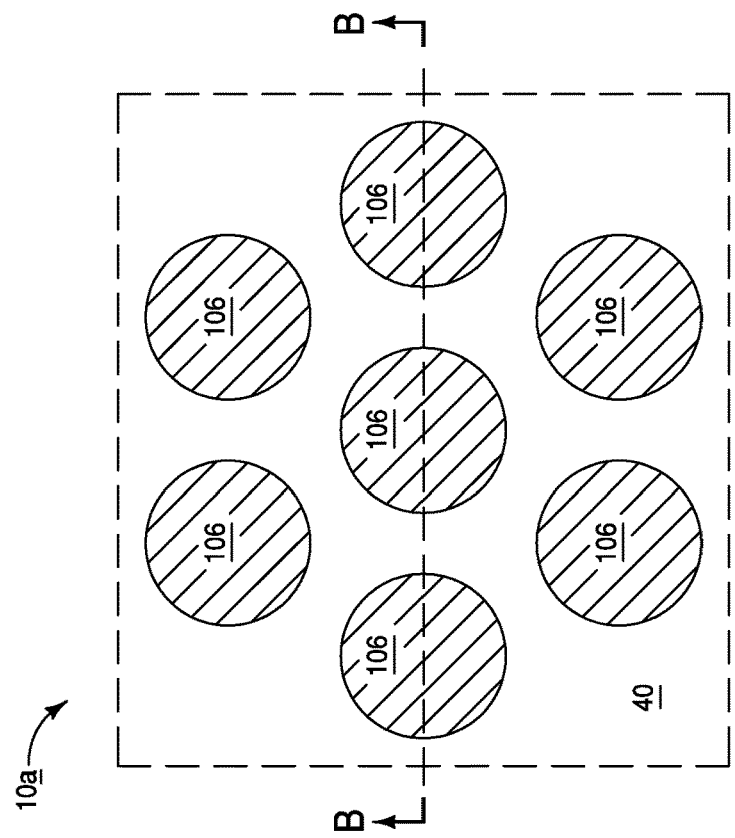
FIG. 9B
FIG. 9A

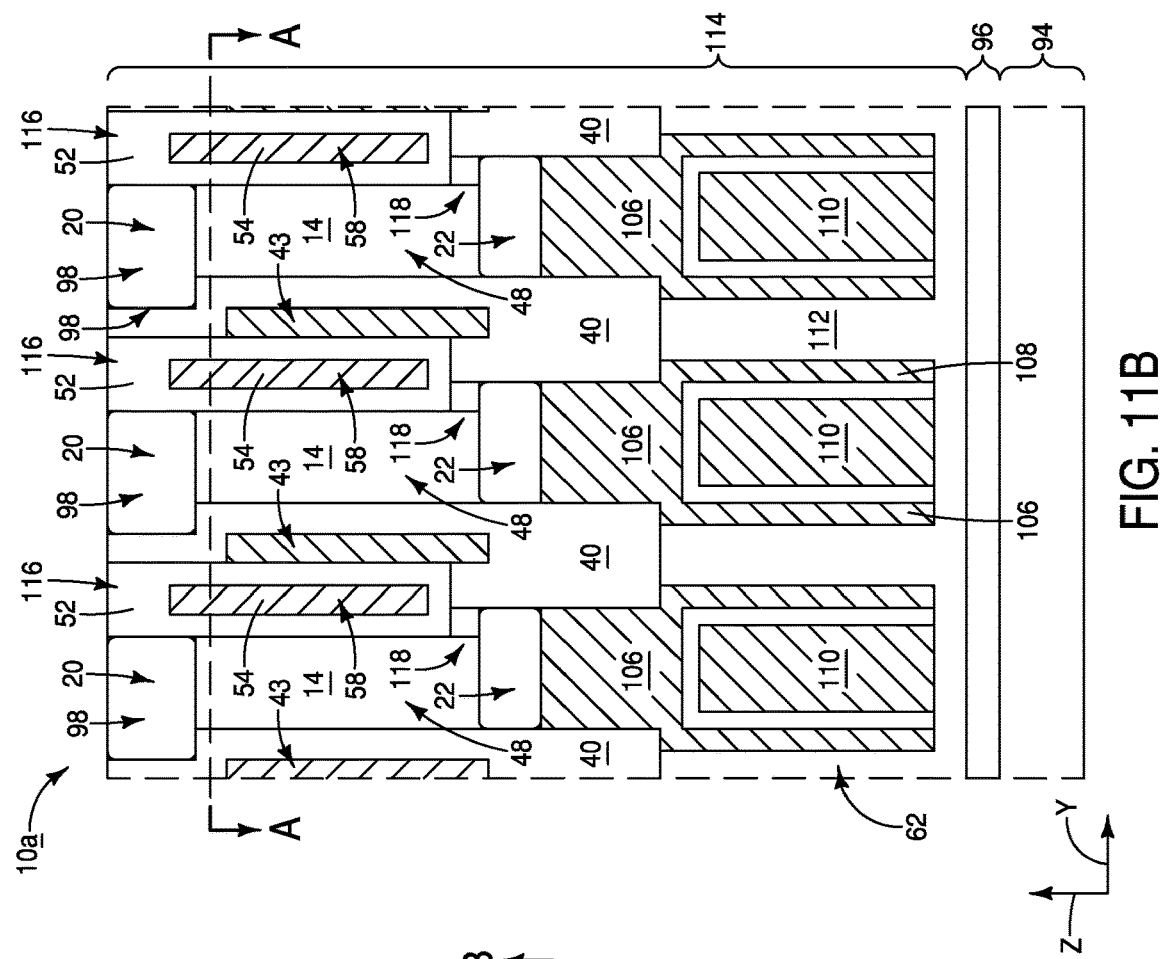
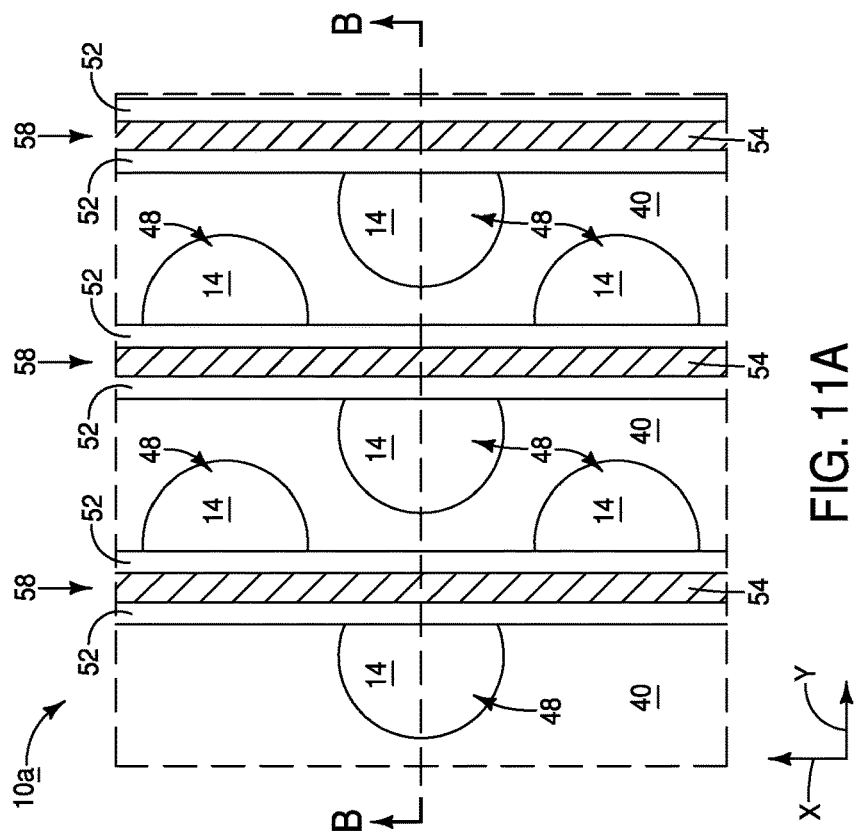
FIG. 11B
FIG. 11A

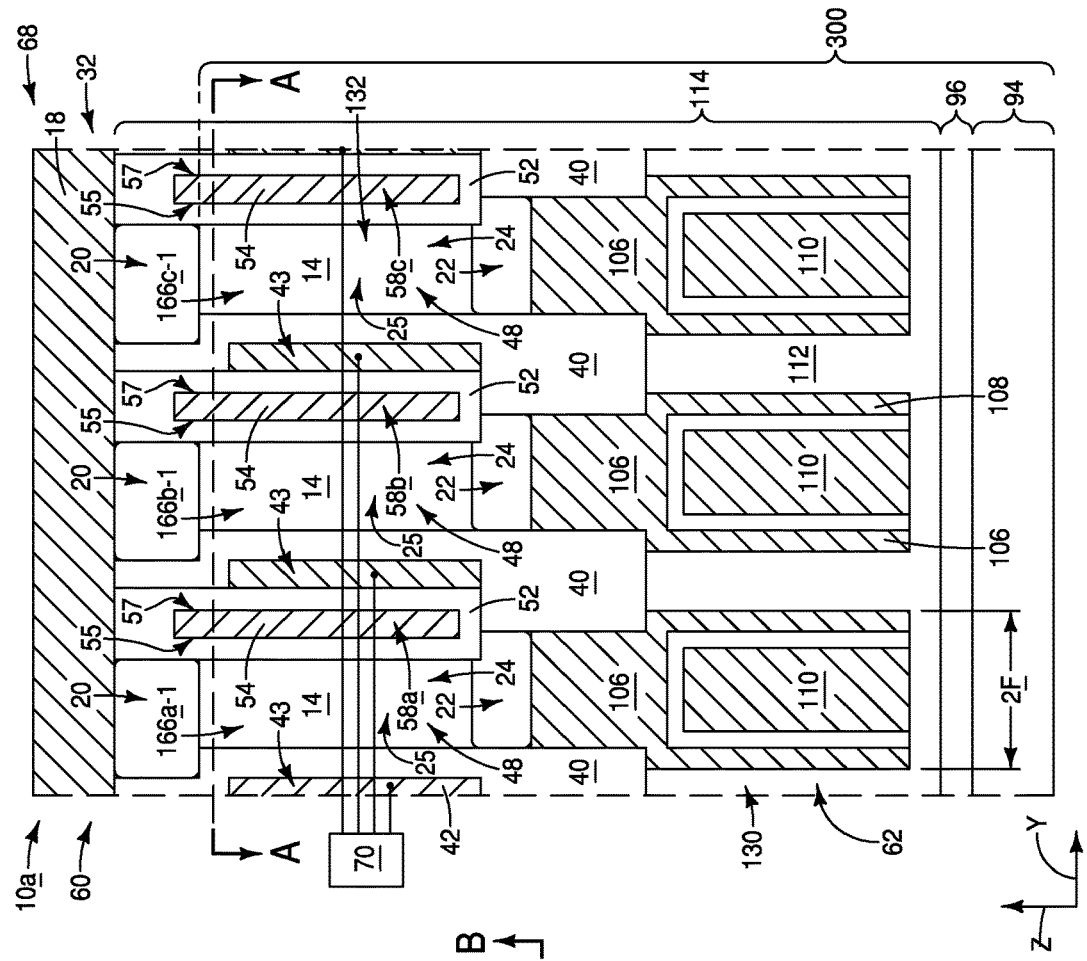
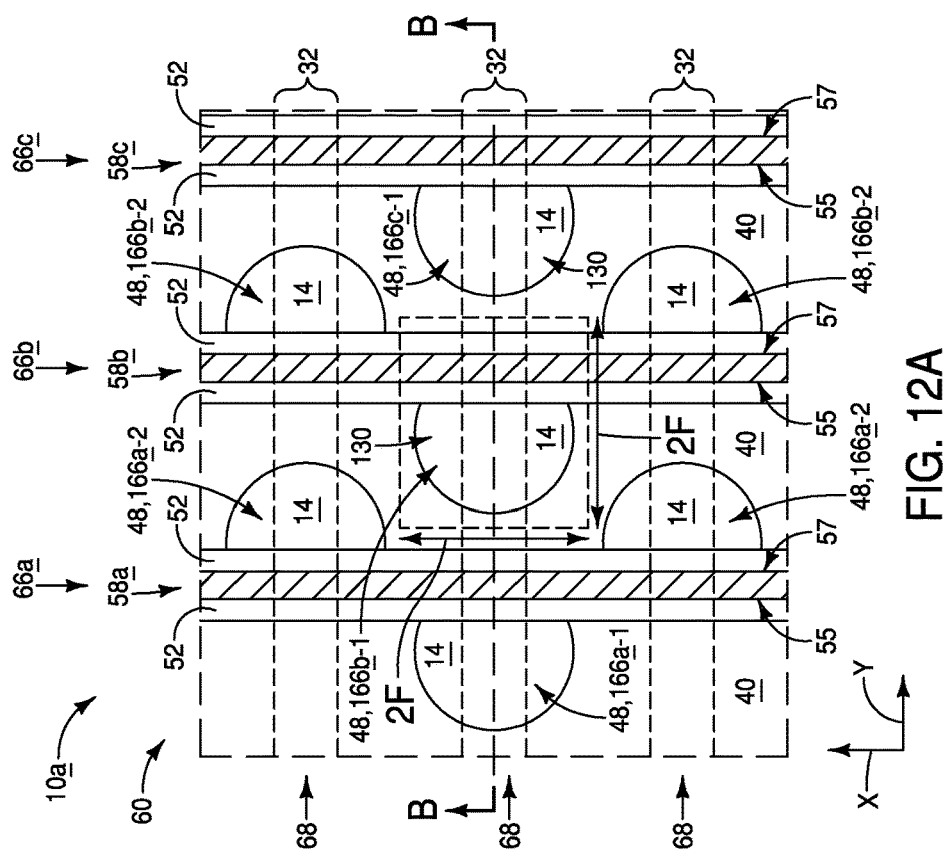
FIG. 12B
FIG. 12A

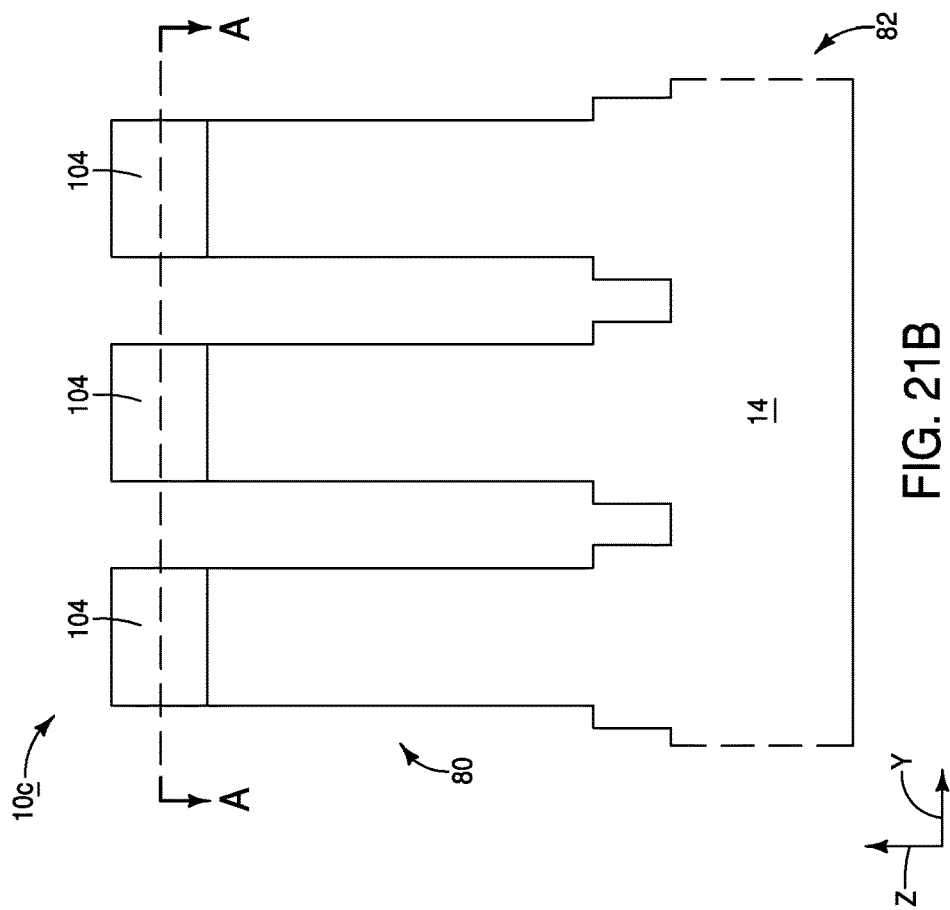
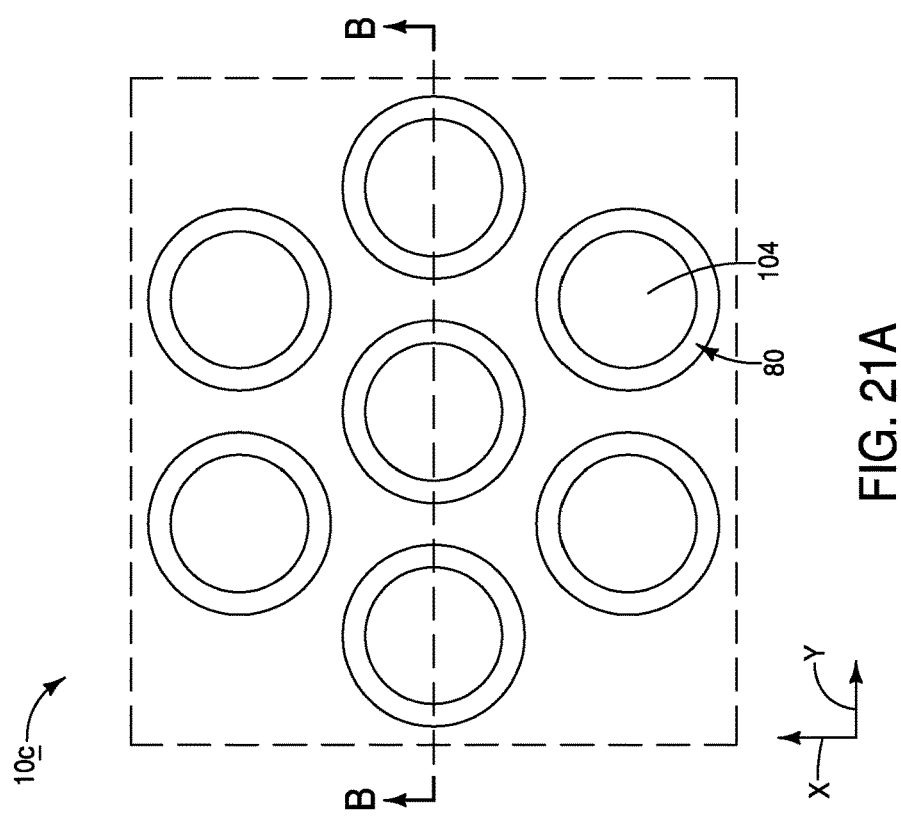
FIG. 21A
FIG. 21B

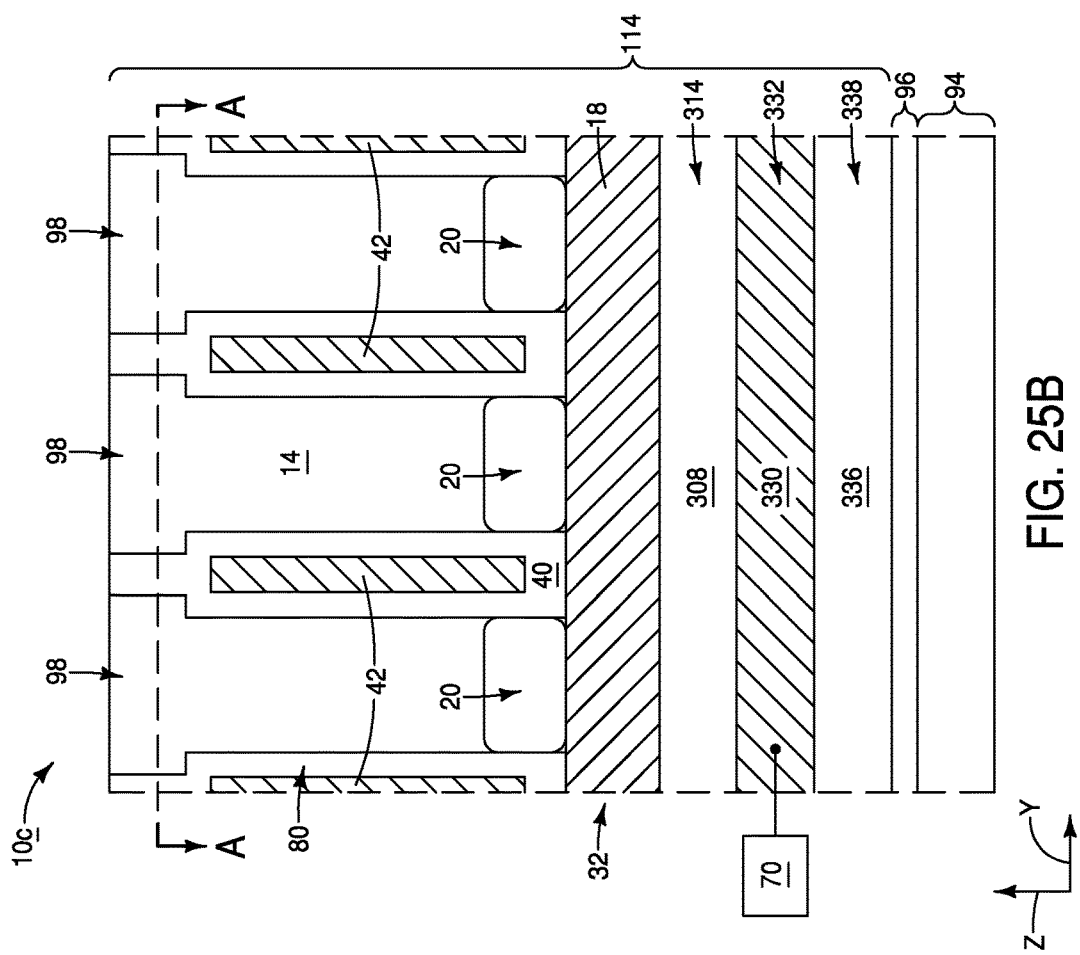
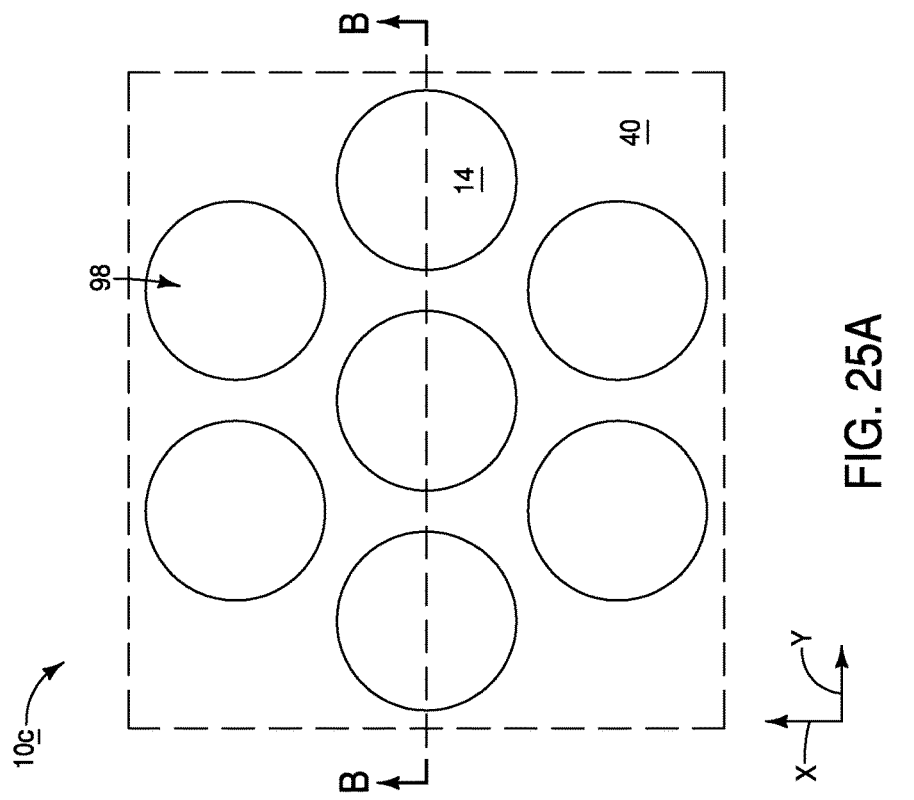

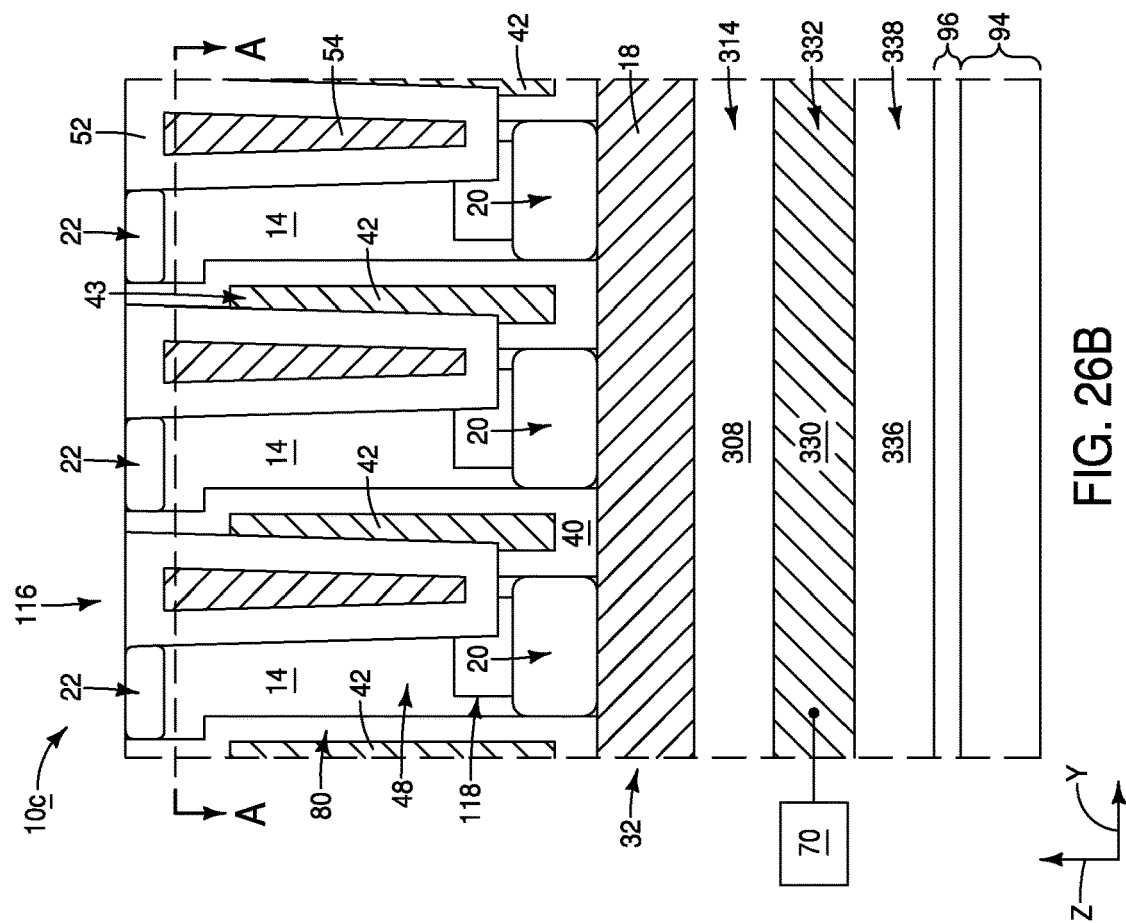
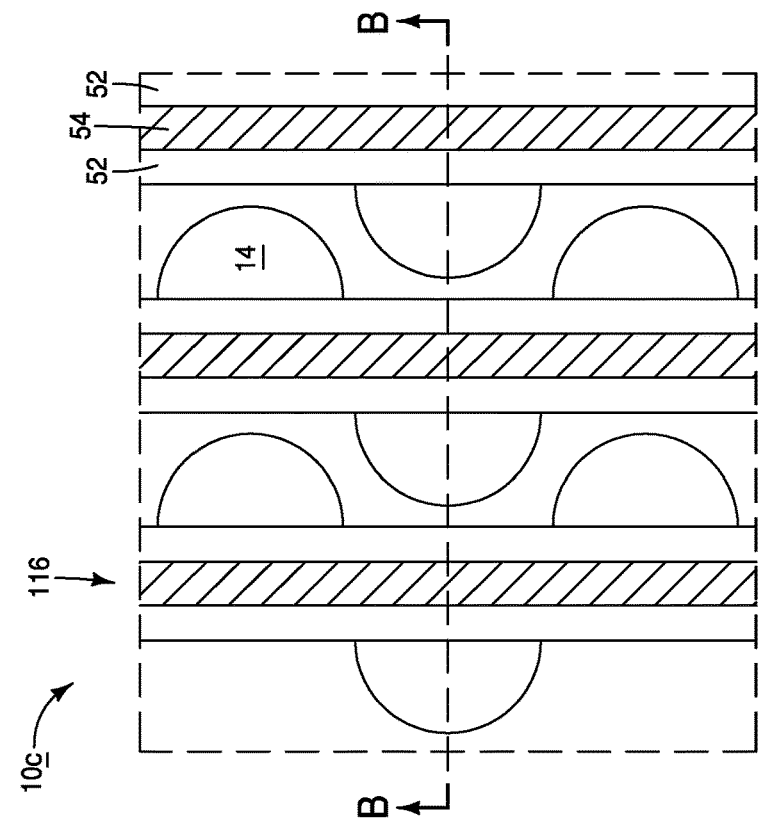
FIG. 26B
FIG. 26A

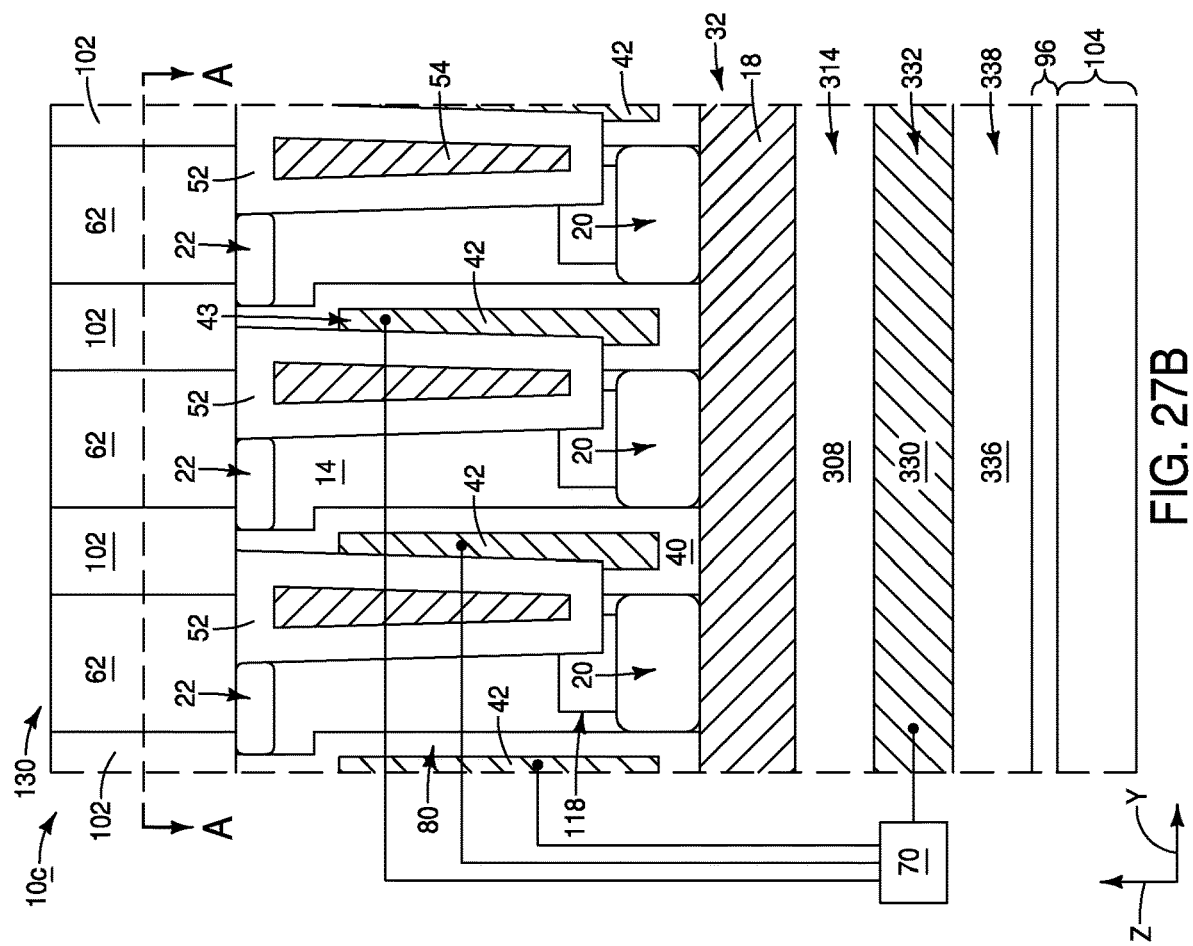
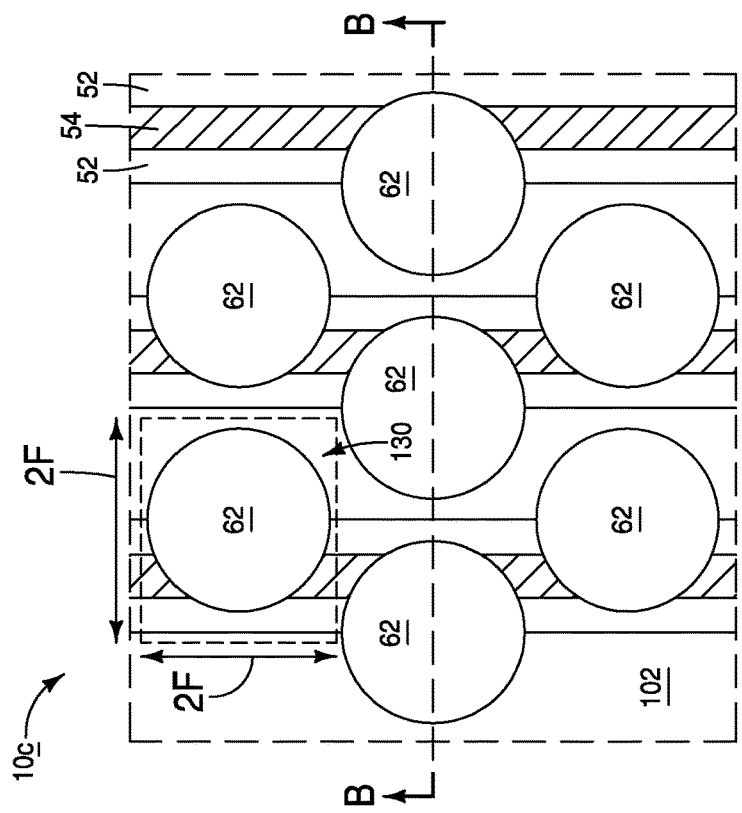
FIG. 27B
FIG. 27A

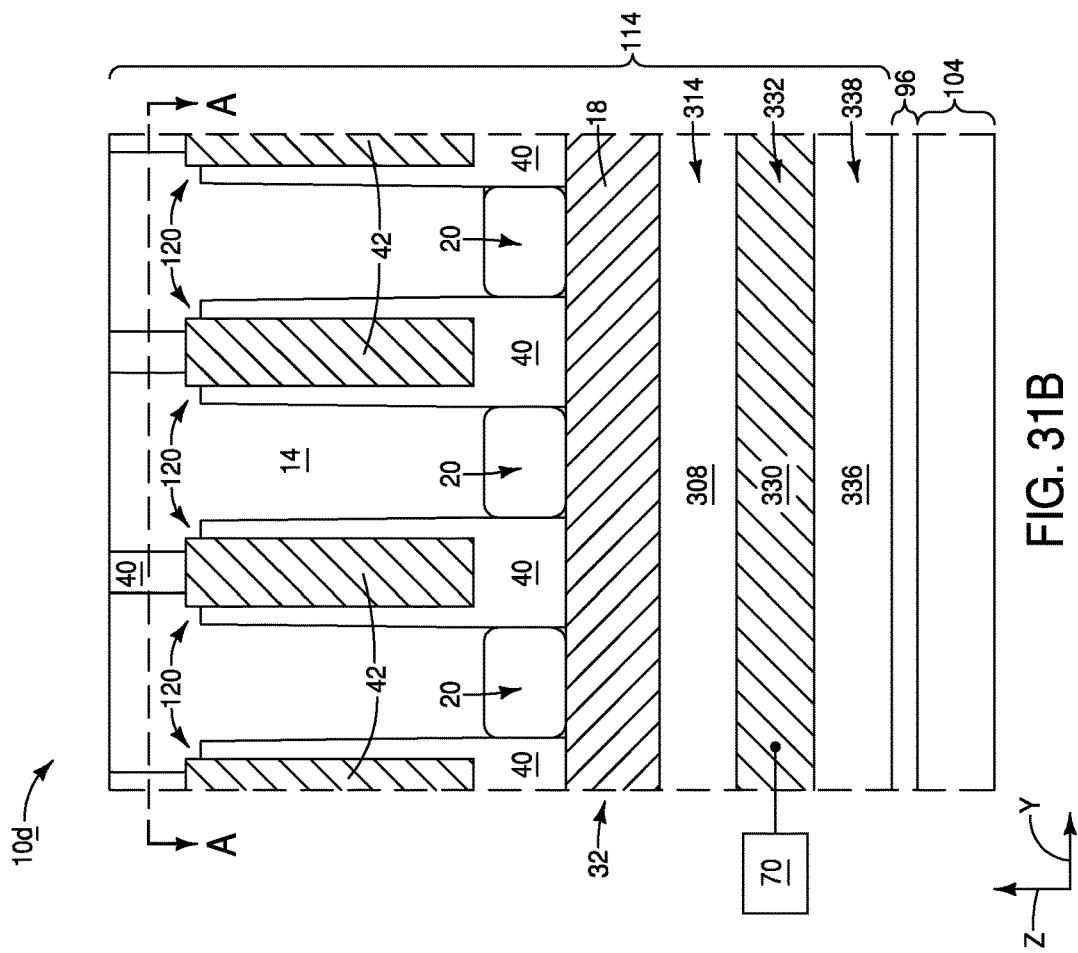
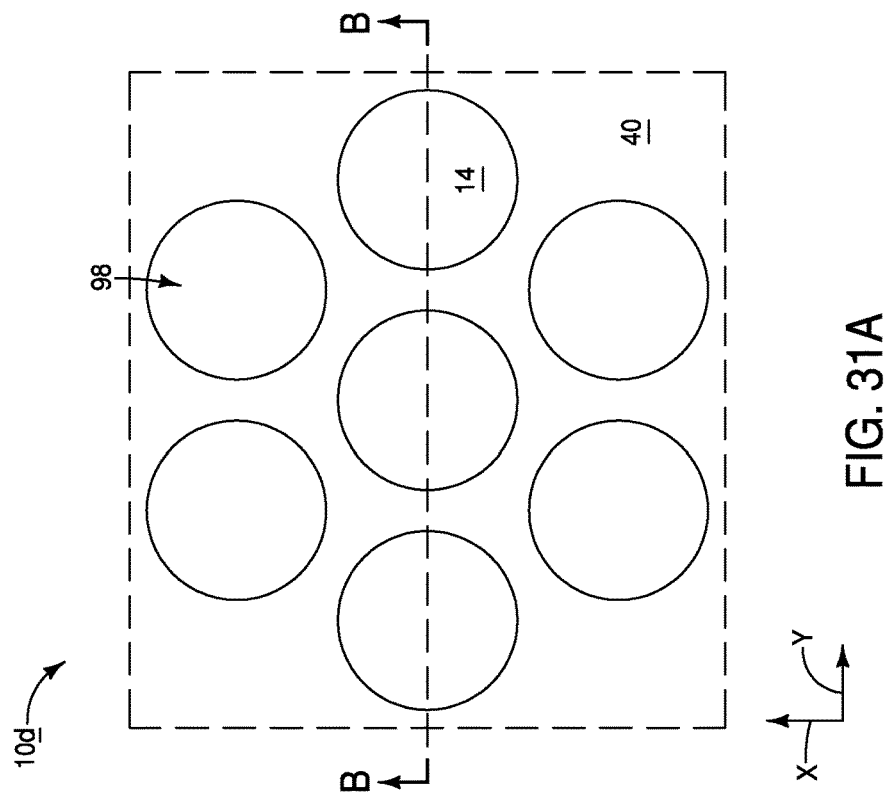
FIG. 31B
FIG. 31A

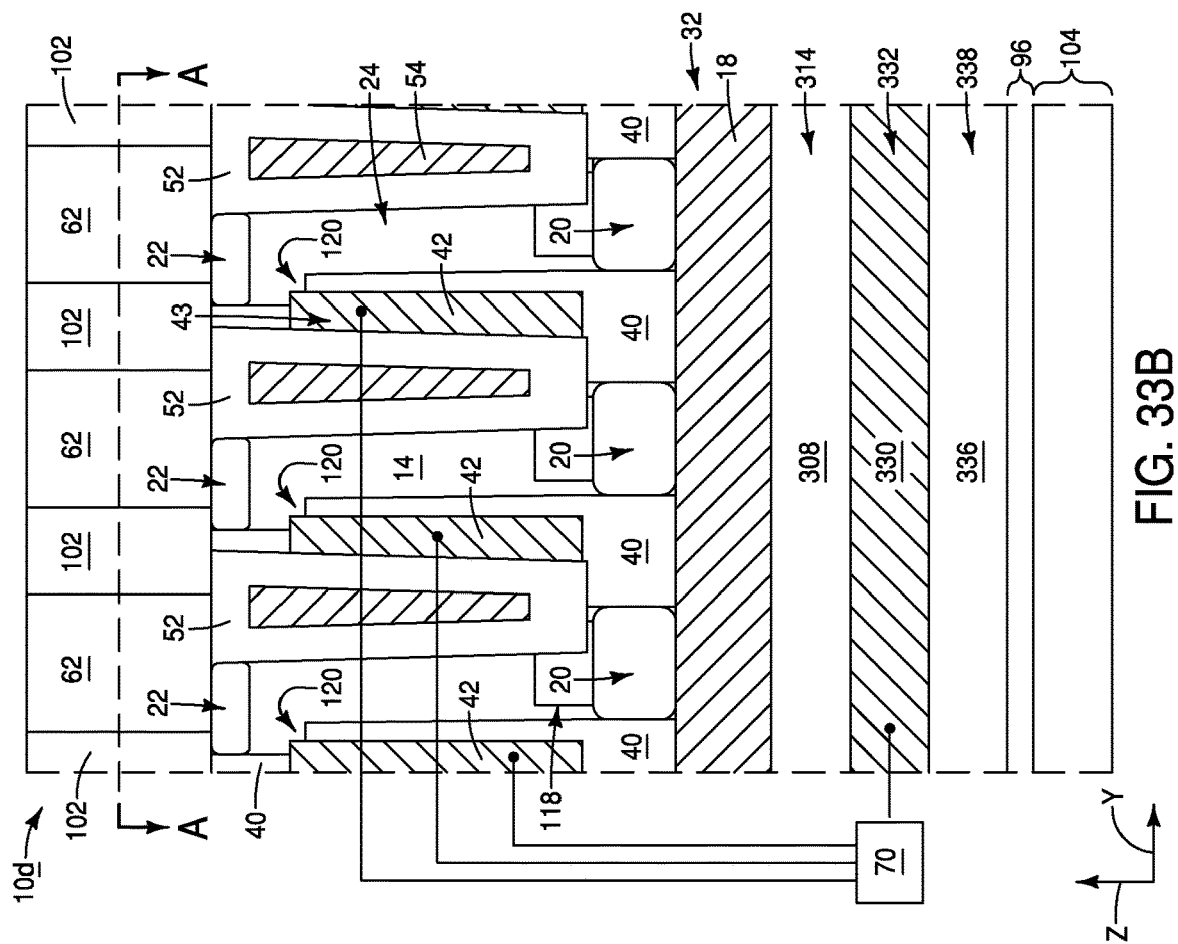
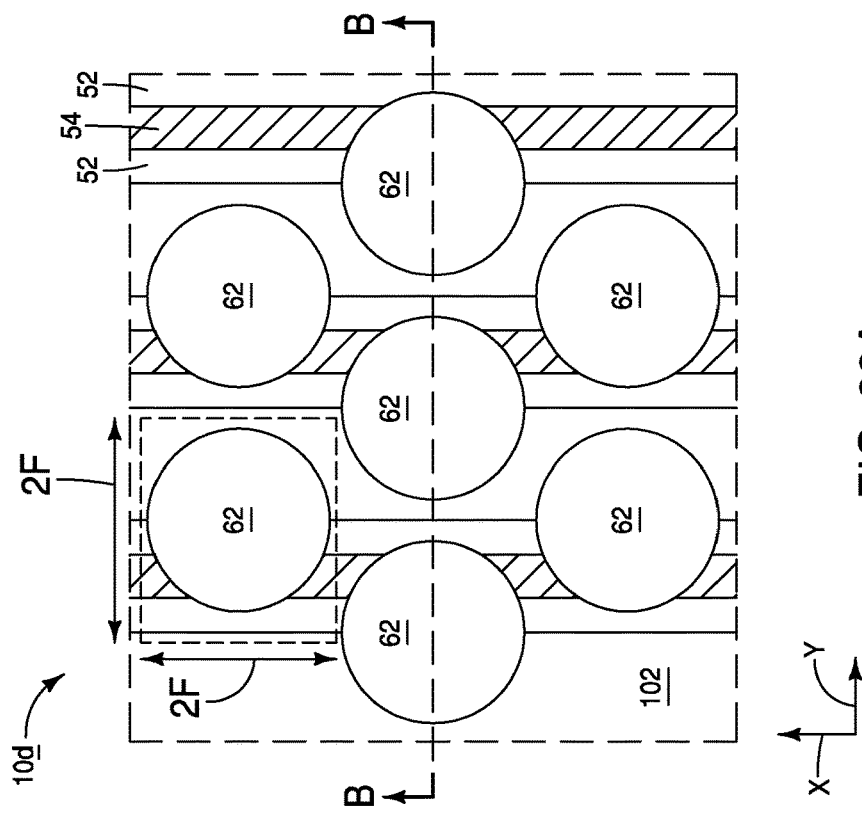
FIG. 33B
FIG. 33A

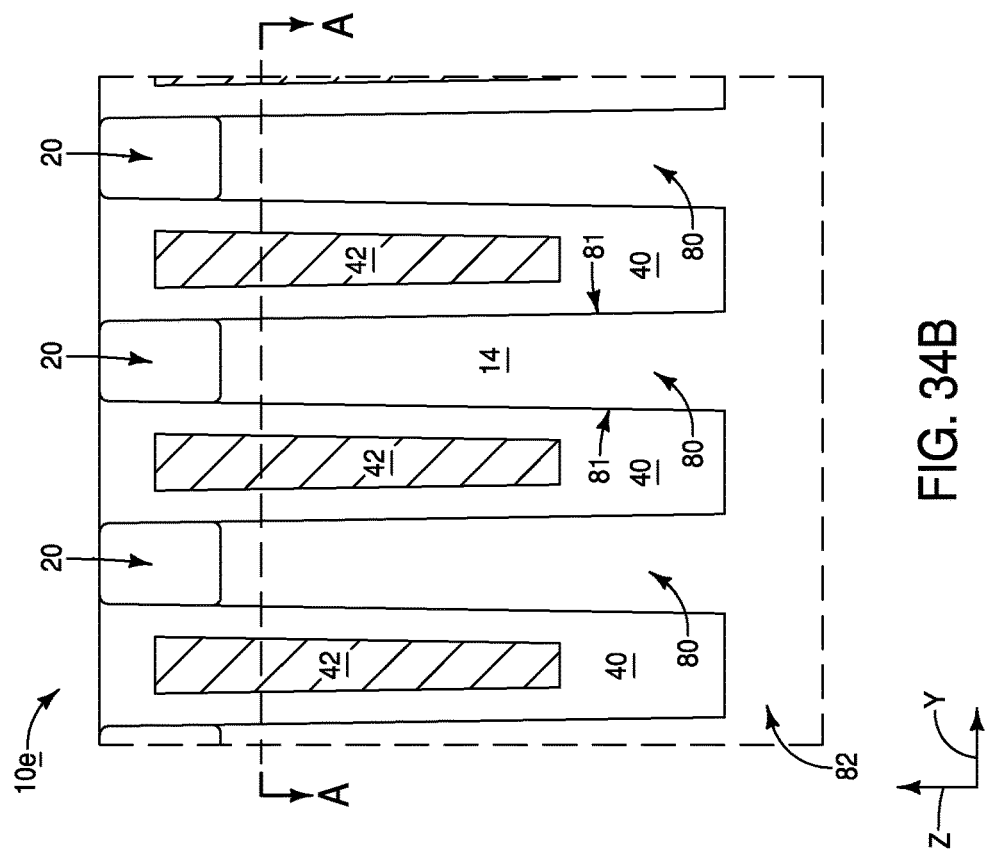
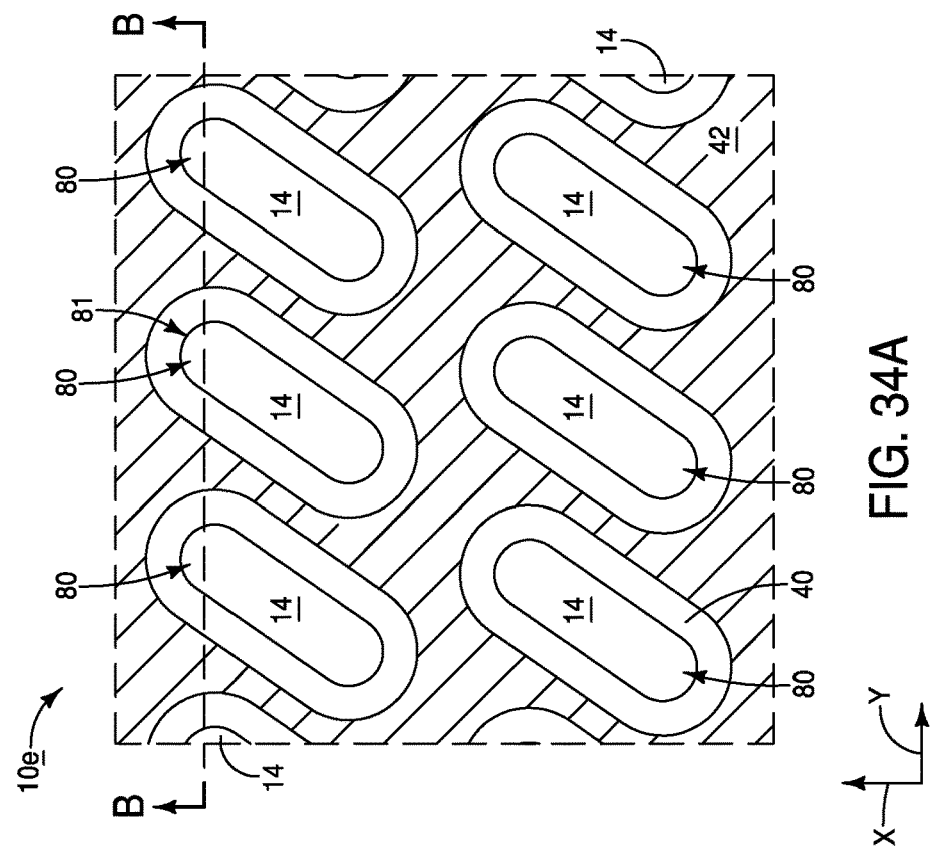

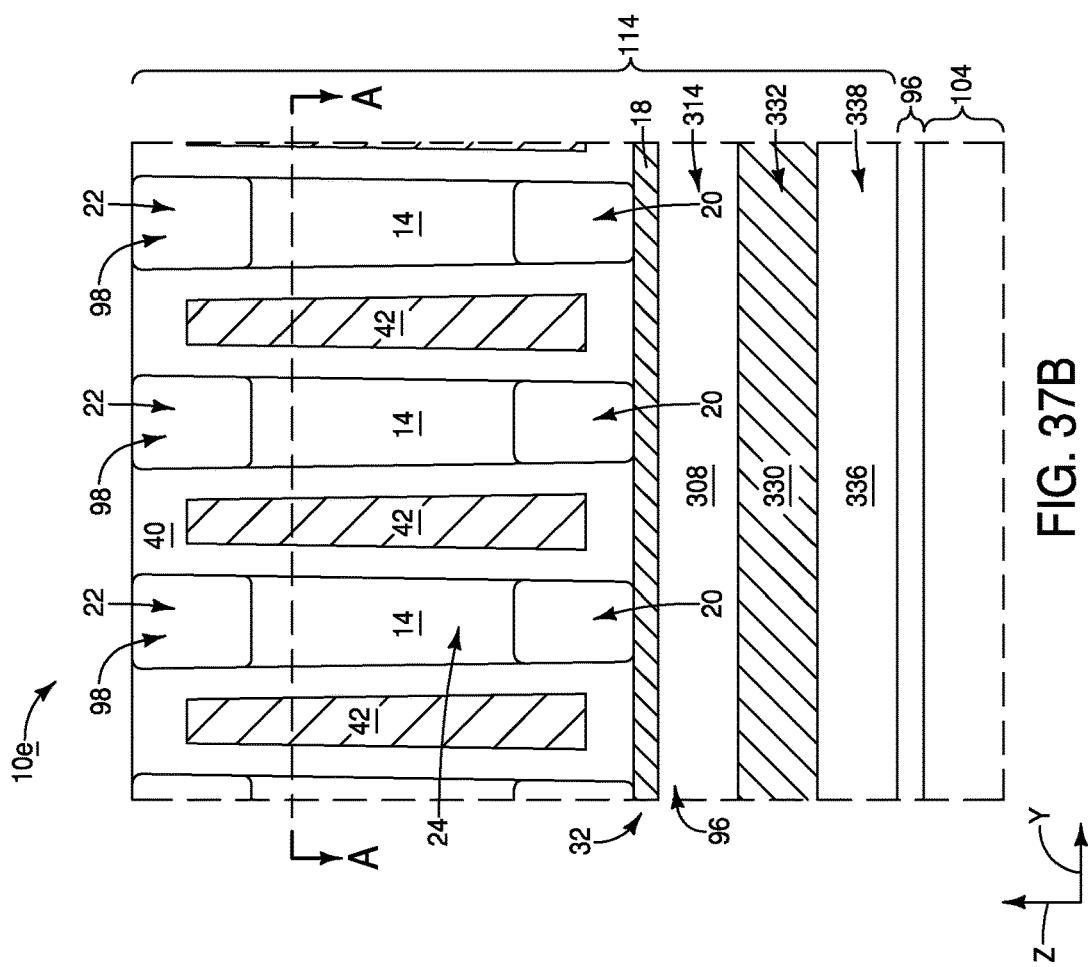
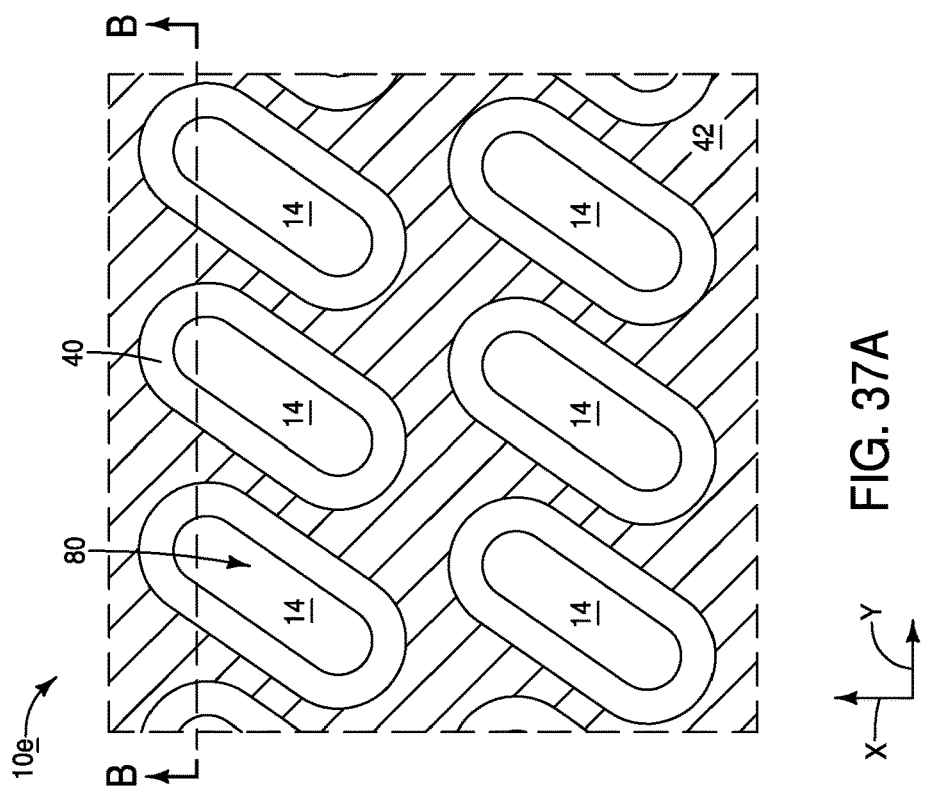
FIG. 37B
FIG. 37A

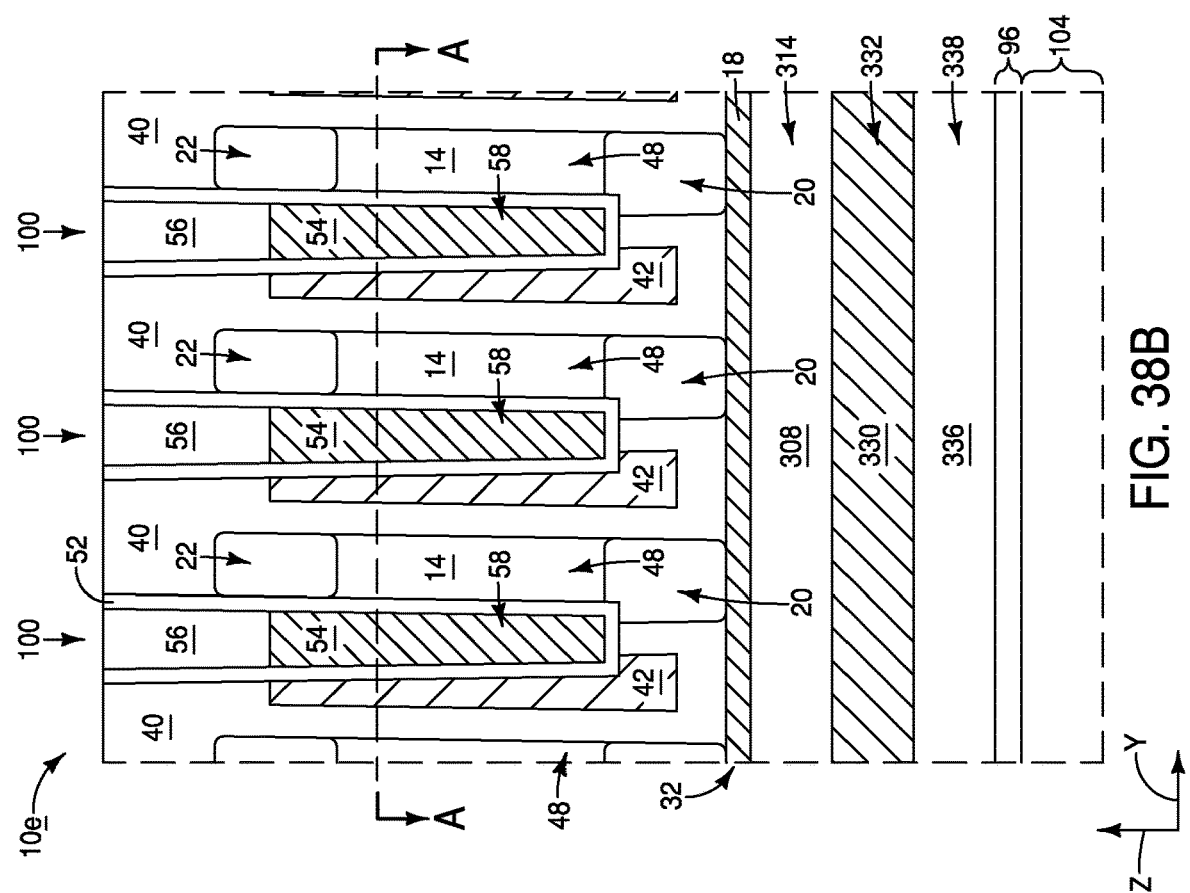
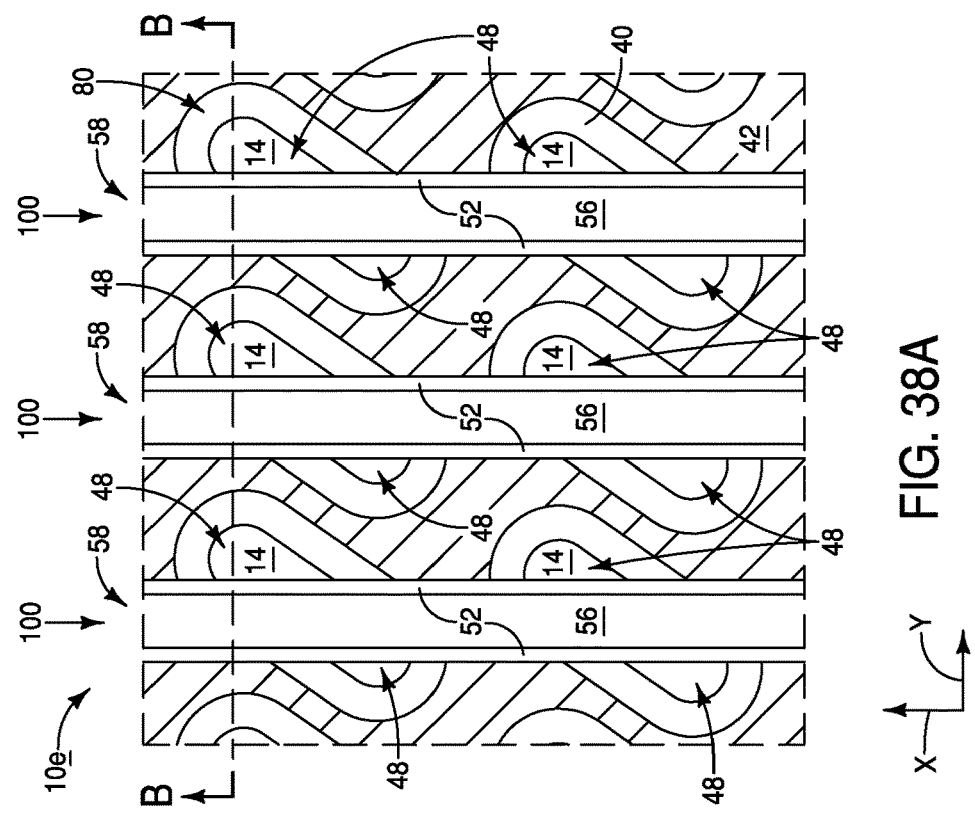
FIG. 38B
FIG. 38A

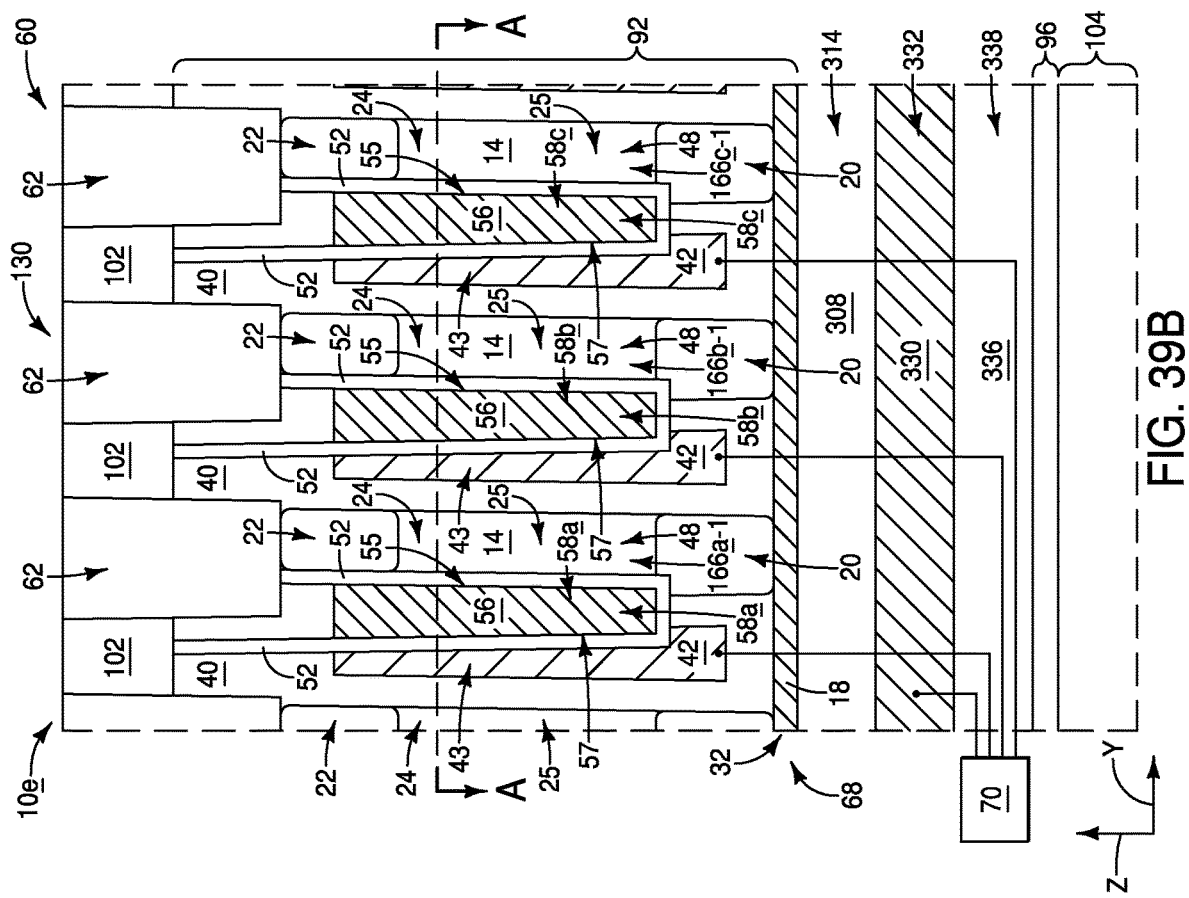
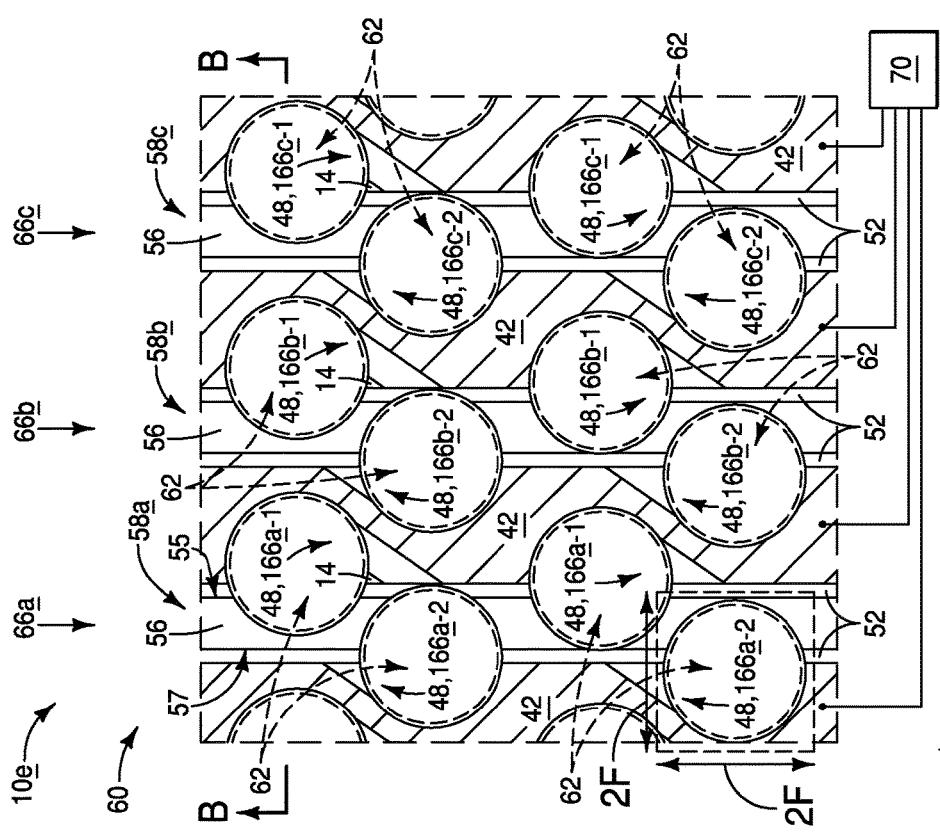
FIG. 39B
FIG. 39A

INTEGRATED ASSEMBLIES COMPRISING SPACES BETWEEN BITLINES AND COMPRISING CONDUCTIVE PLATES OPERATIONALLY PROXIMATE THE BITLINES, AND METHODS OF FORMING INTEGRATED ASSEMBLIES

TECHNICAL FIELD

Integrated assemblies comprising spaces between bitlines and comprising conductive plates operationally proximate the bitlines, and methods of forming integrated assemblies are provided.

BACKGROUND

Memory is utilized in modern computing architectures for storing data. One type of memory is Dynamic Random-Access Memory (DRAM). DRAM may provide advantages of structural simplicity, low cost and high speed in comparison to alternative types of memory.

DRAM may utilize memory cells which each have one capacitor in combination with one transistor (so-called 1T-1C memory cells), with the capacitor being coupled with a source/drain region of the transistor. The DRAM cells may be utilized in a DRAM array having hundreds, thousands, millions, etc., of memory cells. The transistors of the memory array have gates coupled with wordlines. The memory cells of the memory array are addressed utilizing bitlines (i.e., digit lines, sense lines) in combination with the wordlines.

A problem which may be encountered with a conventional DRAM array is parasitic capacitance between adjacent bitlines. The parasitic capacitance becomes increasingly problematic with the tighter packing of bitlines associated with increasing levels of integration. It would be desirable to develop arrangements which avoid the parasitic capacitance between adjacent bitlines, and to develop methods of fabricating such arrangements.

BRIEF DESCRIPTION OF THE DRAWINGS

FIGS. 8A and 8B are a diagrammatic cross-sectional top-down view and a diagrammatic cross-sectional side view, respectively, of the example assembly of FIGS. 7A and 7B at an example process stage following that of FIGS. 7A and 7B. The view of FIG. 8A is along the line A-A of FIG. 8B, and the view of FIG. 8B is along the line B-B of FIG. 8A.

FIGS. 9A and 9B are a diagrammatic cross-sectional top-down view and a diagrammatic cross-sectional side view, respectively, of the example assembly of FIGS. 7A and 7B at an example process stage following that of FIGS. 8A and 8B. The view of FIG. 9A is along the line A-A of FIG. 9B, and the view of FIG. 9B is along the line B-B of FIG. 9A.

FIGS. 11A and 11B are a diagrammatic cross-sectional top-down view and a diagrammatic cross-sectional side view, respectively, of the example assembly of FIGS. 7A and 7B at an example process stage following that of FIGS. 9A and 9B, and alternative to that of FIGS. 10A and 10B. The view of FIG. 11A is along the line A-A of FIG. 11B, and the view of FIG. 11B is along the line B-B of FIG. 11A.

FIGS. 12A and 12B are a diagrammatic cross-sectional top-down view and a diagrammatic cross-sectional side view, respectively, of the example assembly of FIGS. 7A and 7B at an example process stage following that of FIGS. 10A and 10B. The view of FIG. 12A is along the line A-A of FIG. 12B, and the view of FIG. 12B is along the line B-B of FIG. 12A.

FIGS. 21A and 21B are a diagrammatic cross-sectional top-down view and a diagrammatic cross-sectional side view, respectively, of an example assembly at an example process stage of an example method for fabricating an example array of memory cells. The view of FIG. 21A is along the line A-A of FIG. 21B, and the view of FIG. 21B is along the line B-B of FIG. 21A.

FIGS. 25A and 25B are a diagrammatic cross-sectional top-down view and a diagrammatic cross-sectional side view, respectively, of the example assembly of FIGS. 21A and 21B at an example process stage following that of FIGS. 24A and 24C. The view of FIG. 25A is along the line A-A of FIG. 25B, and the view of FIG. 25B is along the line B-B of FIG. 25A.

FIGS. 26A and 26B are a diagrammatic cross-sectional top-down view and a diagrammatic cross-sectional side view, respectively, of the example assembly of FIGS. 21A and 21B at an example process stage following that of FIGS. 25A and 25B. The view of FIG. 26A is along the line A-A of FIG. 26B, and the view of FIG. 26B is along the line B-B of FIG. 26A.

FIGS. 27A and 27B are a diagrammatic cross-sectional top-down view and a diagrammatic cross-sectional side view, respectively, of the example assembly of FIGS. 21A and 21B at an example process stage following that of FIGS. 26A and 26B. The view of FIG. 27A is along the line A-A of FIG. 27B, and the view of FIG. 27B is along the line B-B of FIG. 27A.

FIGS. 31A and 31B are a diagrammatic cross-sectional top-down view and a diagrammatic cross-sectional side view, respectively, of the example assembly of FIGS. 28A and 28B at an example process stage following that of FIGS. 30A and 30C. The view of FIG. 31A is along the line A-A of FIG. 31B, and the view of FIG. 31B is along the line B-B of FIG. 31A.

FIGS. 33A and 33B are a diagrammatic cross-sectional top-down view and a diagrammatic cross-sectional side view, respectively, of the example assembly of FIGS. 28A and 28B at an example process stage following that of FIGS. 32A and 32B. The view of FIG. 33A is along the line A-A of FIG. 33B, and the view of FIG. 33B is along the line B-B of FIG. 33A.

FIGS. 34A and 34B are a diagrammatic cross-sectional top-down view and a diagrammatic cross-sectional side view, respectively, of an example assembly at an example process stage of an example method for fabricating an example array of memory cells. The view of FIG. 34A is along the line A-A of FIG. 34B, and the view of FIG. 34B is along the line B-B of FIG. 34A.

34A and 34B. The view of FIG. 35A is along the line A-A of FIG. 35B, and the view of FIG. 35B is along the line B-B of FIG. 35A.

Figures 35A, 35B:
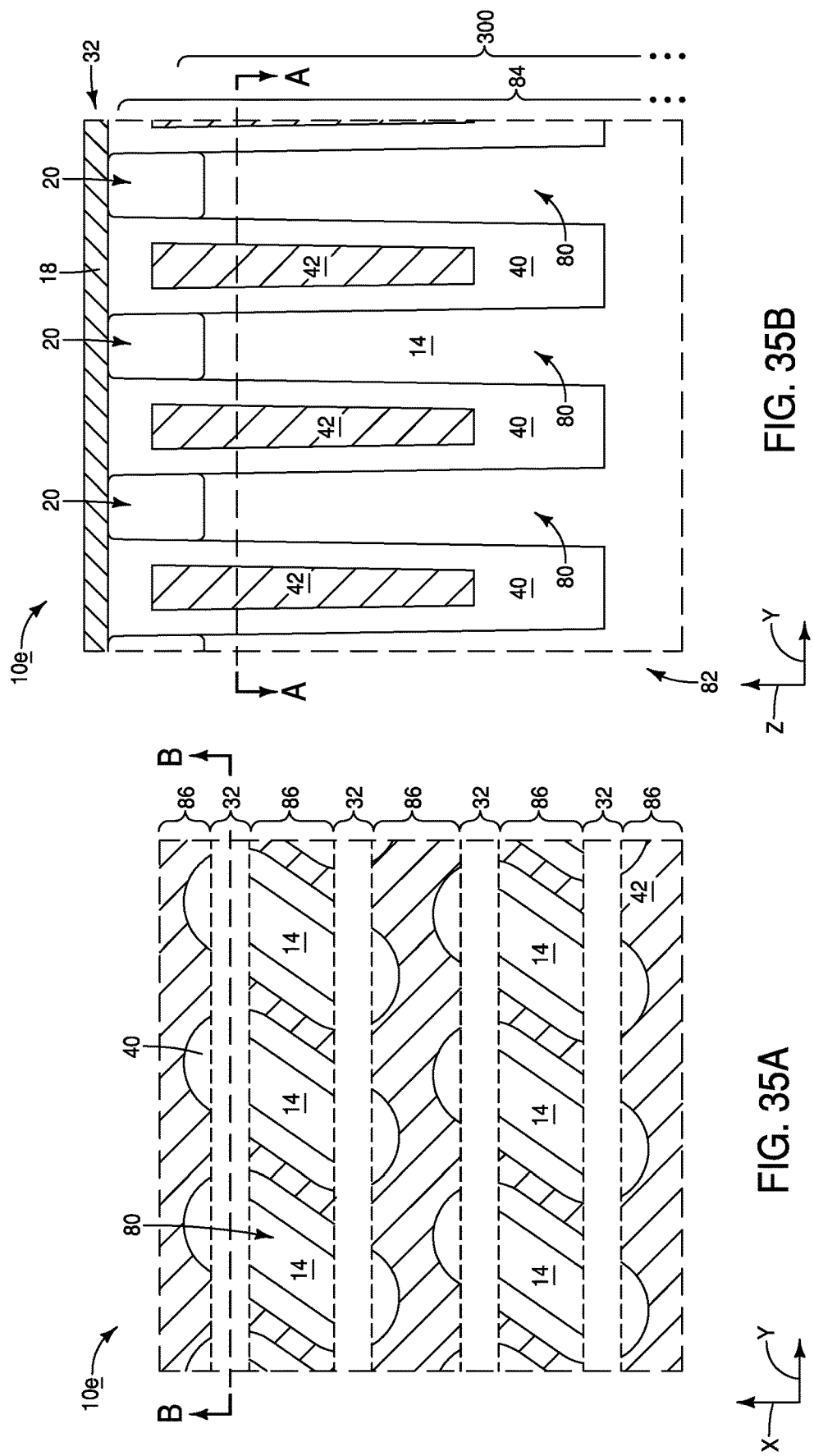
FIGS. 35A and 35B are a diagrammatic cross-sectional top-down view and a diagrammatic cross-sectional side view, respectively, of the example assembly of FIGS. 34A and 34B at an example process stage following that of FIGS.
Figure 36A:
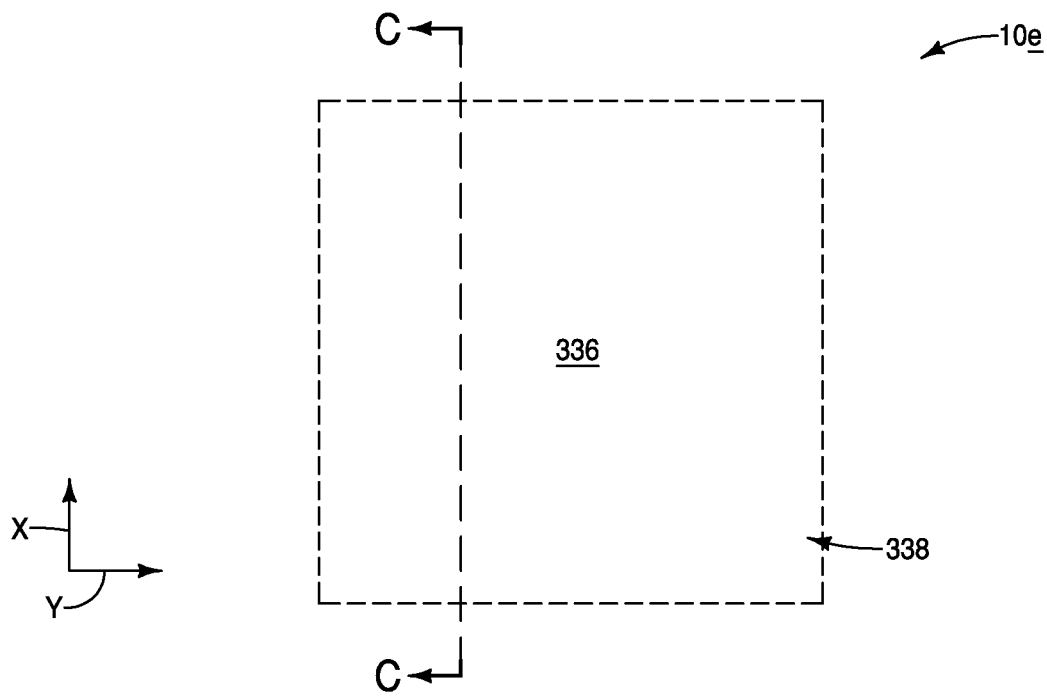
Figure 36C:
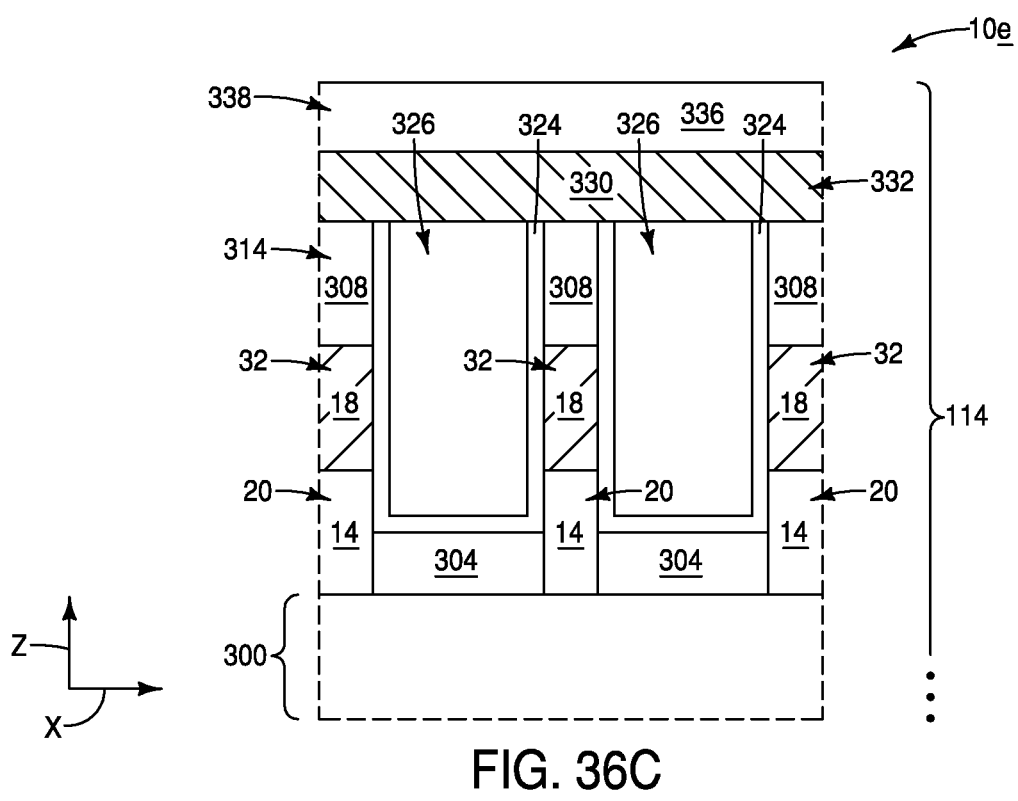

FIGS. 36A and 36C are a diagrammatic top view and a diagrammatic cross-sectional side view, respectively, of a region of the example assembly of FIGS. 34A and 34B at an example process stage following that of FIGS. 35A and 35B. The view of FIG. 36C is along the line C-C of FIG. 36A.

FIGS. 37A and 37B are a diagrammatic cross-sectional top-down view and a diagrammatic cross-sectional side view, respectively, of the example assembly of FIGS. 34A and 34B at an example process stage following that of FIGS. 36A and 36C. The view of FIG. 37A is along the line A-A of FIG. 37B, and the view of FIG. 37B is along the line B-B of FIG. 37A.

FIGS. 38A and 38B are a diagrammatic cross-sectional top-down view and a diagrammatic cross-sectional side view, respectively, of the example assembly of FIGS. 34A and 34B at an example process stage following that of FIGS. 37A and 37B. The view of FIG. 38A is along the line A-A of FIG. 38B, and the view of FIG. 38B is along the line B-B of FIG. 38A.

FIGS. 39A and 39B are a diagrammatic cross-sectional top-down view and a diagrammatic cross-sectional side view, respectively, of the example assembly of FIGS. 34A and 34B at an example process stage following that of FIGS. 38A and 38B. The view of FIG. 39A is along the line A-A of FIG. 39B, and the view of FIG. 39B is along the line B-B of FIG. 39A.

Figure 40:
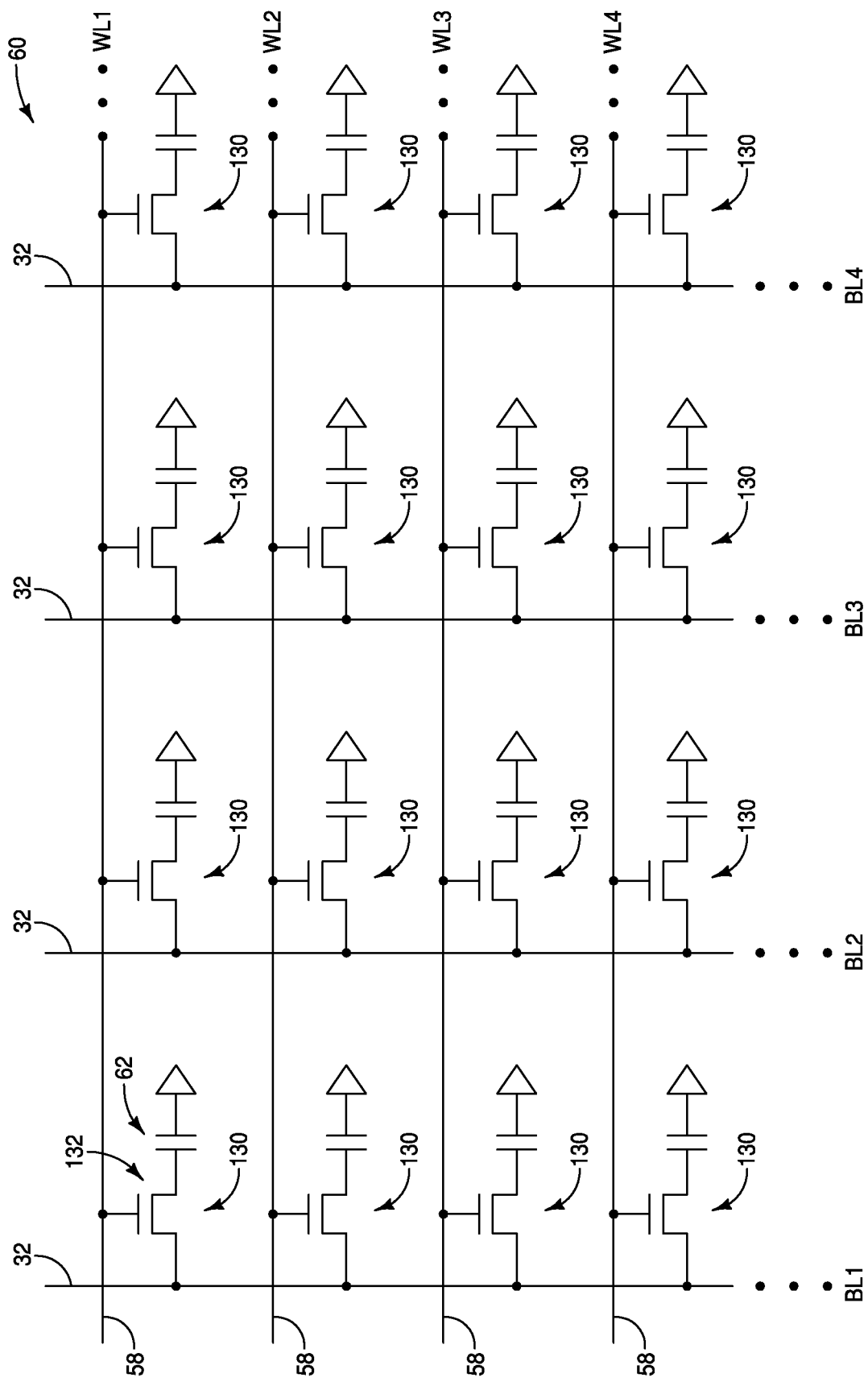

FIG. 40 is a diagrammatic schematic illustration of a region of an example memory array.

Figure 41:
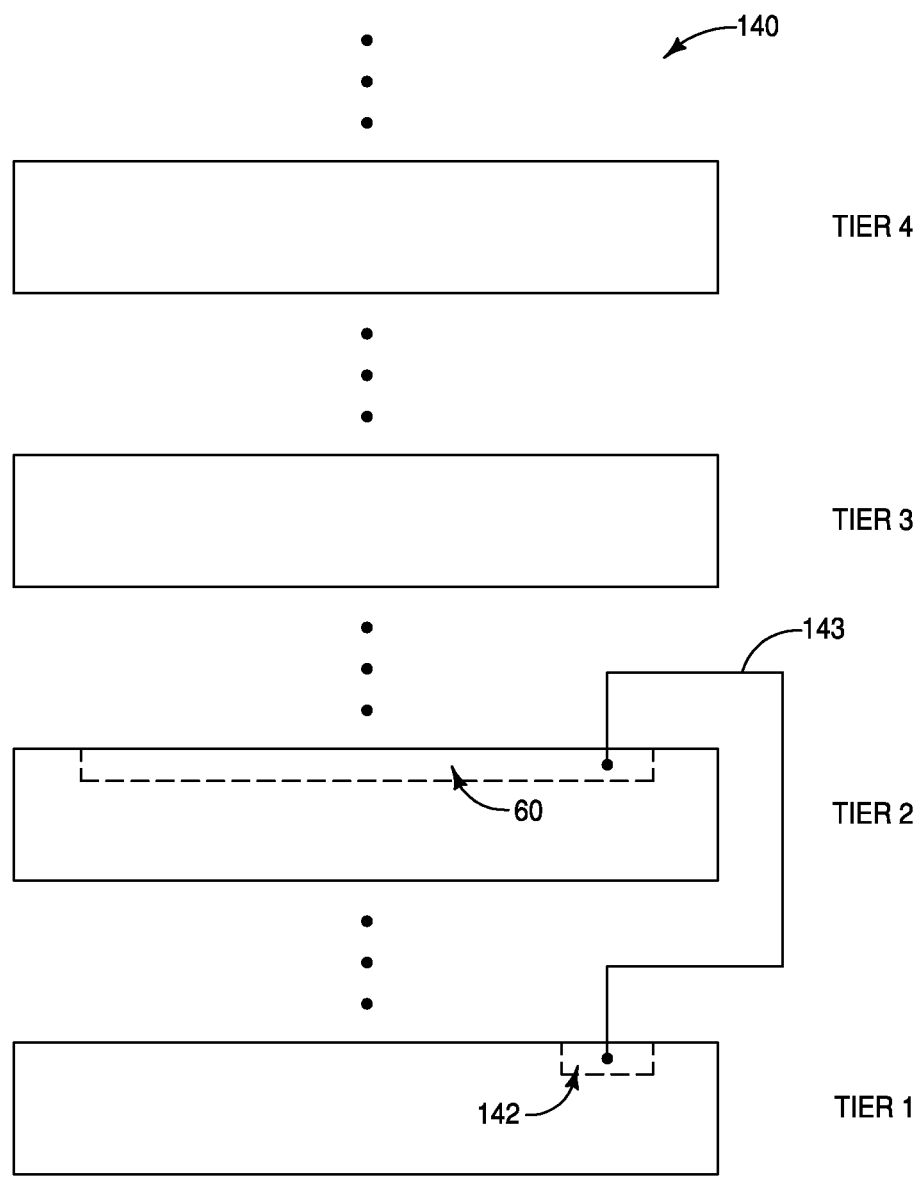

FIG. 41 is a diagrammatic cross-sectional side view of a region of an example assembly comprising stacked tiers.

DETAILED DESCRIPTION OF THE ILLUSTRATED EMBODIMENTS

Some embodiments include memory structures having voids between adjacent bitlines. In some embodiments, a conductive plate may be over the bitlines. The conductive plate may be operatively proximate the bitlines so that excess charge on the bitlines can drain to the plate rather than leading to problematic parasitic capacitance. Some embodiments include methods of forming integrated assemblies. Example embodiments are described with reference to FIGS. 1-41.

Figure 1A:
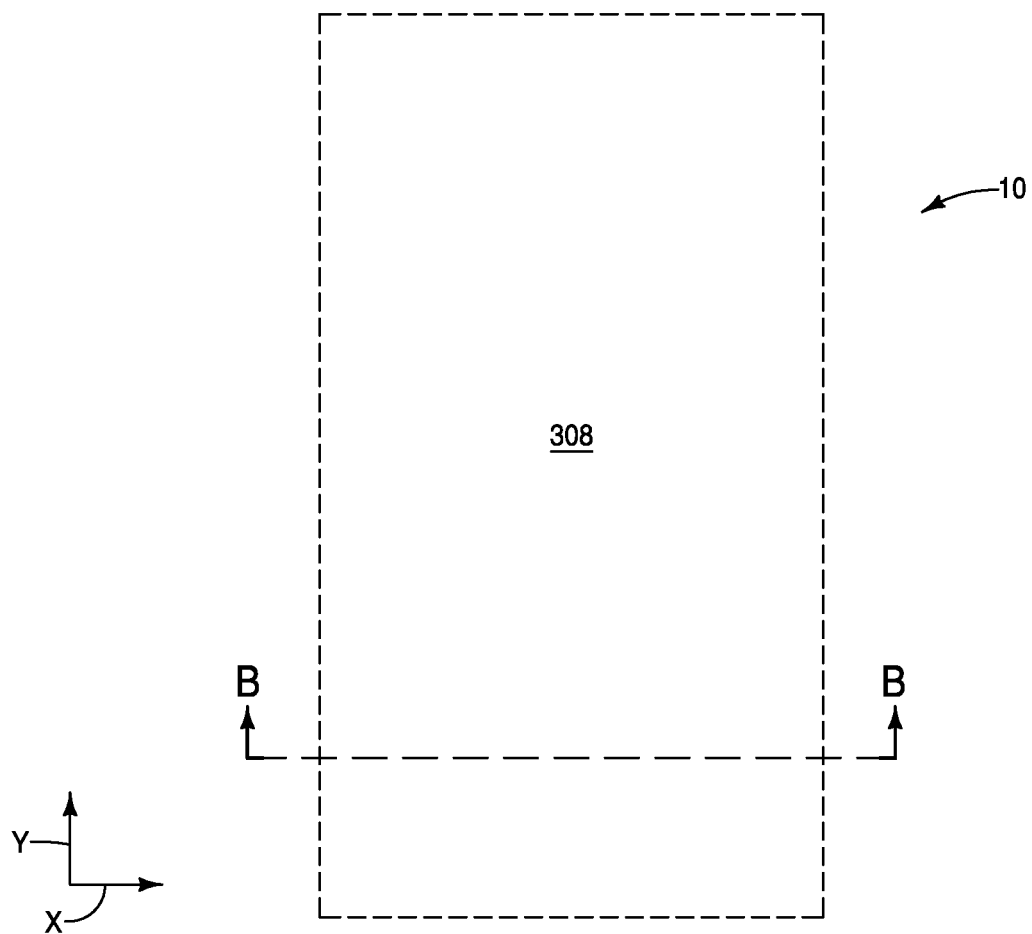
FIGS. 1A and 1B are a diagrammatic top view and a diagrammatic cross-sectional side view, respectively, of an example assembly at an example process stage of an example method for fabricating bitlines. The view of FIG. 1B is along the line B-B of FIG. 1A.
Figure 1B:
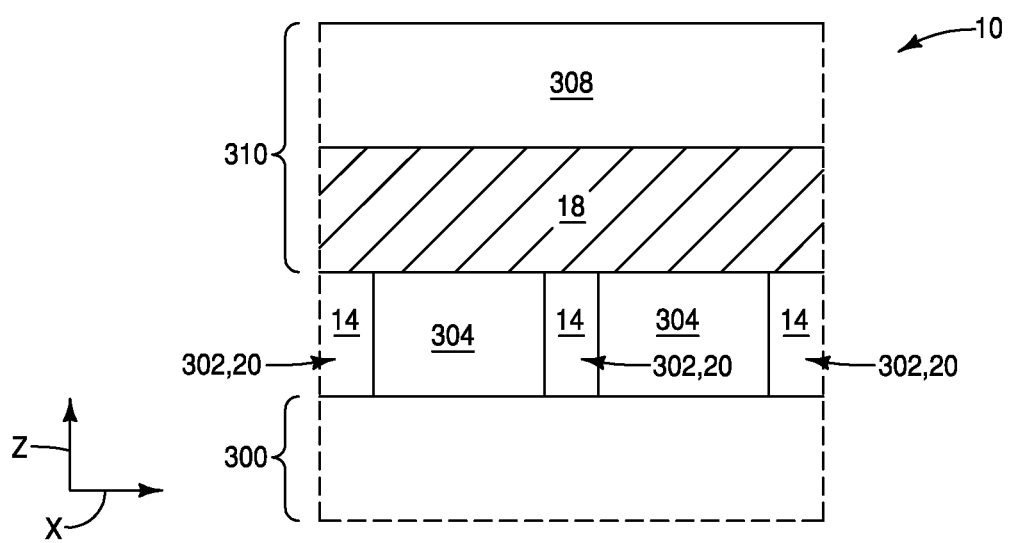

Referring to FIGS. 1A and 1B, a construction 10 includes a supporting structure 300, and a series of conductive interconnects 302 extending upwardly from the supporting structure. The conductive interconnects may comprise semiconductor material 14, and may correspond to source/drain regions 20.

The semiconductor material 14 may comprise any suitable composition(s); and in some embodiments may comprise, consist essentially of, or consist of one or more of silicon, germanium, III/V semiconductor material (e.g., gallium phosphide), semiconductor oxide, etc.; with the term III/V semiconductor material referring to semiconductor materials comprising elements selected from groups III and V of the periodic table (with groups III and V being old nomenclature, and now being referred to as groups 13 and 15). In some embodiments, the semiconductor material 14 may comprise, consist essentially of, or consist of monocrystalline silicon.

The source/drain regions 20 may correspond to doped regions of the semiconductor material 14. Such doped regions may comprise any suitable dopant to any suitable concentration. In some embodiments the doped regions may comprise n-type dopant provided to a concentration of at least about $1 \times 10^{20}$ atoms/cm$^3$, and in other embodiments may comprise p-type dopant provided to the concentration of at least about $1 \times 10^{20}$ atoms/cm$^3$.

The regions 302 are spaced from one another by insulative material 304. The insulative material 304 may comprise any suitable composition(s); and in some embodiments may comprise, consist essentially of, or consist of silicon dioxide.

A bitline material 18 is over the semiconductor material 14 and the insulative material 304. The bitline material 18 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). In some example embodiments the bitline material 18 may comprise one or more of tungsten, titanium, tantalum, tungsten nitride, titanium nitride, tantalum nitride, etc.

An insulative material 308 is over the bitline material 18. The insulative material 308 may comprise any suitable composition(s); and in some embodiments may comprise, consist essentially of, or consist of silicon nitride.

The materials 18 and 308 may be considered to comprise a stack 310.

An x, y, z axis system is provided relative to FIGS. 1A and 1B to assist the reader in understanding the relationships of the structures shown in the figures.

Figure 2A:
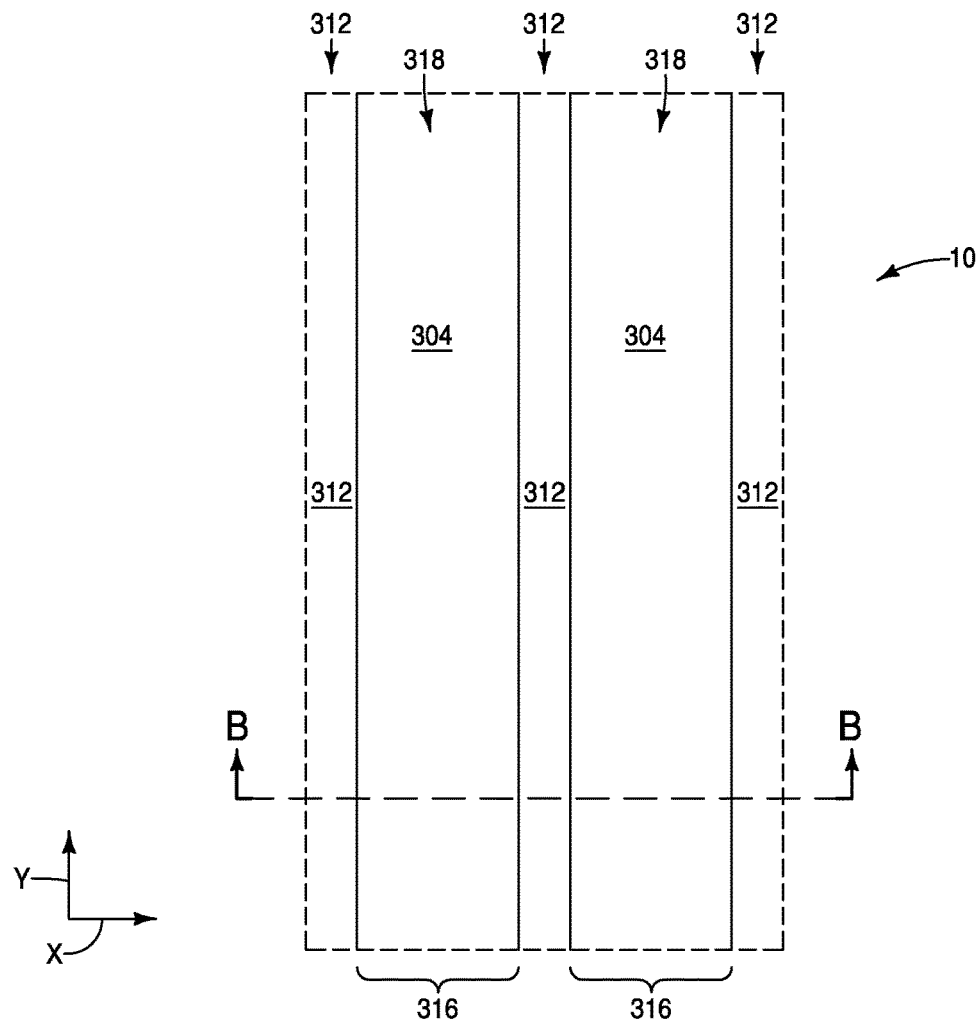
FIGS. 2A and 2B are a diagrammatic top view and a diagrammatic cross-sectional side view, respectively, of the example assembly of FIGS. 1A and 1B at an example process stage following that of FIGS. 1A and 1B. The view of FIG. 2B is along the line B-B of FIG. 2A.
Figure 2B:
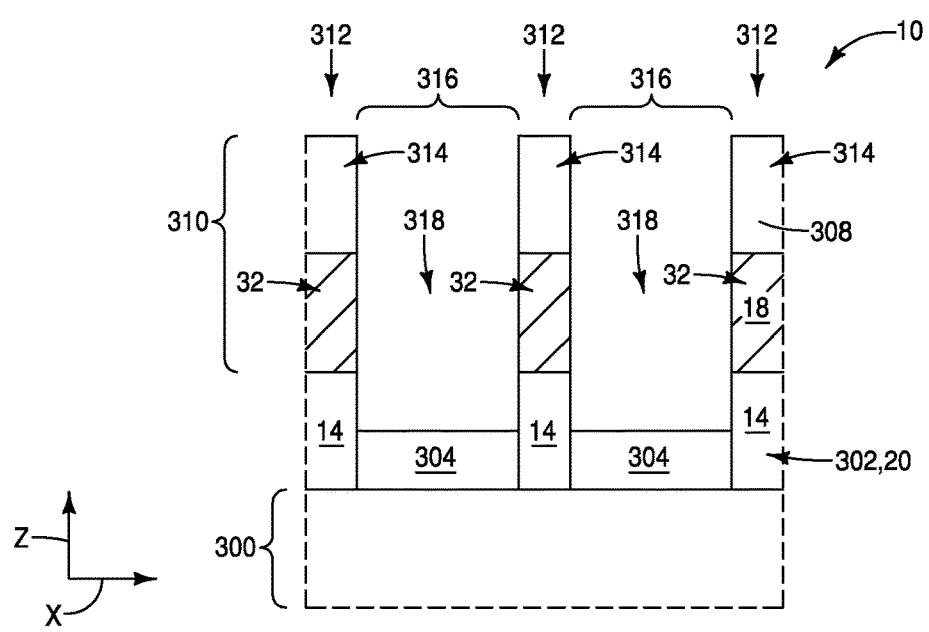

Referring to FIGS. 2A and 2B, the stack 310 is patterned into rails 312. The rails extend along a first direction of an illustrated y-axis, which may ultimately correspond to a column direction of a memory array.

The patterned bitline material 18 within the rails 312 becomes bitlines 32, and the patterned insulative material 308 becomes insulative supports 314 over the bitlines.

The rails 312 may be patterned with any suitable processing. In some embodiments, the rails may be patterned utilizing lithographically-patterned masking material (e.g., photolithographically-patterned photoresist). The lithographic (e.g., photolithographic) process will have a minimum feature size "F" associated therewith. The rails 312 may have widths corresponding to the minimum feature size of the lithographic process. Alternatively, the rails may be formed to a dimension less than the minimum feature size of the lithographic process utilizing additional processing; such as, for example, pitch-multiplication methodologies. Example pitch-multiplication processes are described in, for example, U.S. Pat. Nos. 8,389,383 and 8,852,851, and in U.S. patent publication No. 2014/0091434. A goal of integrated circuit fabrication can be to form components to decreasing dimensions in order to achieve increasing levels of integration. The dimensions of the components may be expressed in terms of the minimum feature size F of the lithographic process utilized during fabrication of the components. Some of the embodiments described herein include memory cells which fit within an area defined as $4F^2$.

The rails 312 are spaced from one another along a second direction (the x-axis direction) by intervening regions 316. Voids (also referred to as intervening voids) 318 are within the intervening regions 316. In some embodiments, the voids 318 at the processing stage of FIGS. 2A and 2B may be referred to as gaps. The material 304 is along bottoms of the gaps, and the materials 14, 32 and 308 are along sidewalls of the gaps.

Figure 3A:
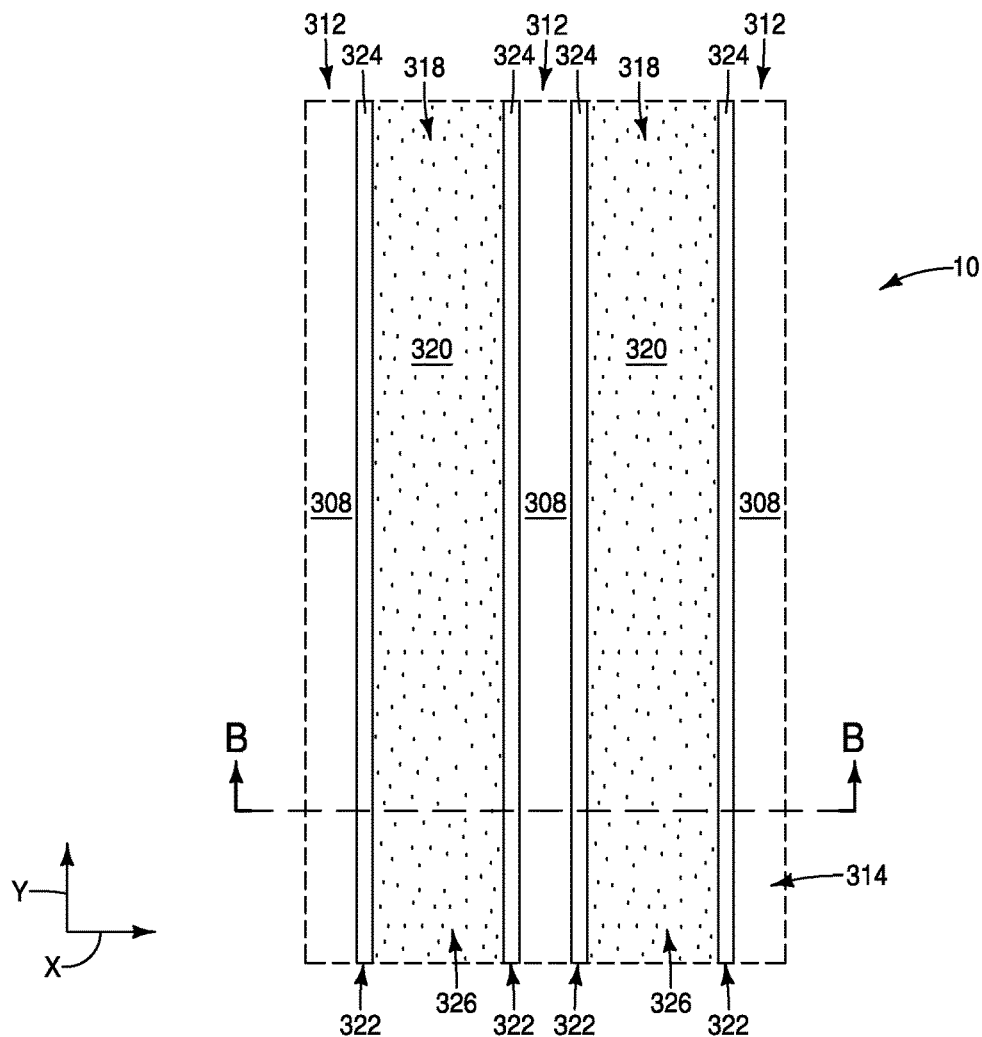
FIGS. 3A and 3B are a diagrammatic top view and a diagrammatic cross-sectional side view, respectively, of the example assembly of FIGS. 1A and 1B at an example process stage following that of FIGS. 2A and 2B. The view of FIG. 3B is along the line B-B of FIG. 3A.
Figure 3B:
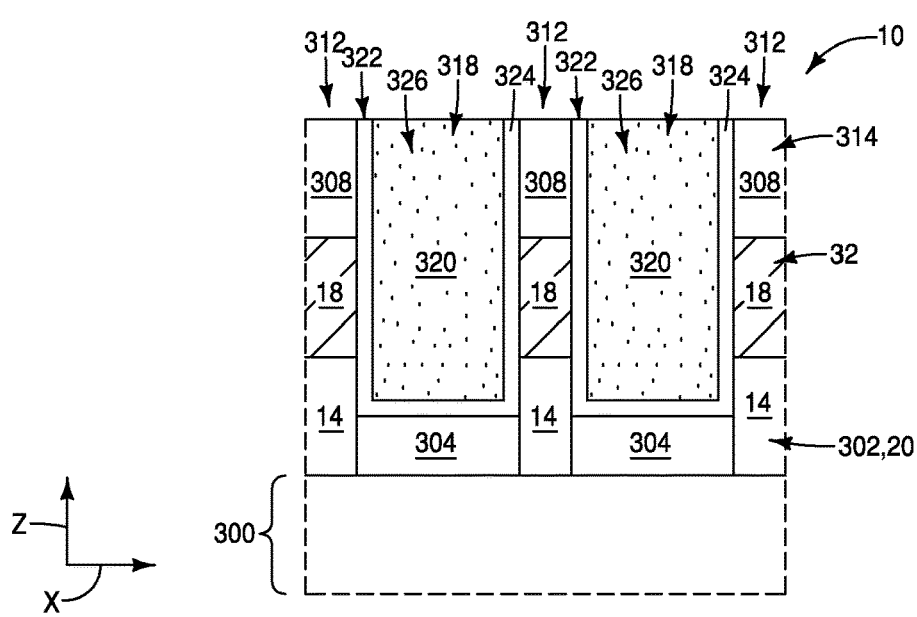

Referring to FIGS. 3A and 3B, sacrificial material 320 is formed within the voids 318. The sacrificial material 320 may comprise any suitable composition(s); and in some embodiments may comprise organic polymer, silicon dioxide, etc. The sacrificial material 320 is illustrated with stippling to assist the reader in identifying such sacrificial material.

In the shown embodiment, the sacrificial material 320 comprises a first insulative material (e.g., silicon dioxide), and is spaced from the materials 14, 18, 304 and 308 by insulative liners 322 of a second insulative material 324. The second insulative material 324 may comprise any suitable composition(s); and in some embodiments may comprise, consist essentially of, or consist of silicon nitride.

In some embodiments the insulative material 324 may be considered to line sidewalls of the gaps 318, and to define voids 326 within the lined gaps. The sacrificial material 320 may be considered to be formed within the voids 326.

In the illustrated embodiment, the voids 326 and gaps 318 are configured as trenches which extend along the first direction of the y-axis.

The sacrificial material 320 may be formed with any suitable process. If the sacrificial material comprises silicon oxide (e.g., silicon dioxide), the sacrificial material may be formed utilizing a spin-on process; and may, for example, be formed as a spin-on glass.

Figure 4A:
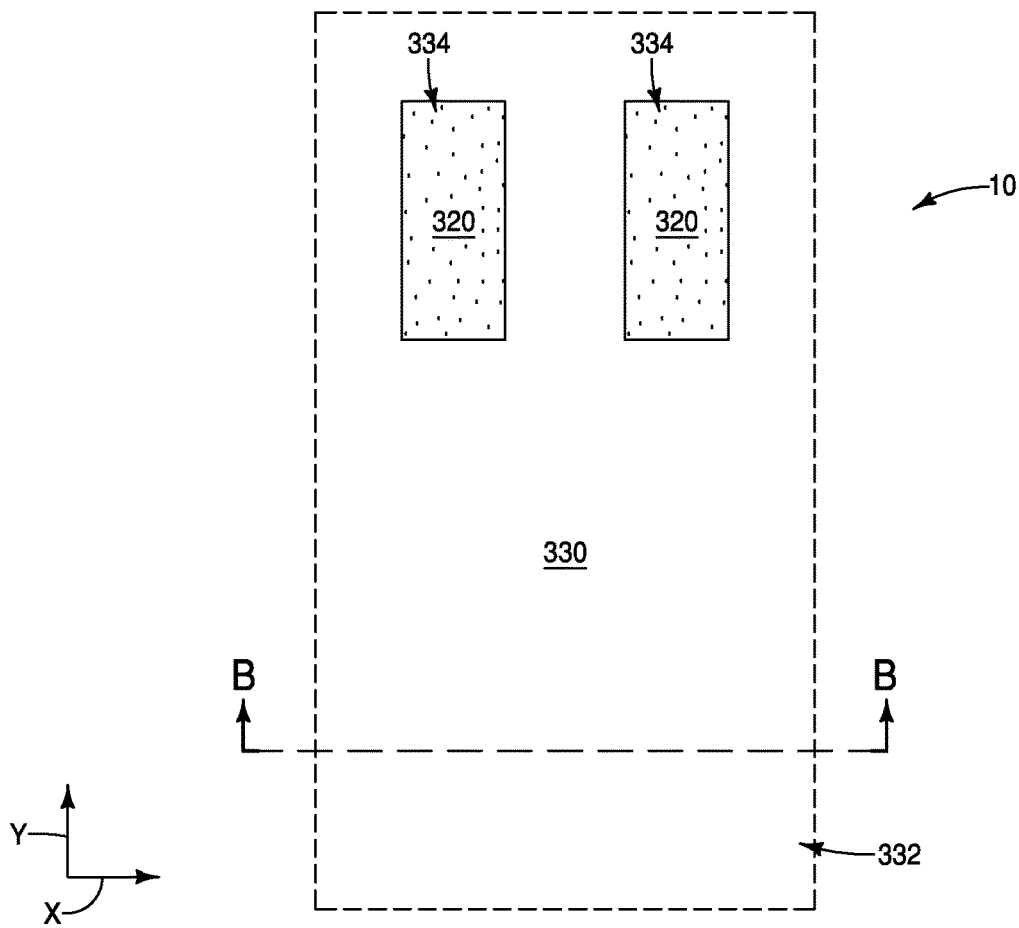
FIGS. 4A and 4B are a diagrammatic top view and a diagrammatic cross-sectional side view, respectively, of the example assembly of FIGS. 1A and 1B at an example process stage following that of FIGS. 3A and 3B. The view of FIG. 4B is along the line B-B of FIG. 4A.
Figure 4B:
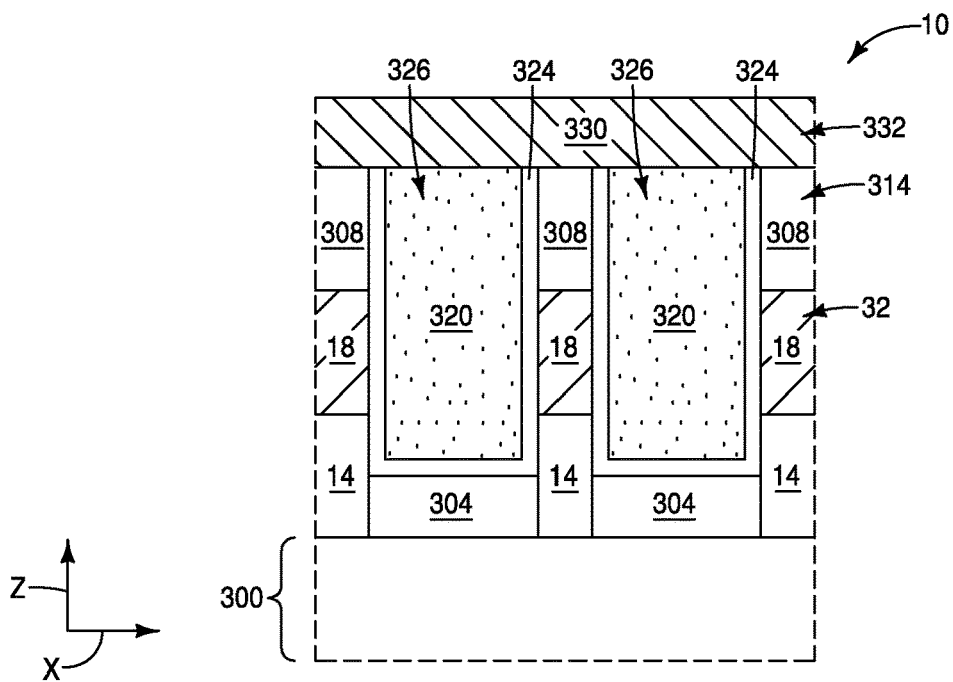

Referring to FIGS. 4A and 4B, a capping material 330 is formed over the voids 326. The capping material may comprise any suitable composition(s). In some embodiments the capping material 330 is a conductive material, and is patterned as a conductive plate 332. Such conductive plate is supported by the insulative supports 314. The conductive plate 332 may comprise metal nitride; and may, for example, comprise, consist essentially of, or consist of titanium nitride.

Windows 334 are formed to extend through the plate 332. The windows 334 expose regions of the sacrificial material 320 within the trenches (voids) 326.

Figure 5A:
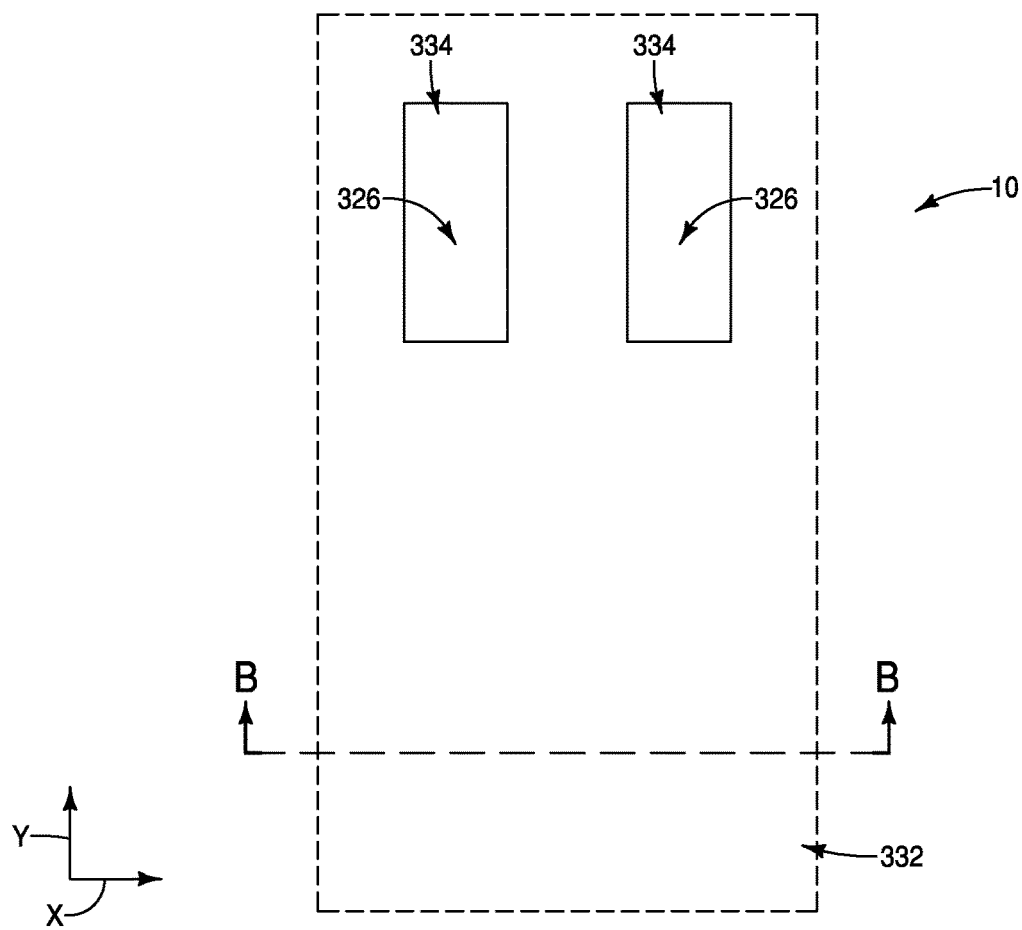
FIGS. 5A and 5B are a diagrammatic top view and a diagrammatic cross-sectional side view, respectively, of the example assembly of FIGS. 1A and 1B at an example process stage following that of FIGS. 4A and 4B. The view of FIG. 5B is along the line B-B of FIG. 5A.
Figure 5B:
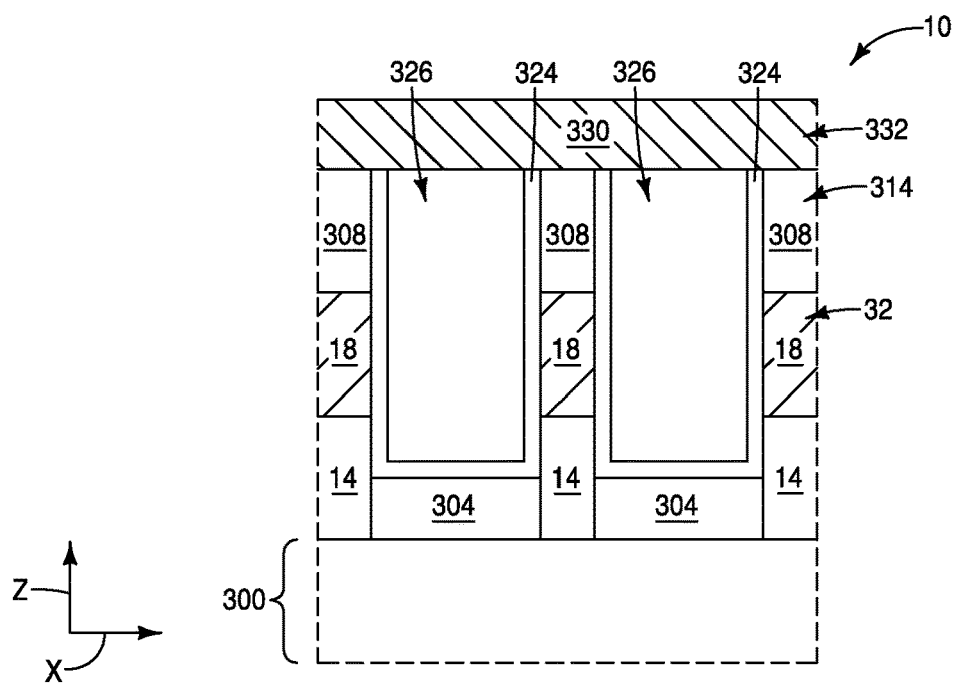

Referring to FIGS. 5A and 5B, the sacrificial material 320 is removed to re-form the voids 326. Such removal may be accomplished by flowing etchant through the windows 334 to exhume the sacrificial material from under the plate 332.

Figure 6A:
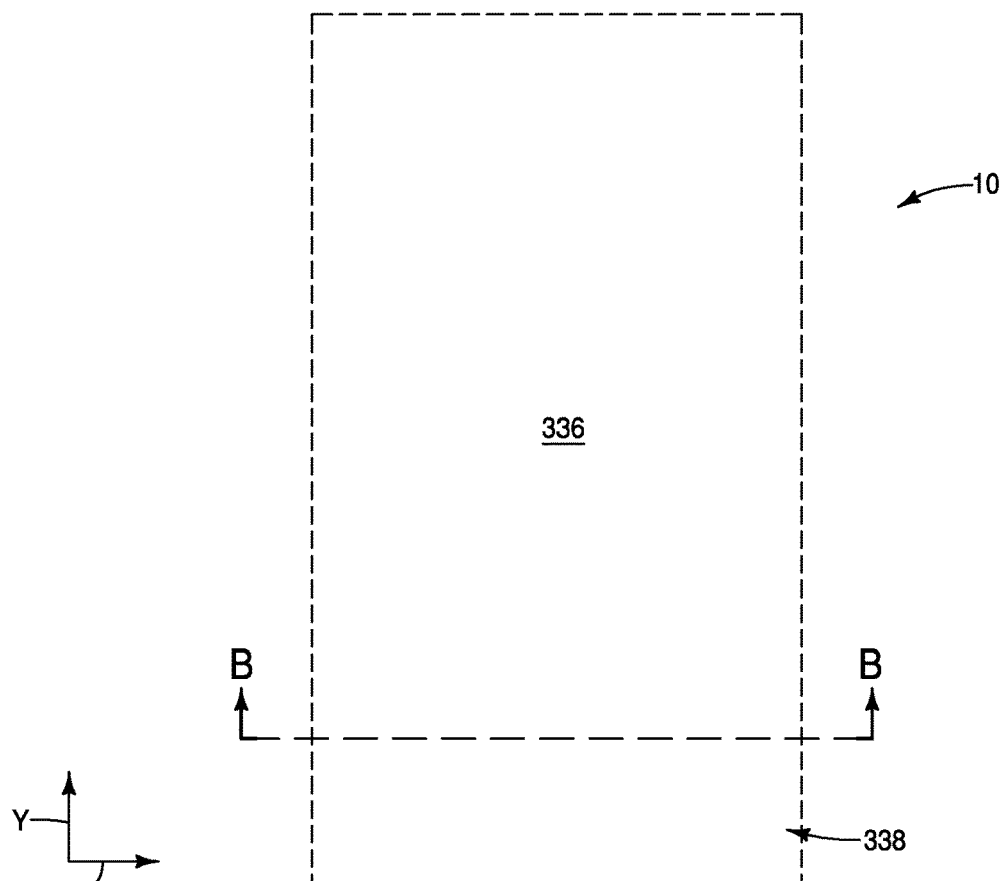
FIGS. 6A and 6B are a diagrammatic top view and a diagrammatic cross-sectional side view, respectively, of the example assembly of FIGS. 1A and 1B at an example process stage following that of FIGS. 5A and 5B. The view of FIG. 6B is along the line B-B of FIG. 6A.
Figure 6B:
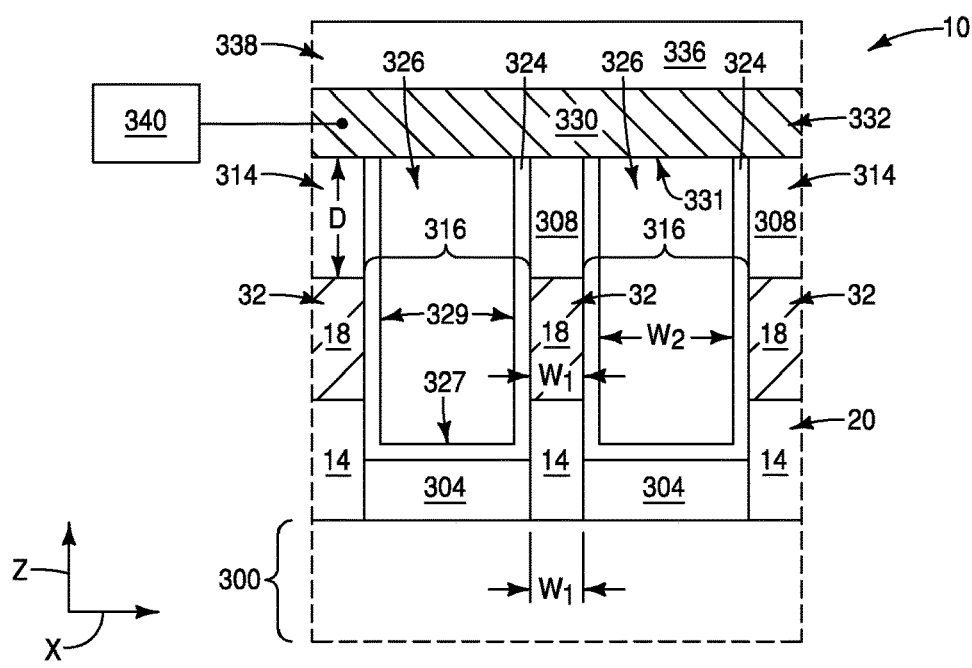

Referring to FIGS. 6A and 6B, an insulative material 336 is formed over the plate 332. The insulative material 336 may comprise any suitable composition(s); and in some embodiments may comprise, consist essentially of, or consist of silicon dioxide. The insulative material 336 may be considered to be configured as an insulative expanse 338 which extends across the conductive plate 332, and which extends across the windows 334 (FIG. 5A).

The bitlines 32 of FIG. 6B are spaced from one another by intervening regions 316 comprising the voids 326. The voids may function as low-k dielectric regions; with the term low-k meaning a dielectric constant less than that of silicon dioxide. The low-k dielectric regions may alleviate parasitic coupling between adjacent bitlines.

The voids may have any suitable width along the illustrated x-axis (i.e., along the cross-section of FIG. 6B). In the shown embodiment, the bitlines have a first width $W_1$ along the x-axis, and the voids 326 have a second width $W_2$ along the x-axis. The second width $W_2$ may be at least as large as the first width $W_1$. In some example embodiments, the second width $W_2$ may be at least about double the first width $W_1$.

The voids 326 have peripheries along the cross-section of FIG. 6B. The peripheries have bottom regions 327 and have sidewall regions 329. The regions 327 and 329 are bounded by the silicon nitride 324. In other embodiments the silicon nitride 324 may be absent at the process stage of FIG. 6B, and the voids remaining at the process stage of FIG. 6B may comprise the entirety of the gaps 318 of FIG. 2B.

The conductive plate 332 of FIG. 6B is spaced from the bitlines 32 by a distance D corresponding to the thickness of the insulative support material 308. In some embodiments the distance D may be tailored to enable the conductive plate 332 to drain excess charge from the underlying bitlines 32, and to thereby reduce parasitic capacitance between adjacent bitlines. The distance D may be within any suitable range; and in some embodiments may be within a range of from about 5 nanometers (nm) to about 50 nm.

The conductive plate 332 may be electrically coupled with a reference source 340 to better enable the plate to drain excess charge from the underlying bitlines. The reference source may have any suitable voltage, and in some embodiments may be at ground voltage (i.e., the conductive plate 332 may be electrically grounded).

The voids 326 extend to a bottom surface 331 of the conductive plate 332 in the illustrated embodiment of FIG. 6B.

The structure 10 of FIGS. 6A and 6B may be considered to comprise a configuration suitable for reducing parasitic capacitance between neighboring bitlines. Such configuration may be utilized in DRAM arrays. Example DRAM arrays, and example methods of forming the DRAM arrays, are described with reference to FIGS. 7-40.

A first example method of forming a first example DRAM array is described with reference to FIGS. 7-13.

Figure 7B:
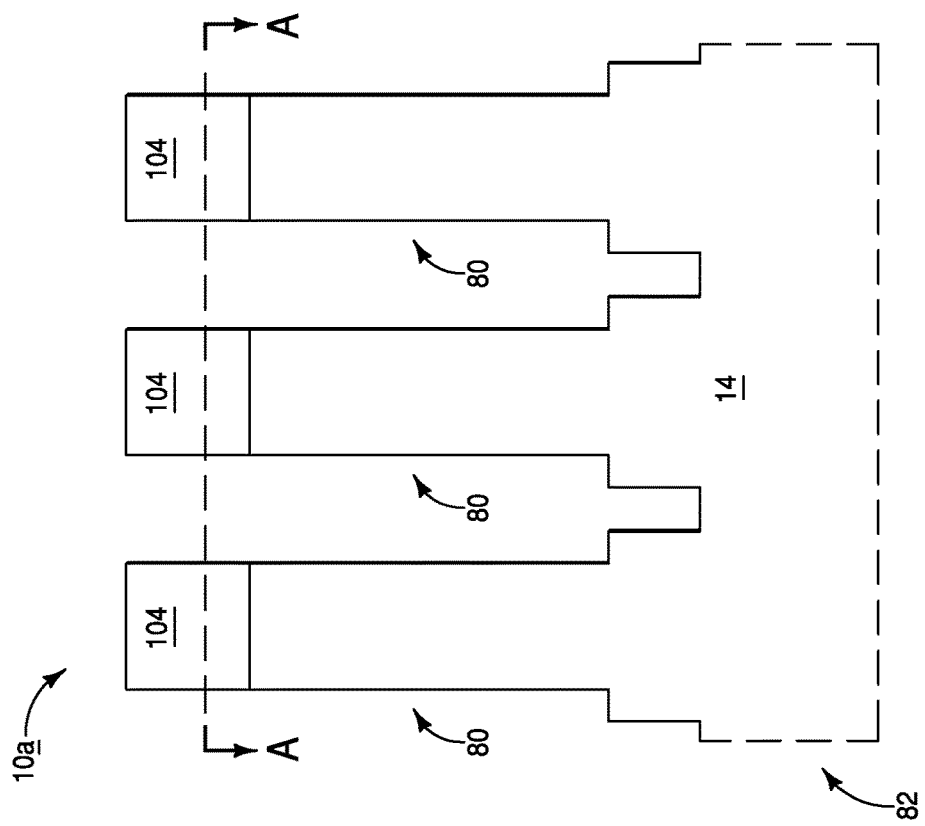
FIGS. 7A and 7B are a diagrammatic cross-sectional top-down view and a diagrammatic cross-sectional side view, respectively, of an example assembly at an example process stage of an example method for fabricating an example array of memory cells. The view of FIG. 7A is along the line A-A of FIG. 7B, and the view of FIG. 7B is along the line B-B of FIG. 7A.
Figure 7A:
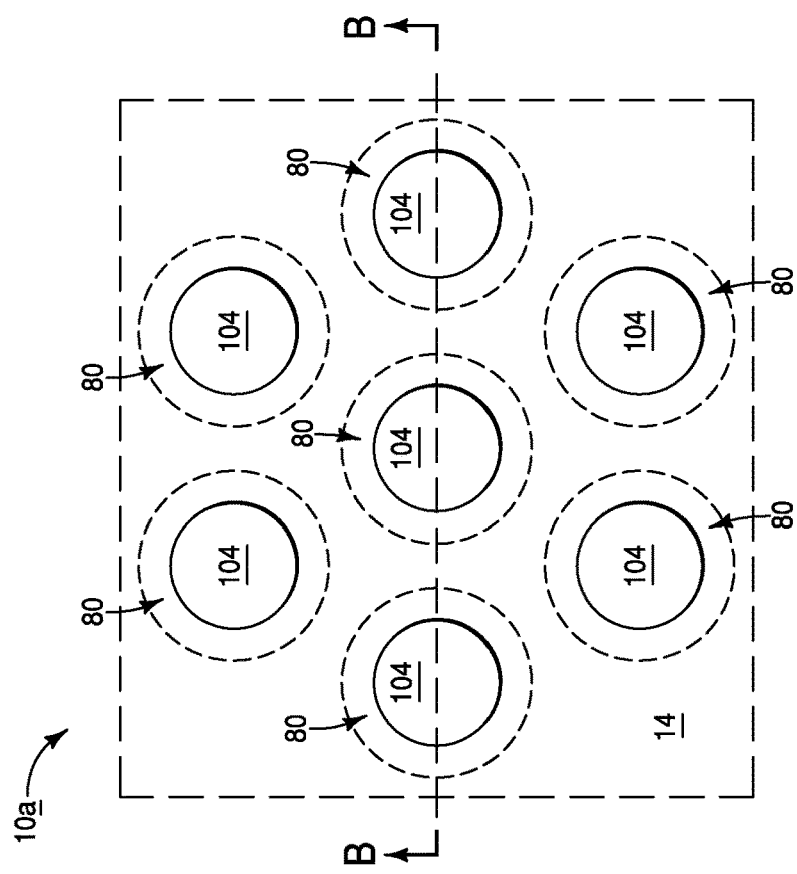

Referring to FIGS. 7A and 7B, a construction 10*a* comprises islands 80 of semiconductor material 14 extending upwardly from a mass 82 of the semiconductor material. The islands are capped with protective material 104. The protective material 104 may comprise any suitable composition(s); and in some embodiments may comprise, consist essentially of, or consist of silicon nitride.

Referring to FIGS. 8A and 8B, regions between the islands 80 are lined with insulative material 40, then shield material 42 is deposited and recessed, and then additional insulative material 40 is provided over the shield material.

The insulative material 40 may comprise any suitable composition(s); and in some embodiments may comprise, consist essentially of, or consist of silicon dioxide.

The conductive shield material 42 may comprise any suitable composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). In some embodiments, the conductive shield material 42 may comprise, consist essentially of, or consist of conductively-doped semiconductor material (e.g., conductively-doped polycrystalline silicon). The conductively-doped semiconductor material may be doped to any suitable concentration, and in some embodiments may be doped to a concentration of at least about $1 \times 10^{20}$ atoms/cm$^3$ with either n-type dopant (e.g., phosphorus) or p-type dopant (e.g., boron). In other words, in some example embodiments the shield material 42 may comprise polycrystalline semiconductor material (e.g., polycrystalline silicon) which is heavily-doped with one or more impurities (e.g., one or more of phosphorus, arsenic, boron, etc.).

In some embodiments the semiconductor material 14 and the shield material 42 may both comprise, consist essentially of, or consist of silicon; with the silicon of the semiconductor material 14 being monocrystalline, and with the silicon of the shield material 42 being polycrystalline (and in some applications, being referred to as polysilicon).

Referring to FIGS. 9A and 9B, the protective material 104 (FIGS. 8A and 8B) is removed, and then doped regions 22 are formed along upper portions of the islands 80. In the shown embodiment, the doped regions 22 are formed after removing the protective material 104. In other embodiments, the semiconductor material 14 may be blanket-doped prior to patterning the material into the islands 80, and accordingly the doped regions 22 may be formed at an earlier process stage than the process stage of FIGS. 9A and 9B. The doped regions 22 correspond to source/drain regions.

Capacitors 62 are formed to be coupled with (electrically connected with) the source/drain regions 22. The illustrated capacitors are container-type capacitors; and each comprises a container-shaped electrode 106, a dielectric material 108 within the container-shaped electrode, and another electrode 110 over the dielectric material 108 and within the container-shaped electrode. The electrodes 106 and 110 may comprise any suitable compositions; such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). The dielectric material 108 may comprise any suitable composition(s); and in some embodiments may comprise one or more of silicon dioxide, silicon nitride and silicon oxynitride. Although capacitors are specifically illustrated, it is to be understood that the structures 62 may generically refer to any suitable storage elements; including, for example, resistive memory, phase change memory, etc.

Insulative material 112 is provided over and between the capacitors 62. The insulative material 112 may comprise any suitable composition(s); and in some embodiments may comprise one or both of silicon dioxide and silicon nitride.

The semiconductor material 14, shield material 42, insulative material 40, capacitors 62 and insulative material 112 may be together considered to form a subassembly 114.

Figure 10B:
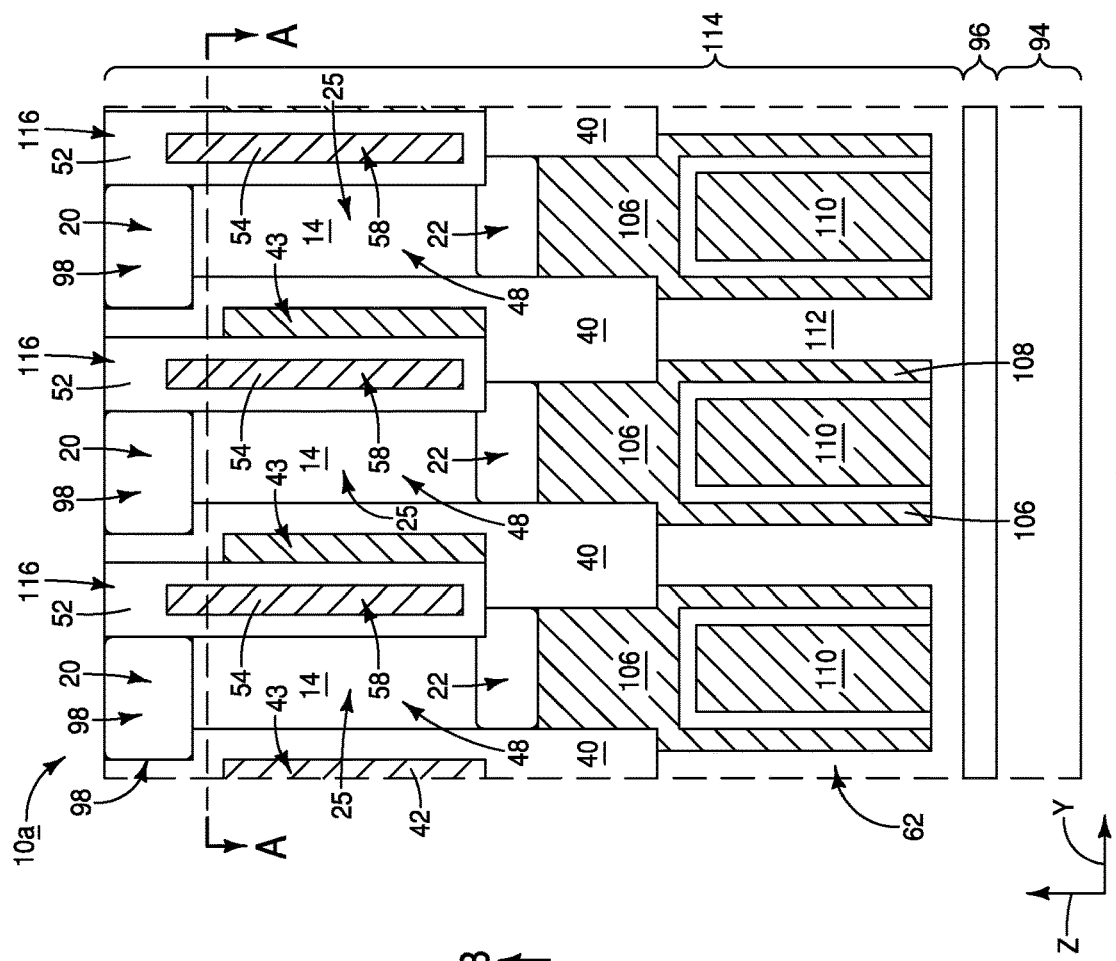
FIGS. 10A and 10B are a diagrammatic cross-sectional top-down view and a diagrammatic cross-sectional side view, respectively, of the example assembly of FIGS. 7A and 7B at an example process stage following that of FIGS. 9A and 9B. The view of FIG. 10A is along the line A-A of FIG. 10B, and the view of FIG. 10B is along the line B-B of FIG. 10A.
Figure 10A:
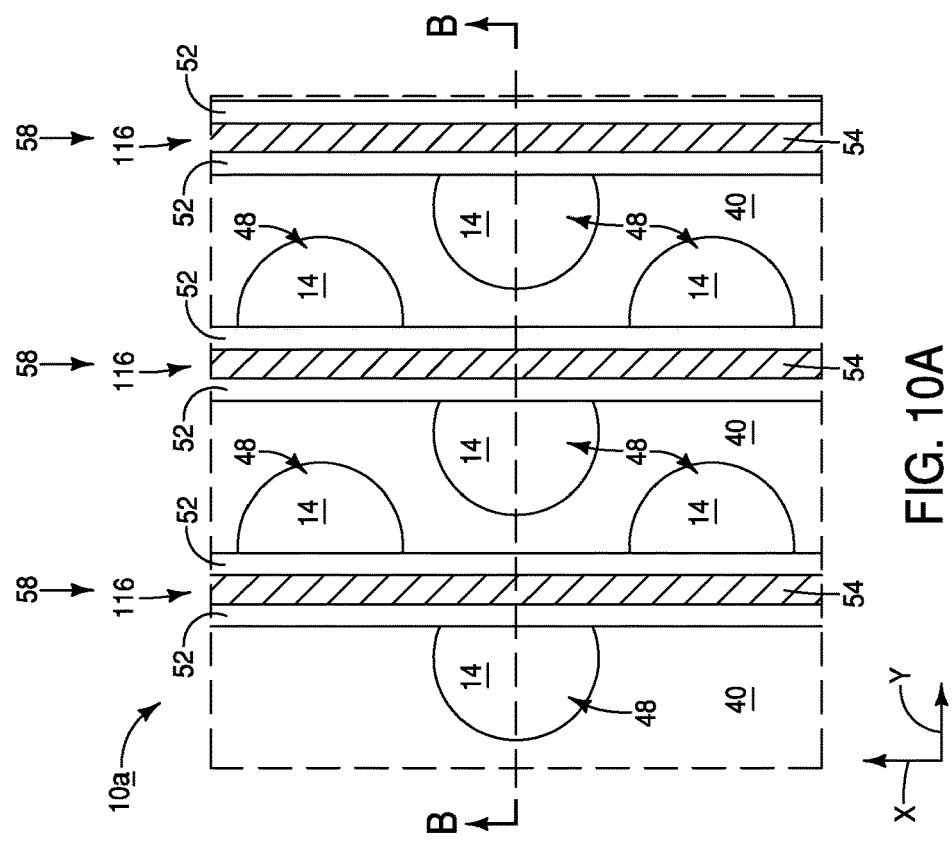

Referring to FIGS. 10A and 10B, the subassembly 114 is bonded to a handle structure 94 through a bonding region 96, and is then inverted. The handle structure 94 may comprise any suitable configuration, and in some embodiments may correspond to a semiconductor wafer (e.g., a monocrystalline silicon wafer) or other suitable semiconductor substrate. For purposed of interpreting this disclosure, the term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above.

The bonding of the subassembly 114 with the handle structure 94 may be accomplished utilizing any suitable processing; including, for example, techniques in which two silicon dioxide surfaces are placed against one another and subjected to appropriate treatment to induce covalent bonding between the surfaces and thereby form a composite structure. Accordingly, the bonding region 96 may comprise silicon dioxide. The treatment utilized to induce the covalent bonding may be a thermal treatment. Such thermal treatment may utilize a temperature in excess of 800° C. Alternatively, one or both of the silicon dioxide surfaces may be subjected to a plasma treatment prior to the thermal treatment, and then the temperature of the thermal treatment may be reduced to a temperature within a range of from about 150° C. to about 200° C. The bonding of the silicon dioxide surfaces to one another may be referred to as "hybrid bonding" (or "smart-cut"); with example hybrid bonding procedures being described in U.S. Pat. Nos. 9,666,573 and 10,103,053, both of which are assigned to Micron Technology, Inc., and both of which list Mitsunari Sukekawa as an inventor.

The mass 82 (FIG. 9B) of semiconductor material 14 is removed with appropriate processing (e.g., CMP), which exposes regions 98 of the semiconductor material 14 (in some embodiments, the regions 98 may be considered to correspond to bottom regions of the islands 80 of FIG. 9B). Source/drain regions 20 are formed along the regions 98, and in some embodiments may be formed by implanting appropriate dopant into the regions 98.

Trenches 116 are formed to extend into the islands 80 (FIG. 9B) and to pattern pillars 48 from the islands. The trenches 116 extend along the first direction of the x-axis.

The trenches 116 are lined with gate dielectric material 52, and then wordline material 54 is formed within such lined trenches and patterned into wordlines 58. Subsequently, additional insulative material is formed over the wordlines. In the shown embodiment, the additional insulative material is a same composition as material 52.

The conductive shield material 42 is patterned into shield plates 43.

The embodiment of FIGS. 10A and 10B shows the trenches 116 etched deep enough to reach the doped regions 22. In alternative embodiments, the trenches 116 may be etched less deep, and doped extensions may be formed to extend from bottoms of the trenches to the doped regions 22. For instance, FIGS. 11A and 11B show an embodiment alternative to that of FIGS. 10A and 10B, and show doped extensions 118 formed to extend from bottoms of the trenches 116 to the doped regions 22. The doped extensions 118 may be the same conductivity type as the regions 22, and may be heavily-doped with appropriate dopant. Alternatively, the extensions 118 may be less doped than the regions 22, and may, for example, correspond to lightly-doped diffusion regions.

Referring to FIGS. 12A and 12B, the construction 10a is shown at a processing stage subsequent to that of FIGS. 10A and 10B. Bitlines 32 are formed over the subassembly 114, and are coupled with the source/drain regions 20. The bitlines comprise the bitline material 18 described above with reference to FIGS. 1A and 1B.

The conductive shield plates 43 are coupled with (i.e., electrically connected with) a reference source (i.e., reference voltage node, reference structure, reference terminal, etc.) 70. The reference source is configured to provide a desired voltage to the shield plates 43. Such voltage may be any suitable voltage, and in some embodiments may be a ground voltage (i.e., the shield plates 43 may be electrically grounded).

The shield material 42 may comprise any suitable composition, and in some embodiments may be doped similar to the source/drain regions 20 and 22. In some embodiments, the doped regions 20 and 22 may be considered to comprise first semiconductor material (i.e., material 14), and the conductive shield material 42 may be considered to comprise second semiconductor material. If the shield material 42 comprises conductively-doped silicon, the shield material may be doped to a same conductivity type as the doped regions 20 and 22, or may be doped to an opposite conductivity type as the doped regions 20 and 22 (with p-type and n-type being understood to be opposite conductivity types).

The construction of FIGS. 12A and 12B may be considered to correspond to an assembly comprising a memory array 60. The memory array includes the bitlines 32 extending along the second direction of the y-axis, (i.e., extending along columns 68 of the memory array 60), and includes the wordlines 58 extending along the first direction of the x-axis (i.e., extending along rows 66 of the memory array). The wordlines 58 are vertically offset from the bitlines 32, and cross the bitlines (specifically, cross under the bitlines relative to the configuration of FIG. 12B).

The pillars 48 are arranged in the rows 66 and the columns 68 of the memory array 60. The pillars 48 along a given column 68 are those pillars coupled with a common bitline 32. The pillars 48 along a given row 66 are those pillars coupled with a common wordline. The wordlines 58 are labeled as 58a, 58b and 58c so that they may be distinguished from another. The rows 66 are labeled as 66a, 66b and 66c so that they may be distinguished from one another; with the row 66a comprising the pillars 48 associated with the wordline 58a, the row 66b comprising the pillars 48 associated with the wordline 58b, and the row 66c comprising the pillars associated with the wordline 58c. The individual pillars 48 are identified relative to a specific one of the rows 66a, 66b and 66c that the pillars are associated with. The pillars associated with the row 66a are labeled 166a, the pillars associated with row 66b are labeled 166b, and the pillars associated with the row 66c are labeled 166c. Notably, each row comprises a first series (i.e., first set) of pillars on one side of a wordline, and a second series (i.e., second set) of pillars on an opposing side of the wordline. For instance, one of the pillars 166a is labeled 166a-1 to show that it is part of a first series on one side of the wordline 58a, and others of the pillars 166a are labeled 166a-2 to show that they are part of a second series on an opposing side of the wordline 58a. The pillars of the first set alternate with the pillars of the second set along the row 66a. Similarly, the pillars 166b comprise a first set 166b-1 and a second set 166b-2, and the pillars 166c comprise a first set 166c-1 and a second set 166c-2 (not shown).

The opposing sides of the wordlines 58 are identified as sides 55 and 57 along the cross-sectional views of FIGS. 12A and 12B. The sides 55 and 57 of the wordlines may be referred to as first and second lateral surfaces of the wordlines.

Each of the semiconductor pillars 48 comprises a channel region (i.e., transistor channel region) 25 vertically disposed between the first and second source/drain regions 20 and 22. The channel regions may be considered to be within body regions 24 of transistors 132, with such body regions extending between the first and second source/drain regions. The wordlines 58 are adjacent to the channel regions, and are spaced from the channel regions by intervening insulative regions comprising the gate dielectric material 52. The gate dielectric material is between the first lateral surface 55 and the channel regions of the semiconductor pillars 48 of the first set (e.g., the pillars 166a-1 along the wordline 58a), and the gate dielectric material is between the second lateral surface 57 and the semiconductor pillars 48 of the second set (e.g., the pillars labeled 166a-2 along the wordline 58a). The conductive shield material 42 is between the semiconductor pillars of the first and second sets.

In the embodiment of FIG. 12B the conductive shield material 42 does not extend to under the wordlines 58, but instead the shield plates 43 are configured as vertical pillars.

The embodiment of FIG. 12B shows the gate dielectric material 52 spacing the shield material 42 from the second lateral side 57 of the wordline 58a, and spacing the channel region 25 from the first lateral side 55 of the wordline 58a. In other embodiments, the insulative material spacing the shield material from one lateral side of a wordline may not be the same as the insulative material spacing the transistor channel material from another side of the wordline.

The cross-section of FIG. 12B may be considered to be a cross-section along a column direction (i.e., along the y-axis direction). Such cross-section passes through a series of the first semiconductor pillars (specifically, pillars identified as 166a-1, 166b-1 and 166c-1), and through a series of the conductive plates 43 of the shield material 42. The wordlines (58a, 58b and 58c) along the cross-section have their first lateral surfaces 55 along the channel regions 25 of the semiconductor pillars (i.e., along channel regions of transistors comprising active regions within the semiconductor pillars), and are spaced from such channel regions by the gate dielectric material 52; and have their second lateral surfaces 57 along the conductive plates 43, and spaced from the conductive plates by the gate dielectric material 52. The illustrated shield plates 43 are vertically-extending pillars along the cross-section, with no regions of the shield material extending to under the wordlines 58a-c.

The configuration of FIGS. 12A and 12B may be considered to comprise memory cells 130 comprising the capacitors 62 and the transistors 132. Such memory cells may have maximum dimensions along the x and y axes of 2F (where F is the minimum feature size discussed above with reference to FIGS. 2A and 2B), and thus the lateral peripheries of the memory cells may fit within an area of $4F^2$. Such is diagrammatically illustrated in FIG. 12A, where a box of dimension 2F×2F (i.e., area $4F^2$) contains the entire lateral periphery of a memory cell 130.

Figure 13A:
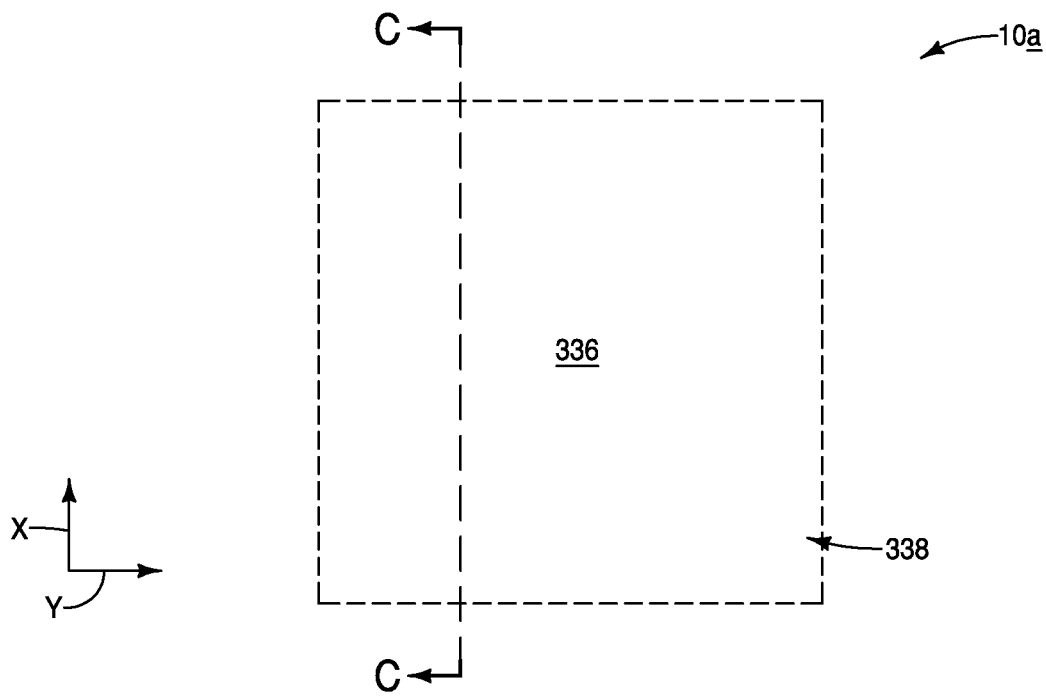
FIGS. 13A and 13C are a diagrammatic top view and a diagrammatic cross-sectional side view, respectively, of a region of the example assembly of FIGS. 7A and 7B at an example process stage following that of FIGS. 12A and 12B. The view of FIG. 13C is along the line C-C of FIG. 13A.
Figure 13C:
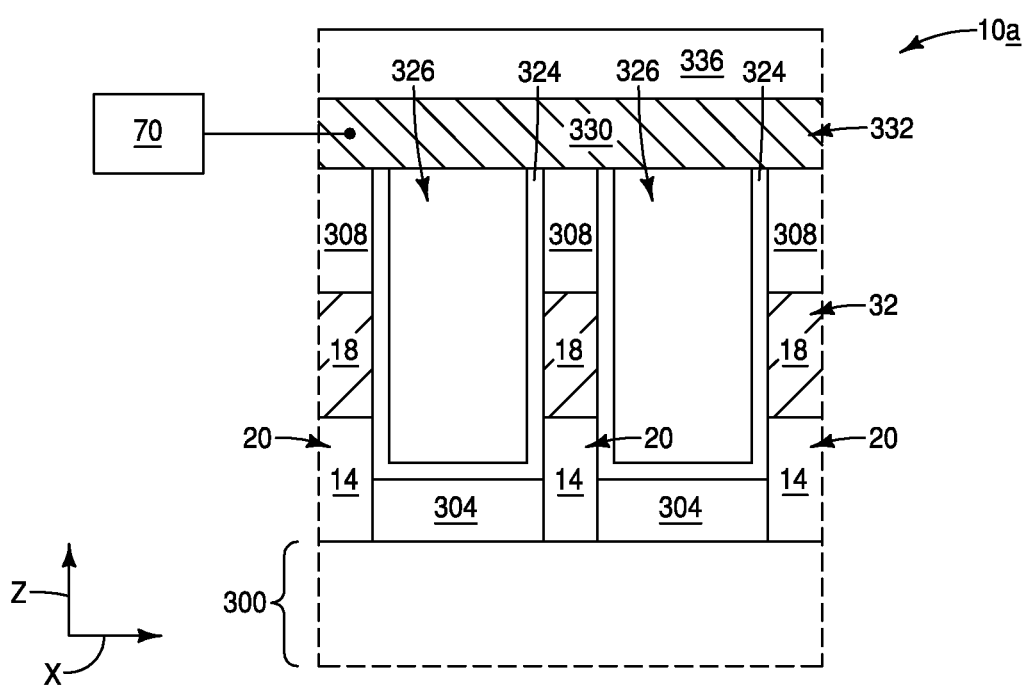

In some embodiments the structure beneath the source/drain regions 20 of FIG. 12B may correspond to the structure 300 of FIGS. 1A and 1B. FIGS. 13A and 13C show the construction 10a at a processing stage which may follow that process stage of FIGS. 12A and 12B; and specifically, after processing of the type described above with reference to FIGS. 1-6 is utilized to form voids 326 between adjacent bitlines 32, and to form the conductive plate 332 over the bitlines. The plate 332 may be electrically grounded to the same reference structure 70 as the shield lines of FIG. 12B (or to a different reference structure). The regions 304 of FIG. 13C may comprise the dielectric material 52 and portions of the wordlines 58, as can be understood with reference to FIG. 12B.

The shield plates 43 of the embodiment of FIGS. 7-13 are entirely electrically isolated from the body regions 24 of the semiconductor pillars 48. In other embodiments the shield plates may be electrically connected with (electrically coupled with) the body regions 24. An example of such other embodiments is described with reference to FIGS. 14-20.

Figure 14B:
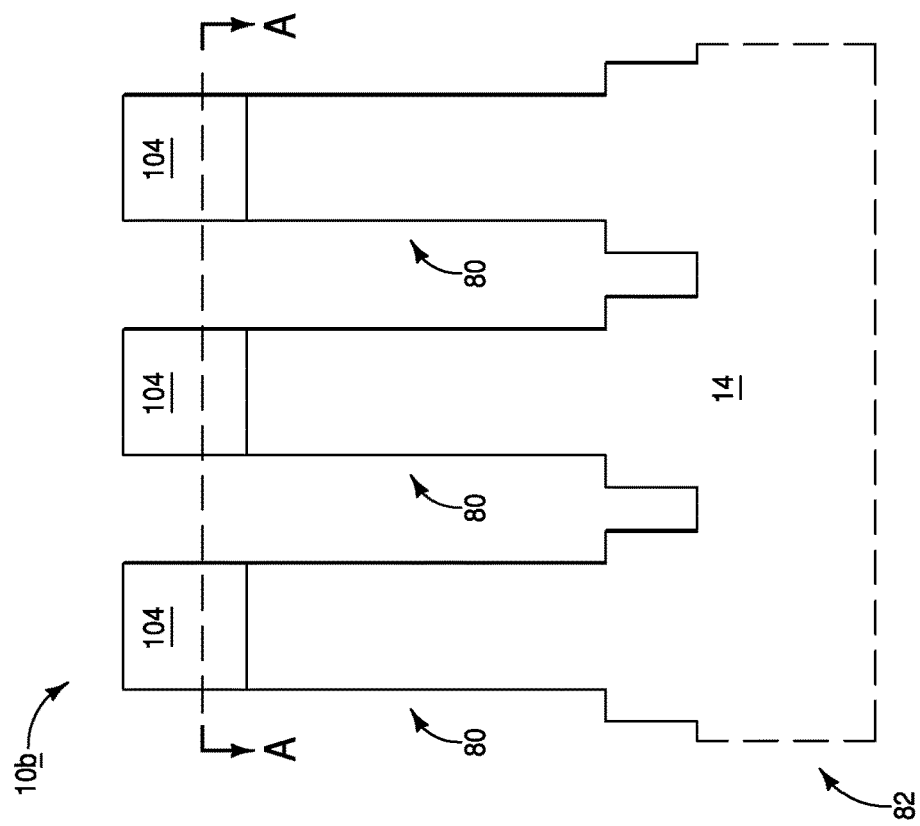
FIGS. 14A and 14B are a diagrammatic cross-sectional top-down view and a diagrammatic cross-sectional side view, respectively, of an example assembly at an example process stage of an example method for fabricating an example array of memory cells. The view of FIG. 14A is along the line A-A of FIG. 14B, and the view of FIG. 14B is along the line B-B of FIG. 14A.
Figure 14A:
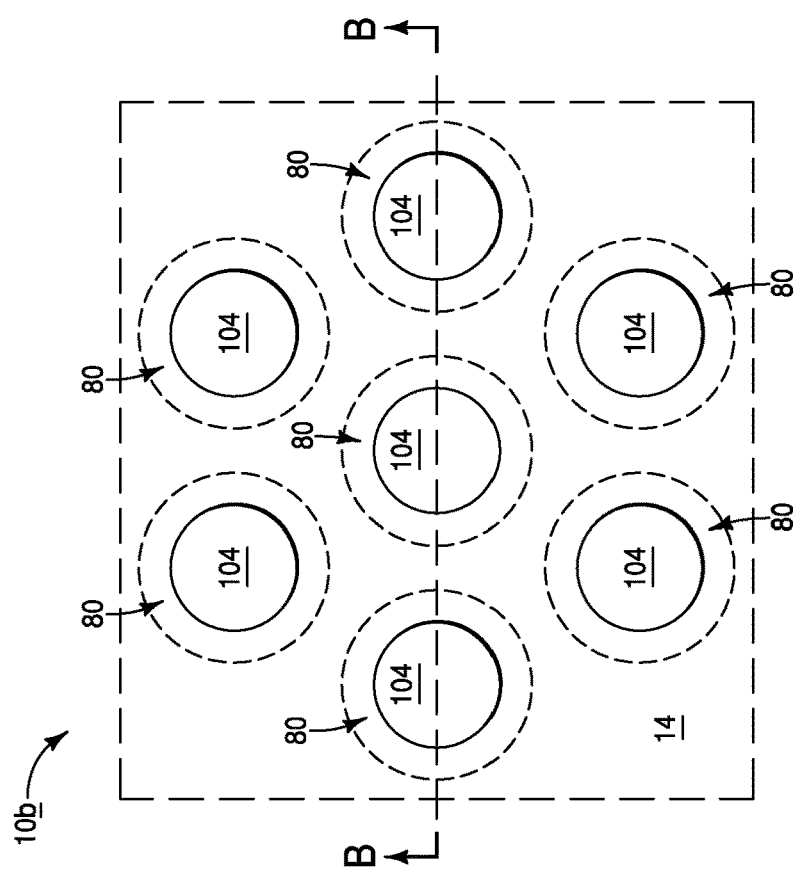

Referring to FIGS. 14A and 14B, a construction 10b comprises islands 80 of semiconductor material 14 extending upwardly from a mass 82 of the semiconductor material. The islands are capped with the protective material 104. The construction of FIGS. 14A and 14B may be identical to that described above with reference to FIGS. 7A and 7B.

Figure 15B:
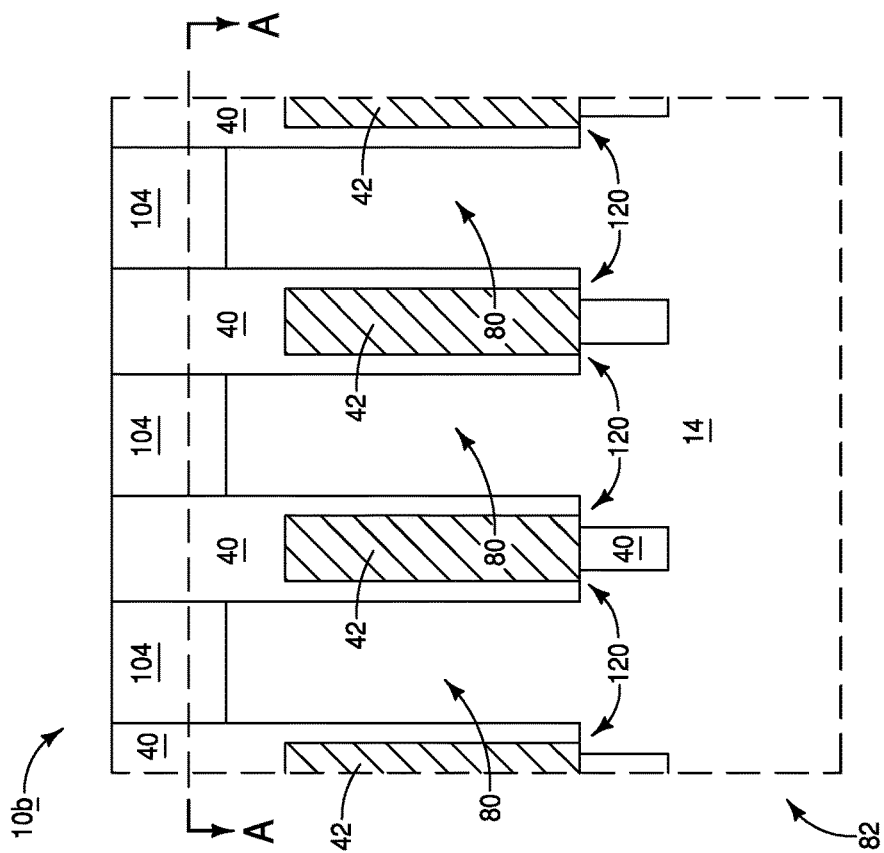
FIGS. 15A and 15B are a diagrammatic cross-sectional top-down view and a diagrammatic cross-sectional side view, respectively, of the example assembly of FIGS. 14A and 14B at an example process stage following that of FIGS. 14A and 14B. The view of FIG. 15A is along the line A-A of FIG. 15B, and the view of FIG. 15B is along the line B-B of FIG. 15A.
Figure 15A:
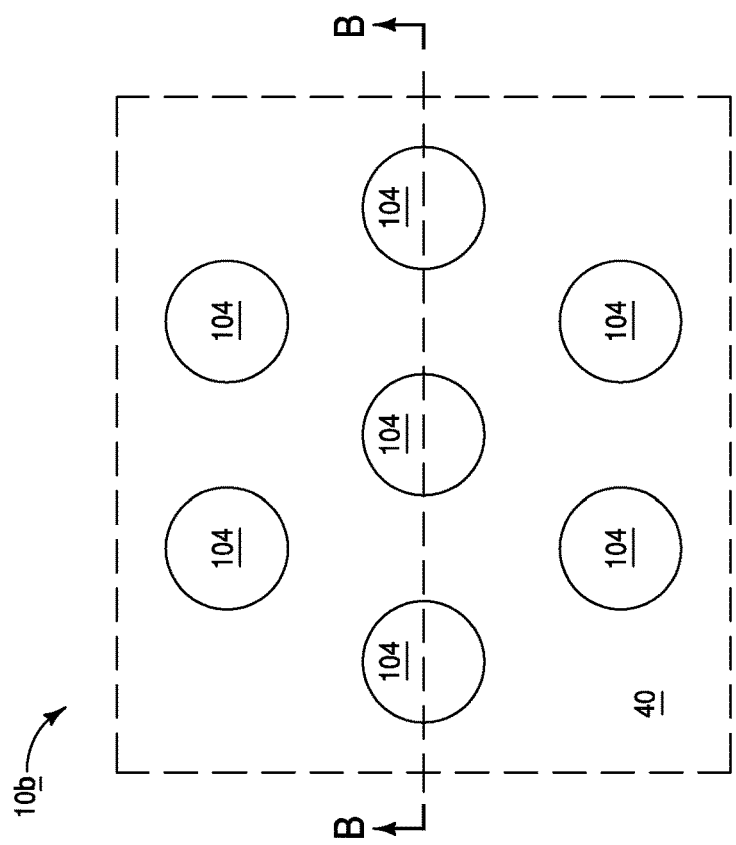

Referring to FIGS. 15A and 15B, regions between the islands 80 are lined with insulative material 40, then shield material 42 is deposited and recessed, and then additional insulative material 40 is provided over the shield material. The configuration of FIGS. 15A and 15B differs from that of FIGS. 8A and 8B in that the shield material 42 punches through bottom regions of the insulative material 40 so that segments along an outer boundary of the shield material directly contact the semiconductor material 14 at interface regions 120.

Figure 16B:
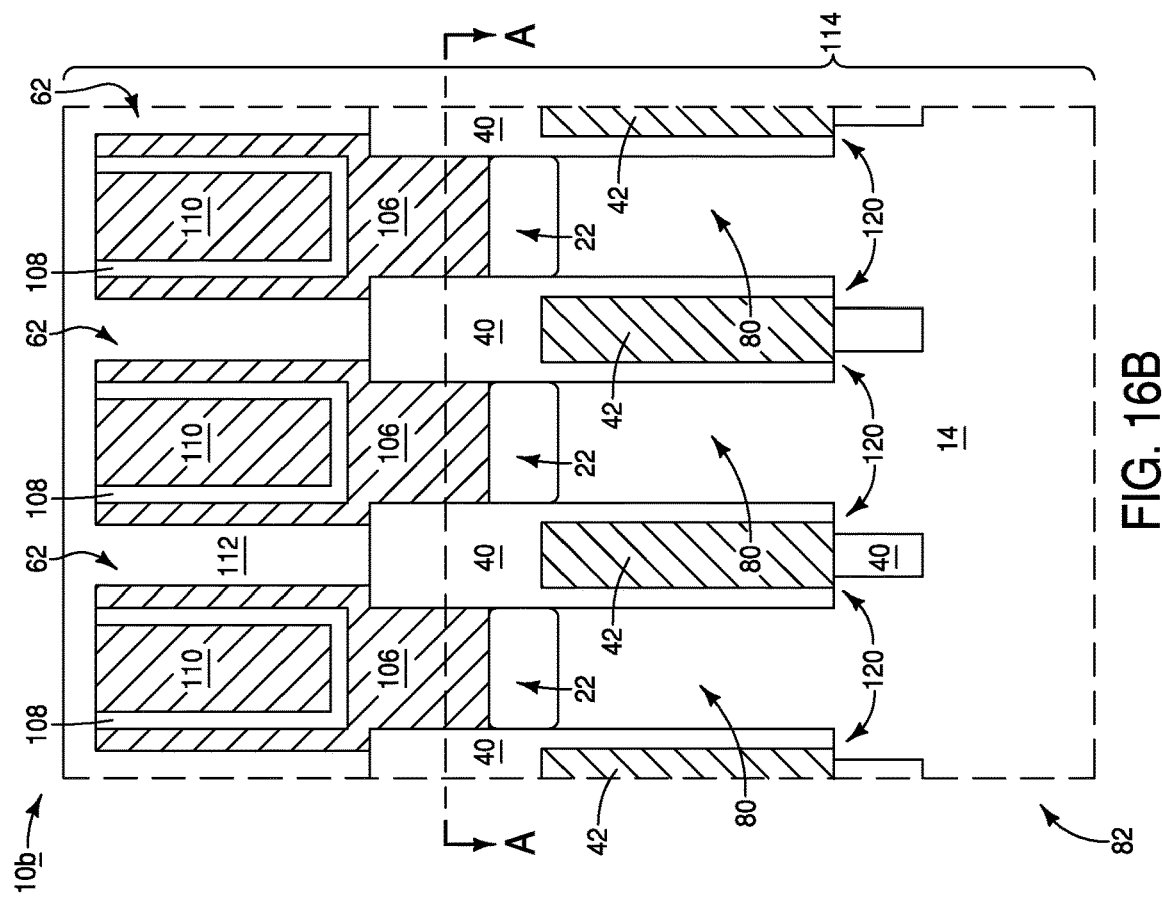
FIGS. 16A and 16B are a diagrammatic cross-sectional top-down view and a diagrammatic cross-sectional side view, respectively, of the example assembly of FIGS. 14A and 14B at an example process stage following that of FIGS. 15A and 15B. The view of FIG. 16A is along the line A-A of FIG. 16B, and the view of FIG. 16B is along the line B-B of FIG. 16A.
Figure 16A:
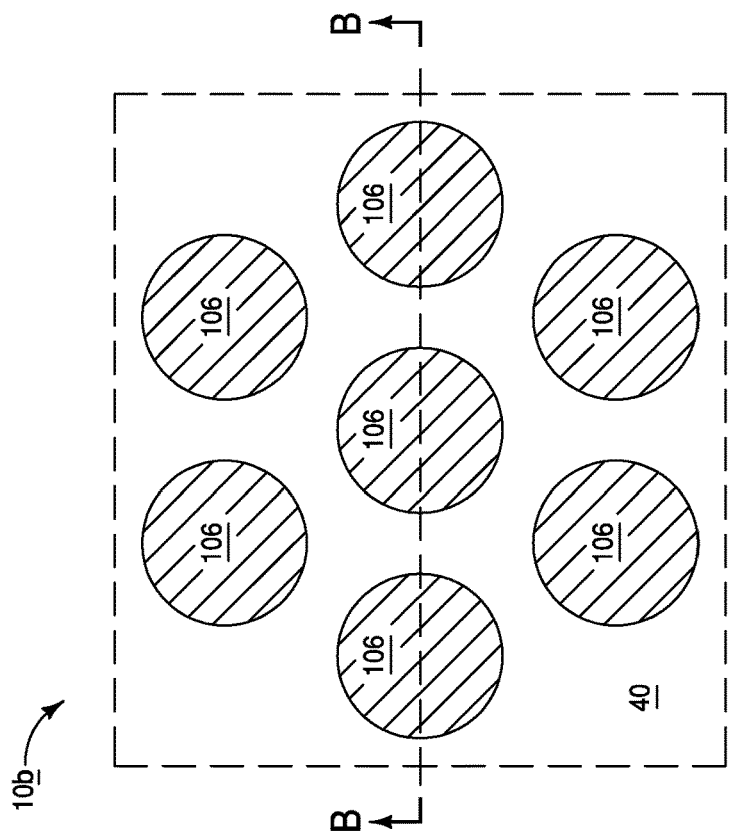

Referring to FIGS. 16A and 16B, processing analogous to that described above with reference to FIGS. 9A and 9B is conducted to form the doped regions 22 and the capacitors 62 of a subassembly 114.

Figure 17B:
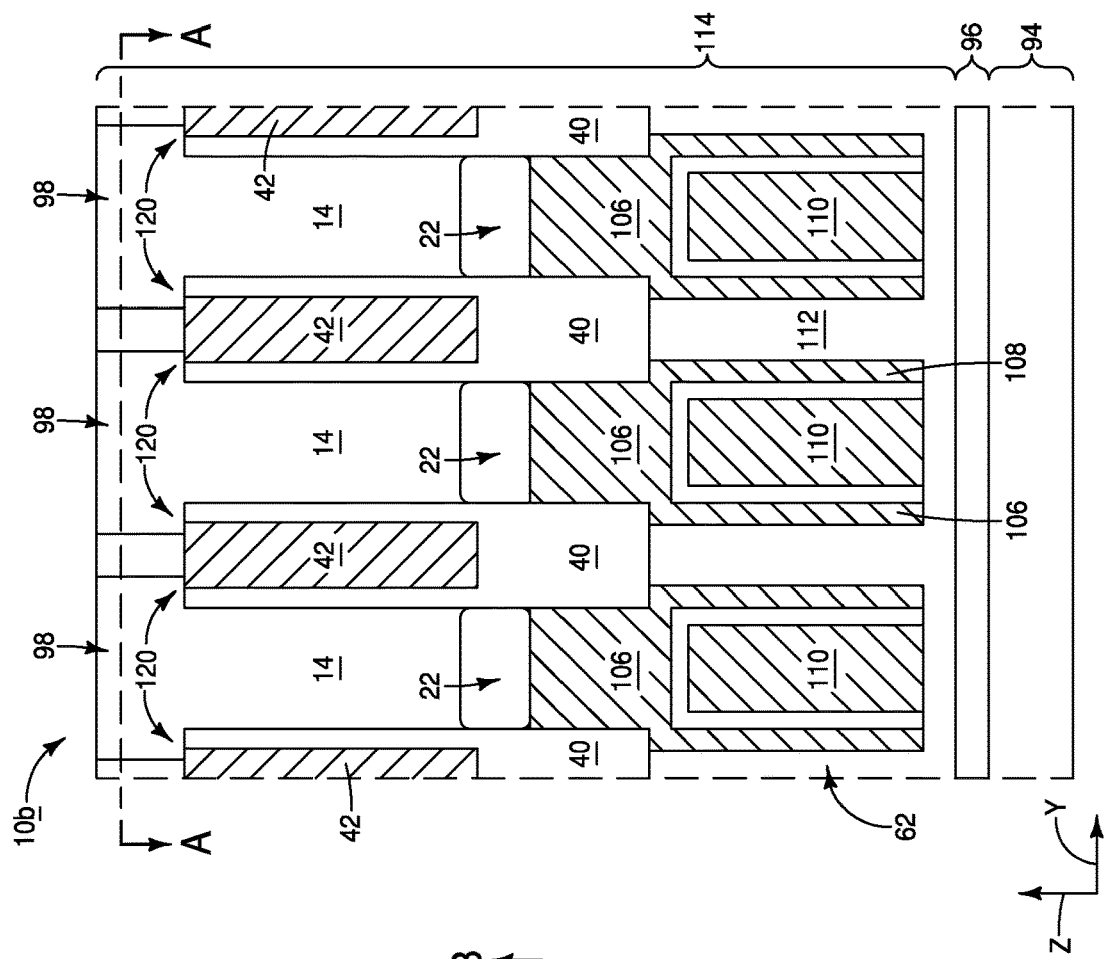
FIGS. 17A and 17B are a diagrammatic cross-sectional top-down view and a diagrammatic cross-sectional side view, respectively, of the example assembly of FIGS. 14A and 14B at an example process stage following that of FIGS. 16A and 16B. The view of FIG. 17A is along the line A-A of FIG. 17B, and the view of FIG. 17B is along the line B-B of FIG. 17A.
Figure 17A:
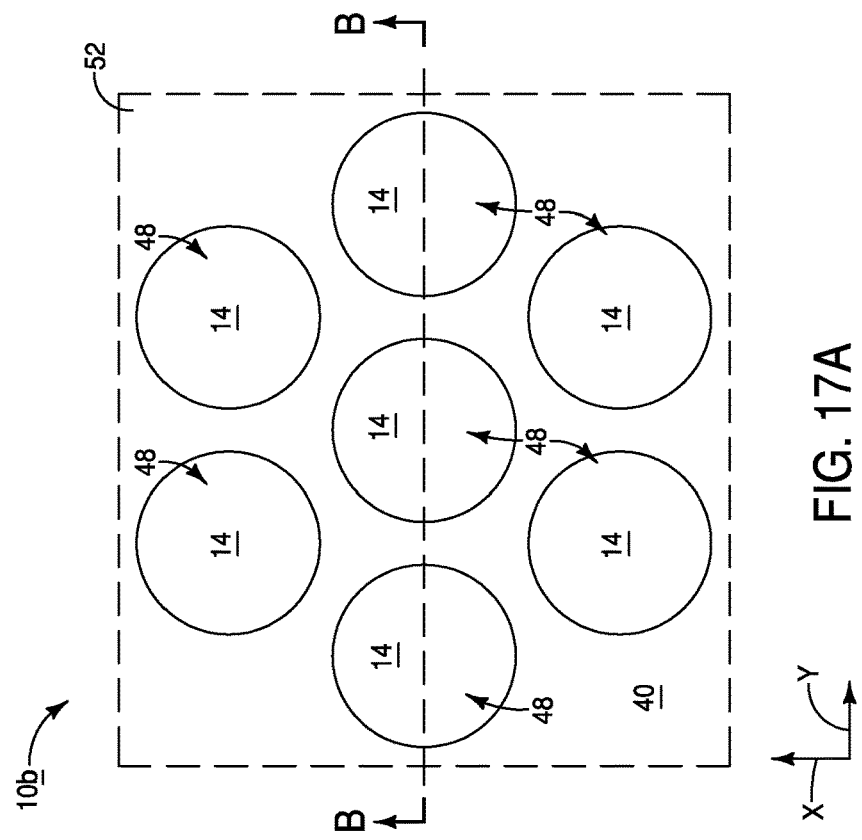

Referring to FIGS. 17A and 17B, processing analogous to that described above with reference to FIGS. 10A and 10B is conducted to bond the subassembly 114 to a handle structure 94 and invert the subassembly.

The mass 82 (FIG. 16B) of semiconductor material 14 is removed with appropriate processing (e.g., CMP), which exposes regions 98 of the semiconductor material 14 (in some embodiments, the regions 98 may be considered to correspond to bottom regions of the islands 80). The interface regions 120 where the conductive shield material 42 contacts the semiconductor material 14 remain after the removal of the mass 82.

Figure 18B:
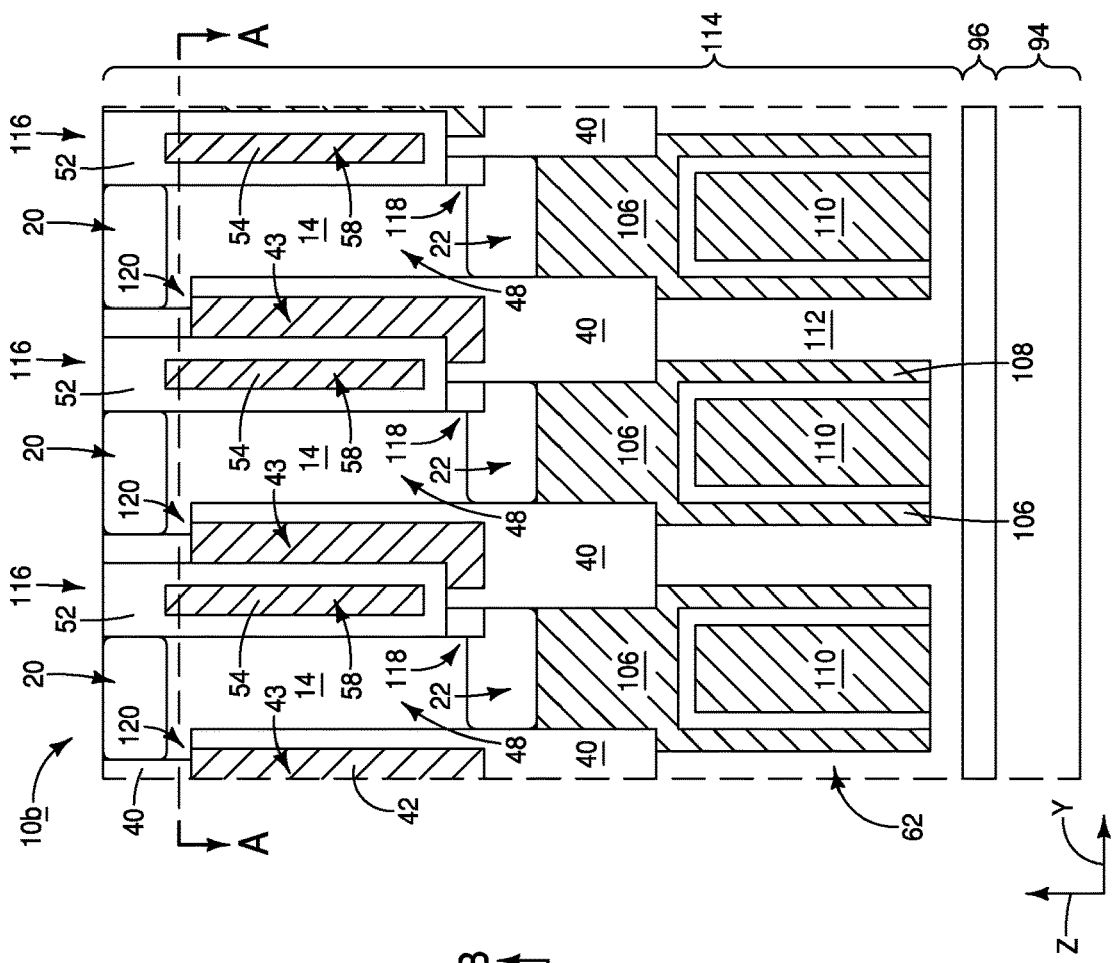
FIGS. 18A and 18B are a diagrammatic cross-sectional top-down view and a diagrammatic cross-sectional side view, respectively, of the example assembly of FIGS. 14A and 14B at an example process stage following that of FIGS. 17A and 17B. The view of FIG. 18A is along the line A-A of FIG. 18B, and the view of FIG. 18B is along the line B-B of FIG. 18A.
Figure 18A:
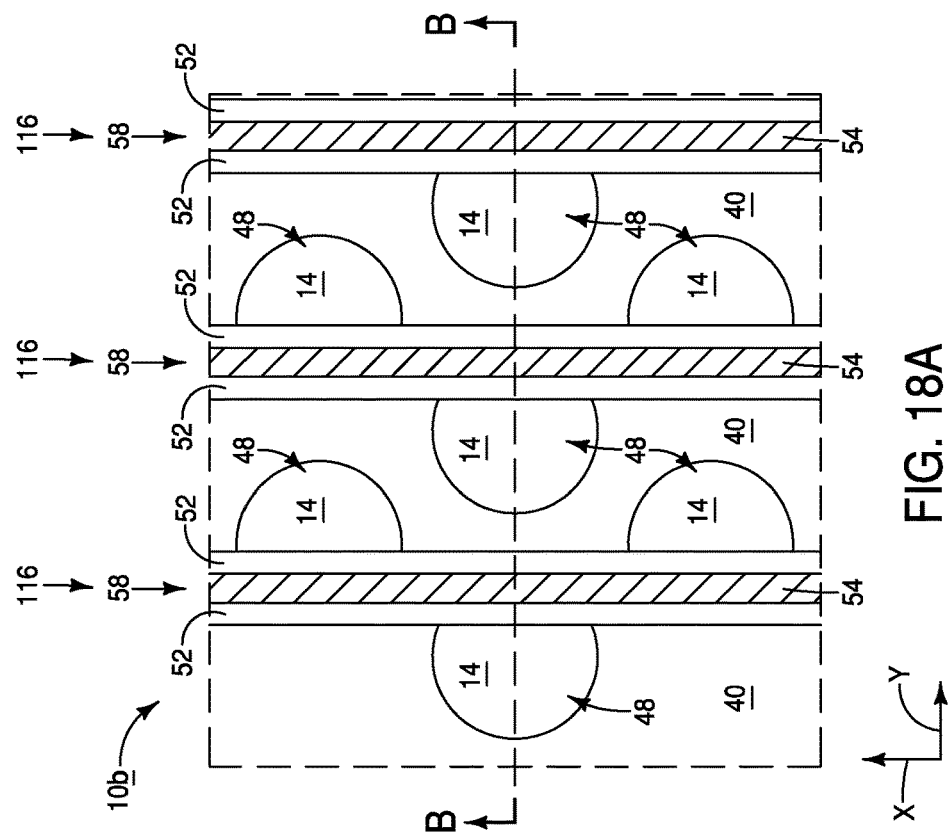

Referring to FIGS. 18A and 18B, the source/drain regions 20 are formed along upper portions of the semiconductor material 14. The source/drain regions 20 of FIGS. 18A and 18B may be formed with processing analogous to that described above with reference to FIGS. 10A and 10B.

The trenches 116 are formed to extend along the first direction of the x-axis. The trenches 116 pattern the pillars 48 from the semiconductor material 14. The trenches 116 may be formed with processing analogous to that described above with reference to FIGS. 10A and 10B.

The trenches 116 are lined with the gate dielectric material 52, and then the wordline material 54 is formed within such lined trenches and patterned into the wordlines 58. Subsequently, additional insulative material is formed over the wordlines. In the shown embodiment the additional insulative material is the same composition as material 52 (in other embodiments, the additional insulative material may have a different composition).

The conductive shield material 42 is patterned into shield plates 43. The illustrated shield plates 43 are angle plates, with bottom portions extending to under the wordlines 58.

The embodiment of FIGS. 18A and 18B shows the trenches 116 formed shallow enough that doped extensions 118 (of the type described above with reference to FIGS. 11A and 11B) are provided between bottoms of the trenches and the source/drain regions 22. In other embodiments, the trenches 116 may be etched deep enough so that the doped extension 118 may be omitted.

Figure 19B:
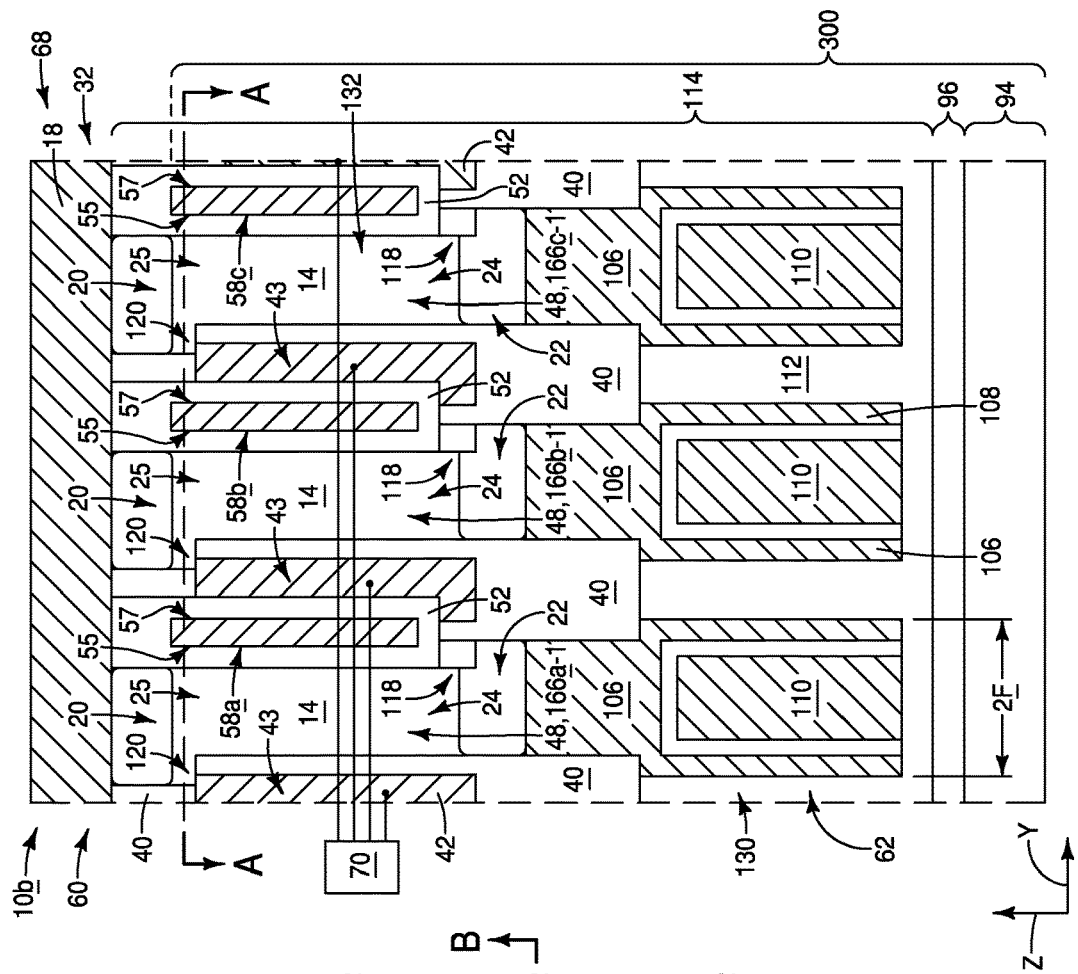
FIGS. 19A and 19B are a diagrammatic cross-sectional top-down view and a diagrammatic cross-sectional side view, respectively, of the example assembly of FIGS. 14A and 14B at an example process stage following that of FIGS. 18A and 18B. The view of FIG. 19A is along the line A-A of FIG. 19B, and the view of FIG. 19B is along the line B-B of FIG. 19A.
Figure 19A:
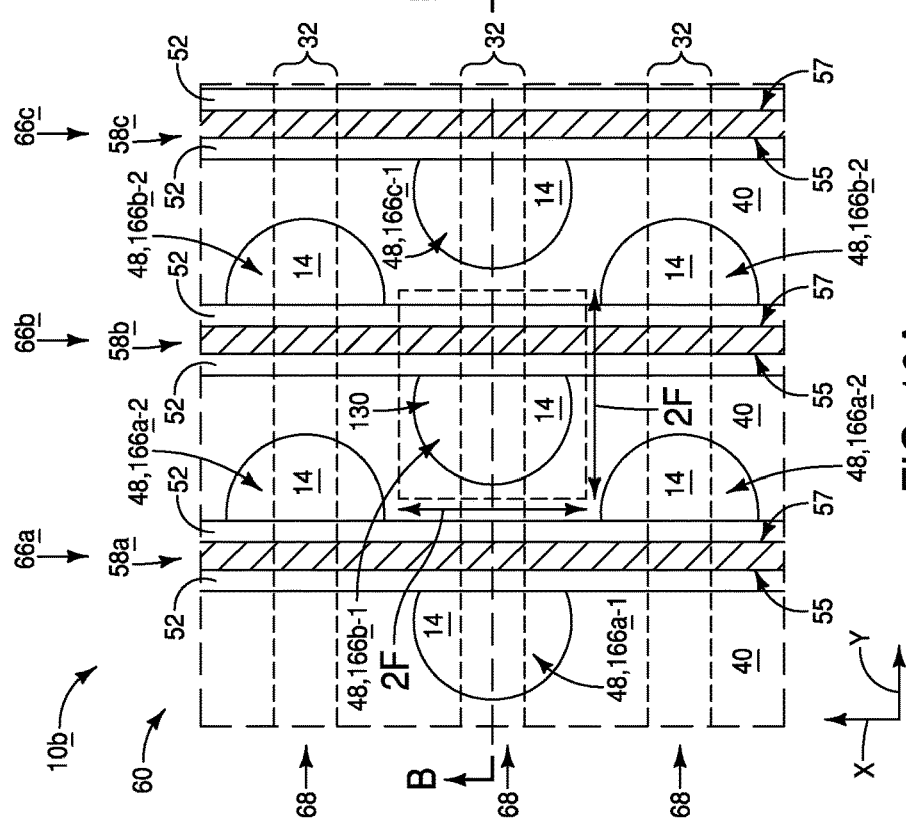

Referring to FIGS. 19A and 19B, bitlines 32 are formed over the subassembly 114, and are coupled with the source/drain regions 20.

The conductive shield plates 43 are electrically coupled with the reference structure 70.

The construction of FIGS. 19A and 19B may be considered to correspond to an assembly comprising a memory array 60. The memory array includes the bitlines 32 extending along the second direction of the y-axis, (i.e., extending along the columns 68 of the memory array 60), and includes the wordlines 58 extending along the first direction of the x-axis (i.e., extending along rows 66 of the memory array). The pillars 48 are arranged in the rows 66 and the columns 68 of the memory array 60. The pillars 48 along a given column 68 are those pillars coupled with a common bitline 32. The pillars 48 along a given row 66 are those pillars coupled with a common wordline. The wordlines 58 are labeled as 58a, 58b and 58c so that they may be distinguished from another. The rows 66 are labeled as 66a, 66b and 66c so that they may be distinguished from one another; with the row 66a comprising the pillars 48 associated with the wordline 58a, the row 66b comprising the pillars 48 associated with the wordline 58b, and the row 66c comprising the pillars associated with the wordline 58c. The individual pillars 48 are identified relative to a specific one of the rows 66a, 66b and 66c that the pillars are associated with. The pillars associated with the row 66a are labeled 166a, the pillars associated with row 66b are labeled 166b and the pillars associated with the row 66c are labeled 166c. Notably, each row comprises a first series (i.e., first set) of pillars on one side of a wordline, and a second series (i.e., second set) of pillars on an opposing side of the wordline. For instance, one of the pillars 166a is labeled 166a-1 to show that it is part of a first series on one side of the wordline 58a, and others of the pillars 166a are labeled 166a-2 to show that they are part of a second series on an opposing side of the wordline 58a. The pillars of the first set alternate with the pillars of the second set along the row 66a. Similarly, the pillars 166b comprise a first set 166b-1 and a second set 166b-2, and the pillars 166c comprise a first set 166c-1 and a second set 166c-2 (not shown).

The opposing sides of the wordline 58 are identified as first and second sides (lateral surfaces) 55 and 57 along the cross-sectional views of FIGS. 19A and 19B.

Each of the semiconductor pillars 48 comprises a channel region 25 vertically disposed between the first and second source/drain regions 20 and 22. The wordlines 58 are adjacent to such channel regions, and are spaced from the channel regions by intervening insulative regions comprising the gate dielectric material 52. The gate dielectric material is between the first lateral surface 55 and the channel regions of the semiconductor pillars 48 of the first set (e.g., the pillars 166a-1 along the wordline 58a), and the gate dielectric material is between the second lateral surface 57 and the semiconductor pillars 48 of the second set (e.g., the pillars labeled 166a-2 along the wordline 58a). The conductive shield material 42 is between the semiconductor pillars of the first and second sets.

The embodiment of FIG. 19B shows the interface regions 120 enabling the shield material 42 to directly contact the body regions 24 of access devices (transistors) comprising the semiconductor pillars 48. In some embodiments, the shield material 42 may comprise a suitable composition at a suitable reference voltage to enable the shield material to alleviate floating body effects (i.e., charge buildup) that may be associated with the body regions 24 during operation of access devices associated with the memory array 60. For instance, in some embodiments the shield material may comprise doped semiconductor material, with such doped semiconductor material having an opposite-type conductivity relative to the source/drain regions 20 and 22. For instance, if the source/drain regions 20 and 22 are n-type, the shield material may be p-type. The voltage source 70 may be configured to operate together with the shield plates 43 for alleviation of floating body effects within the body regions 24.

The cross-section of FIG. 19B may be considered to be a cross-section along a column direction (i.e., along the y-axis direction). Such cross-section passes through a series of the first semiconductor pillars (specifically, pillars identified as 166a-1, 166b-1 and 166c-1), and through a series of the conductive plates 43 of the shield material 42. The wordlines (58a, 58b and 58c) along the cross-section have their first lateral surfaces 55 along the channel regions 25 of the semiconductor pillars, and are spaced from such channel regions by the gate dielectric material 52; and have their second lateral surfaces 57 along the conductive plates 43, and are spaced from the conductive plates by the gate dielectric material 52.

The configuration of FIGS. 19A and 19B may be considered to comprise memory cells 130 comprising the capacitors 62 and the transistors 132. Such memory cells may have maximum dimensions along the x and y axes of 2F (where F is the minimum feature size), and thus the lateral peripheries of the memory cell may fit within an area of $4F^2$; as is diagrammatically illustrated in FIG. 19A where a box of dimension 2F×2F (i.e., area $4F^2$) contains the entire lateral periphery of a memory cell 130.

Figure 20A:
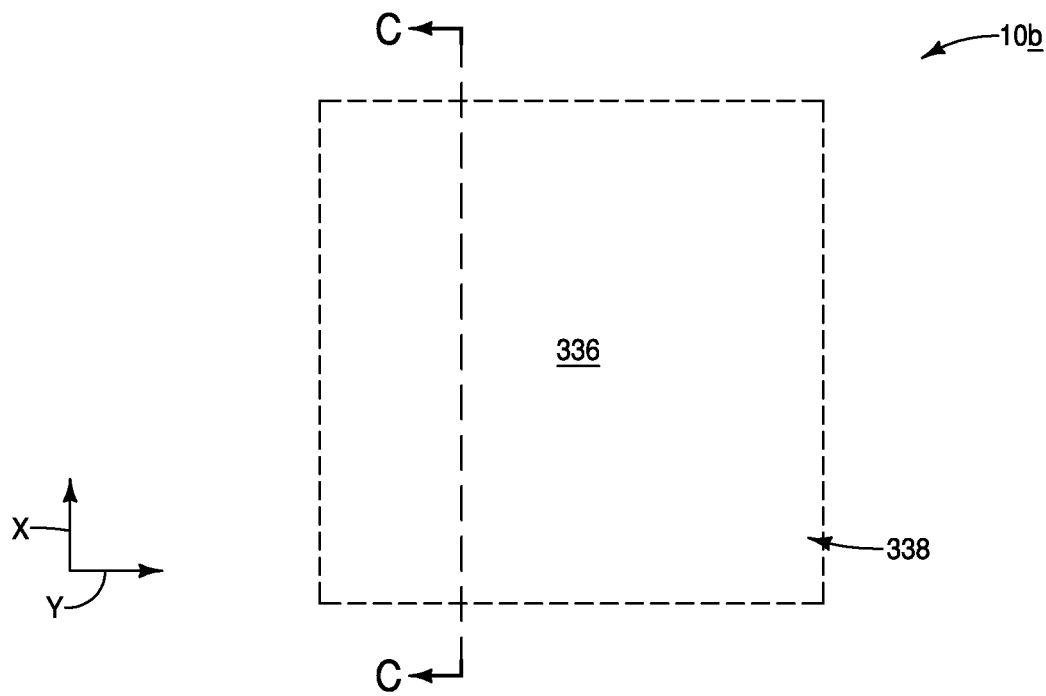
FIGS. 20A and 20C are a diagrammatic top view and a diagrammatic cross-sectional side view, respectively, of a region of the example assembly of FIGS. 14A and 14B at an example process stage following that of FIGS. 19A and 19B. The view of FIG. 20C is along the line C-C of FIG. 20A.
Figure 20C:
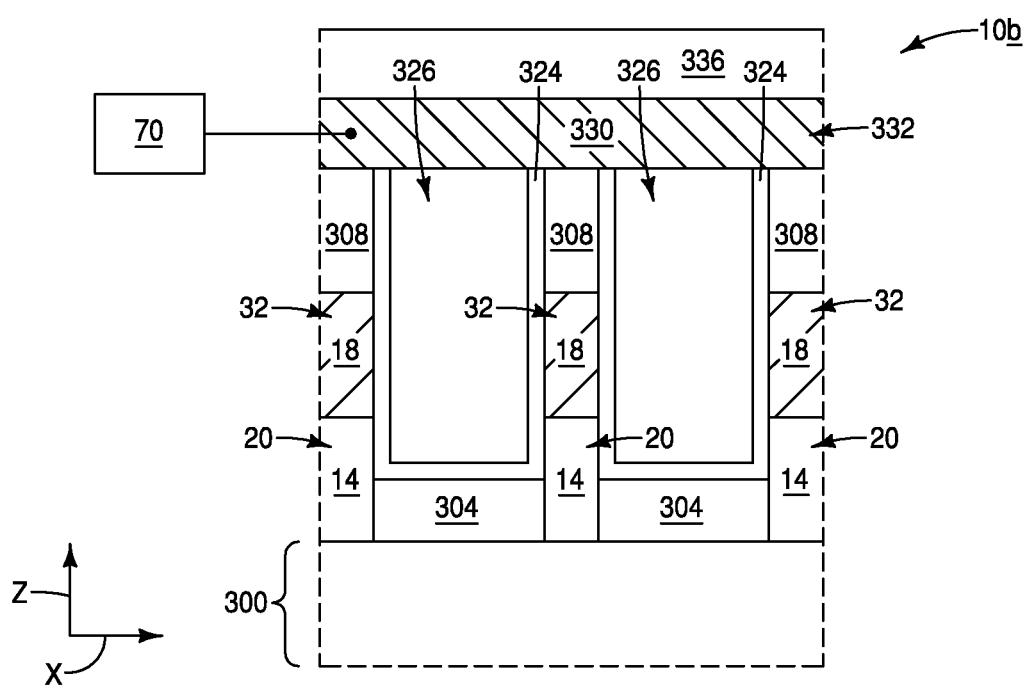

In some embodiments, the structure beneath the source/drain regions 20 of FIG. 19B may correspond to the structure 300 of FIGS. 1A and 1B. Referring to FIGS. 20A and 20C, the construction 10b is diagrammatically illustrated at a processing stage which may follow that process stage of FIGS. 19A and 19B; and specifically, after processing of the type described above with reference to FIGS. 1-6 is utilized to form voids 326 between adjacent bitlines 32, and to form the conductive plate 332 over the bitlines. The plate 332 may be electrically grounded to the same reference structure 70 as the shield lines of FIG. 19B (as shown), or may be electrically coupled with a different reference structure. The regions 304 of FIG. 20C may comprise the dielectric material 52 and portions of the wordlines 58, as can be understood with reference to FIG. 19B.

The embodiments of FIGS. 7-20 show the capacitors formed over a semiconductor substrate, followed by inverting of the substrate and bonding it to a handle, and then forming of the bitlines. In alternative processing, the bitlines may be formed over the semiconductor substrate, followed by inversion of the substrate and forming of the capacitors. Such alternative processing is described with reference to FIGS. 21-33; with FIGS. 21-27 describing a process similar to that of FIGS. 7-13 (i.e., a process which does not form body contacts to shield plates), and FIGS. 28-33 describing a process similar to that of FIGS. 14-20 (i.e., a process which does form body contacts to shield plates).

Referring to FIGS. 21A and 21B, a construction 10c comprises islands 80 of the semiconductor material 14 extending upwardly from the mass 82 of the semiconductor material. The islands are capped with the protective material 104.

Figure 22B:
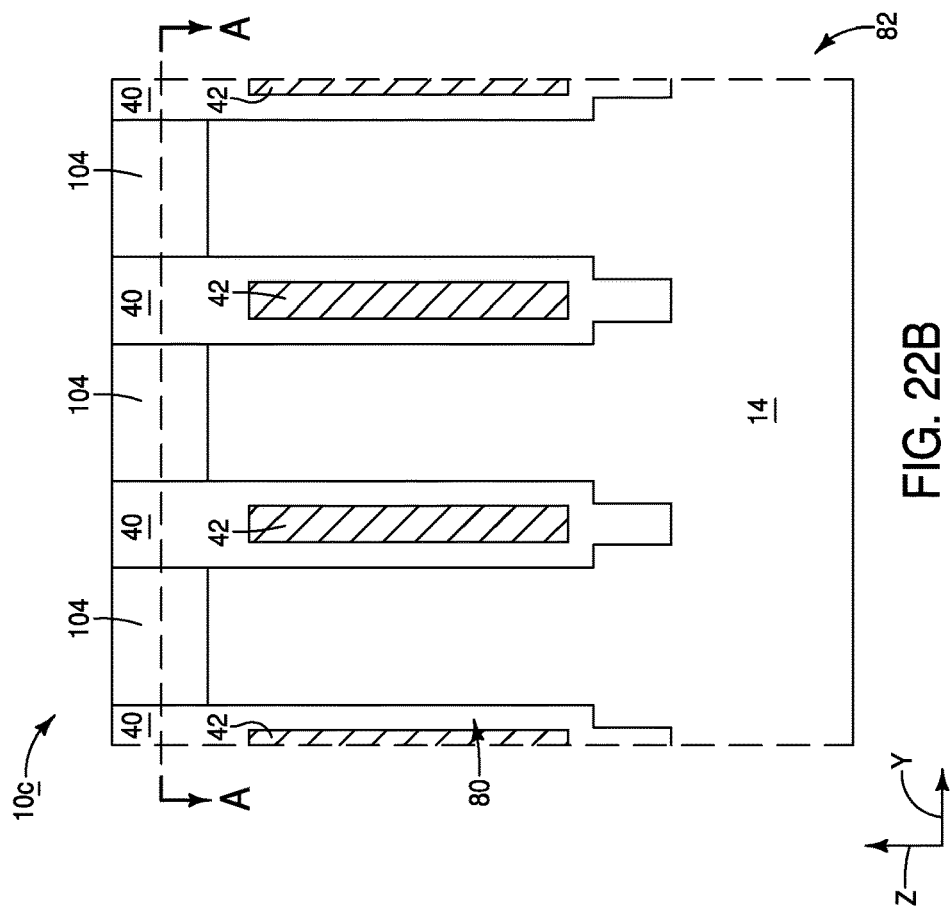
FIGS. 22A and 22B are a diagrammatic cross-sectional top-down view and a diagrammatic cross-sectional side view, respectively, of the example assembly of FIGS. 21A and 21B at an example process stage following that of FIGS. 21A and 21B. The view of FIG. 22A is along the line A-A of FIG. 22B, and the view of FIG. 22B is along the line B-B of FIG. 22A.
Figure 22A:
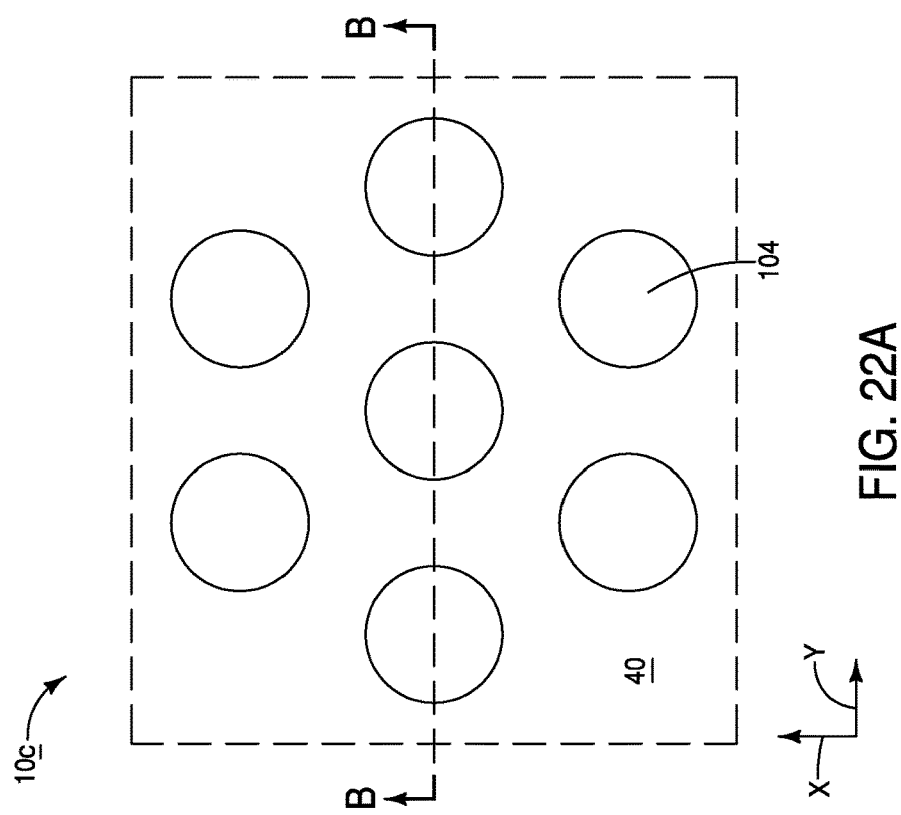

Referring to FIGS. 22A and 22B, regions between the islands 80 are lined with insulative material 40, then shield material 42 is deposited and recessed, and then additional insulative material 40 is provided over the shield material.

Figure 23B:
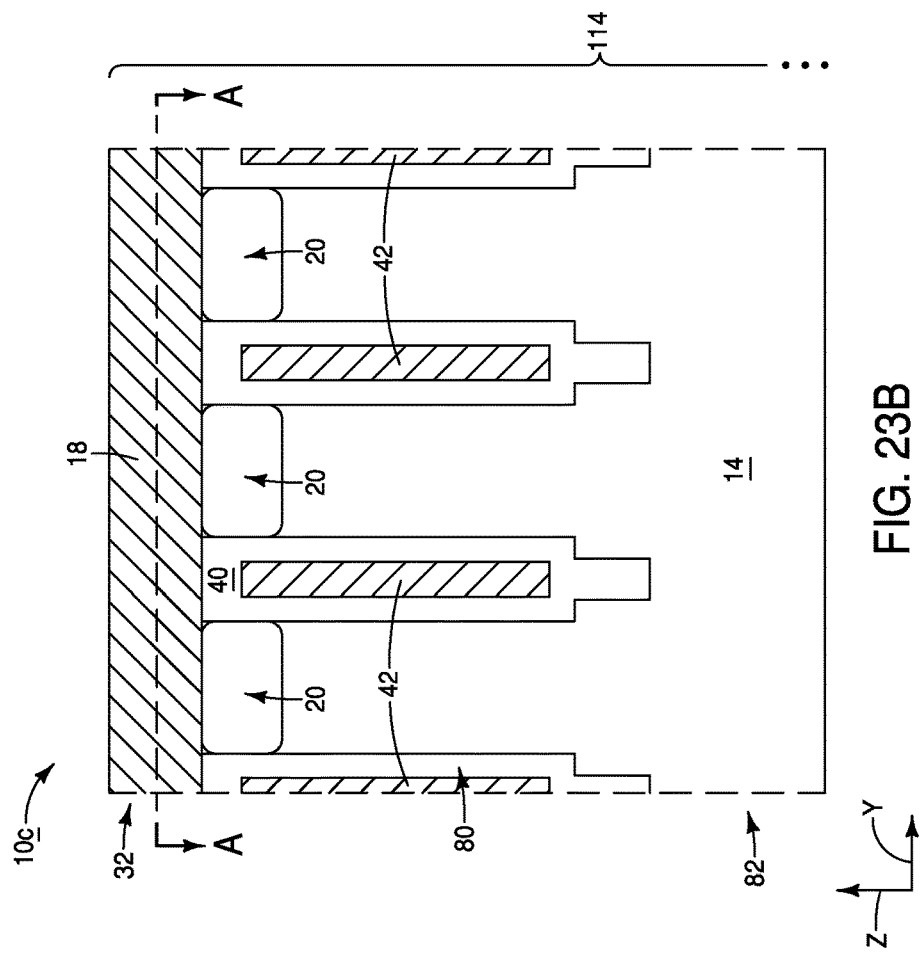
FIGS. 23A and 23B are a diagrammatic cross-sectional top-down view and a diagrammatic cross-sectional side view, respectively, of the example assembly of FIGS. 21A and 21B at an example process stage following that of FIGS. 22A and 22B. The view of FIG. 23A is along the line A-A of FIG. 23B, and the view of FIG. 23B is along the line B-B of FIG. 23A.
Figure 23A:
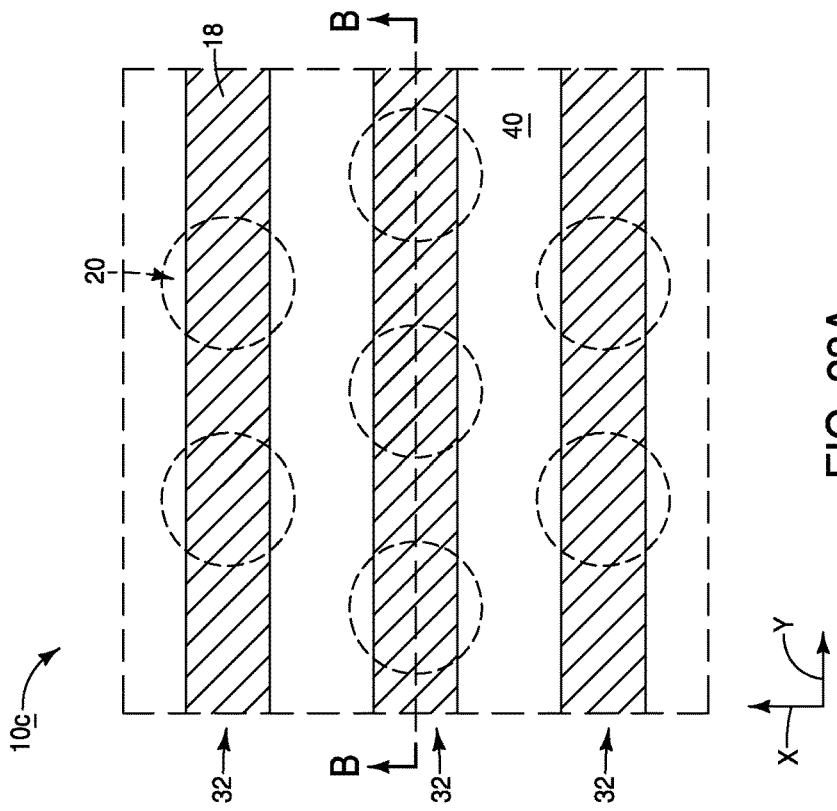

Referring to FIGS. 23A and 23B, the protective material 104 (FIGS. 22A and 22B) is removed, and the doped regions 20 are formed at tops of the semiconductor-material islands 80. Then, the bitlines 32 are formed over the doped regions 20. Portions of the doped regions 20 are shown in the view of FIG. 23A to assist the reader in visualizing the relationship of the bitlines to the regions 20, but are shown in dashed-line (phantom) view to indicate that they are out of the plane of the cross-section of FIG. 23A. The structures of FIGS. 23A and 23B form subassemblies 114 analogous to those described above. The regions under the bitlines 32 may be considered to include an underlying region 300 (not labeled in FIGS. 23A and 23B) analogous to the region 300 of FIGS. 1A and 1B.

Figure 24A:
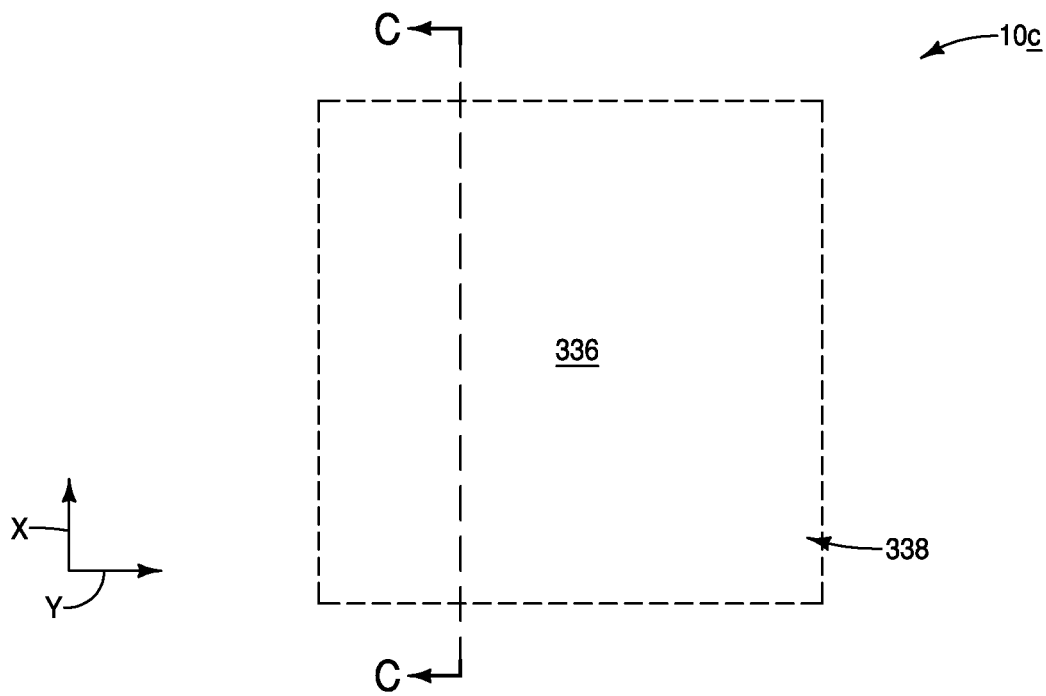
FIGS. 24A and 24C are a diagrammatic top view and a diagrammatic cross-sectional side view, respectively, of a region of the example assembly of FIGS. 21A and 21B at an example process stage following that of FIGS. 23A and 23B. The view of FIG. 24C is along the line C-C of FIG. 24A.
Figure 24C:
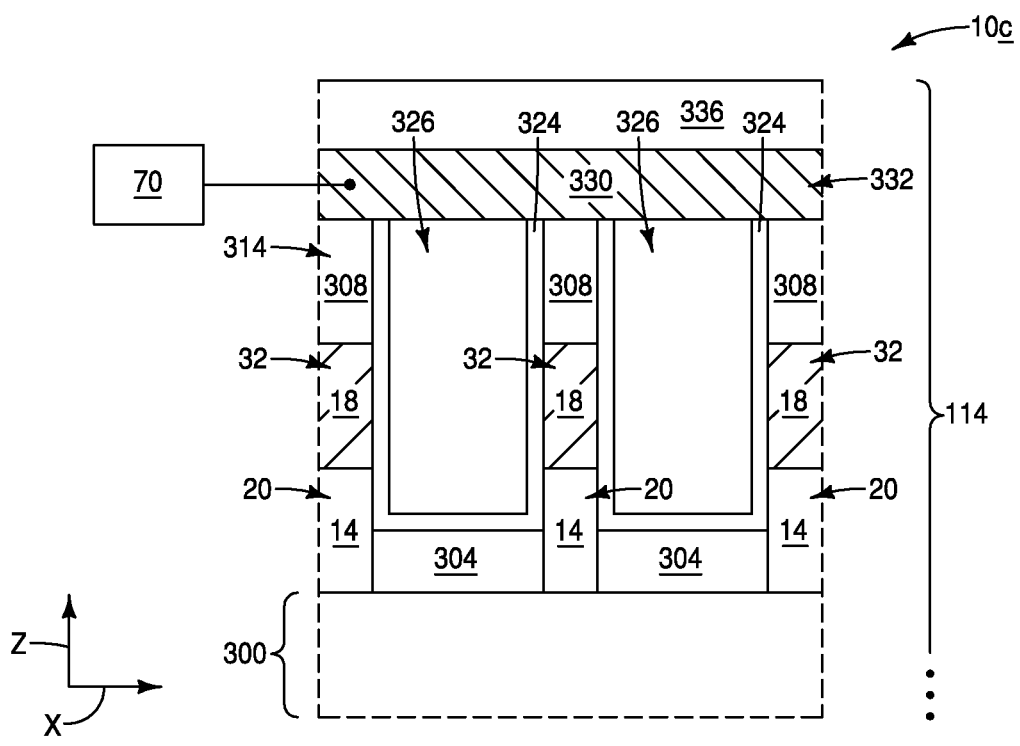

Referring to FIGS. 24A and 24C, processing of the type described above with reference to FIGS. 1-6 is utilized to form voids 326 between adjacent bitlines 32, and to form the conductive plate 332 over the bitlines. The plate 332 may be electrically grounded to the reference structure 70 (or to a different reference structure). The materials and structures of FIGS. 24A and 24C become part of the subassembly 114.

Referring to FIGS. 25A and 25B, the subassembly 114 is bonded to a handle structure 94 and inverted utilizing hybrid bonding analogous to that described above with reference to FIGS. 10A and 10B. In the shown embodiment, the insulative material 336 of the expanse 338 is bonded to the structure 94 through the bonding region 96.

The mass 82 (FIG. 23B) of semiconductor material 14 is removed with appropriate processing (e.g., CMP), which exposes regions 98 of the semiconductor material 14 (in some embodiments, the regions 98 may be considered to correspond to bottom regions of the islands 80).

Referring to FIGS. 26A and 26B, the source/drain regions 22 are formed along upper portions of the semiconductor material 14. The source/drain regions 22 may be formed with processing analogous to that described above with reference to FIGS. 10A and 10B.

The trenches 116 are formed to extend along the first direction of the x-axis. The trenches 116 pattern the semiconductor material 14 into the pillars 48. The trenches 116 may be formed with processing analogous to that described above with reference to FIGS. 10A and 10B.

The trenches 116 are lined with the gate dielectric material 52, and then the wordline material 54 is formed within such lined trenches and patterned into the wordlines 58. Subsequently, additional insulative material is formed over the wordlines. In the shown embodiment the additional insulative material is a same composition as material 52 (in other embodiments, the additional insulative material may have another composition).

The conductive shield material 42 is patterned into shield plates 43.

In the illustrated embodiment of FIGS. 26A and 26B, the doped extensions 118 are formed to extend from bottoms of the trenches 116 to the doped regions 20.

Referring to FIGS. 27A and 27B, capacitors 62 (shown as blocks) are electrically coupled with the source/drain regions 22. Insulative material 102 is provided between the capacitors 62. The shield plates 43 are coupled with the reference voltage 70.

The memory cells 130 of the embodiment of FIGS. 27A and 27B may be configured to have lateral peripheries contained within a $4F^2$ area, as shown relative to FIG. 33A.

The next embodiment is described with reference to FIGS. 28-33.

Figure 28B:
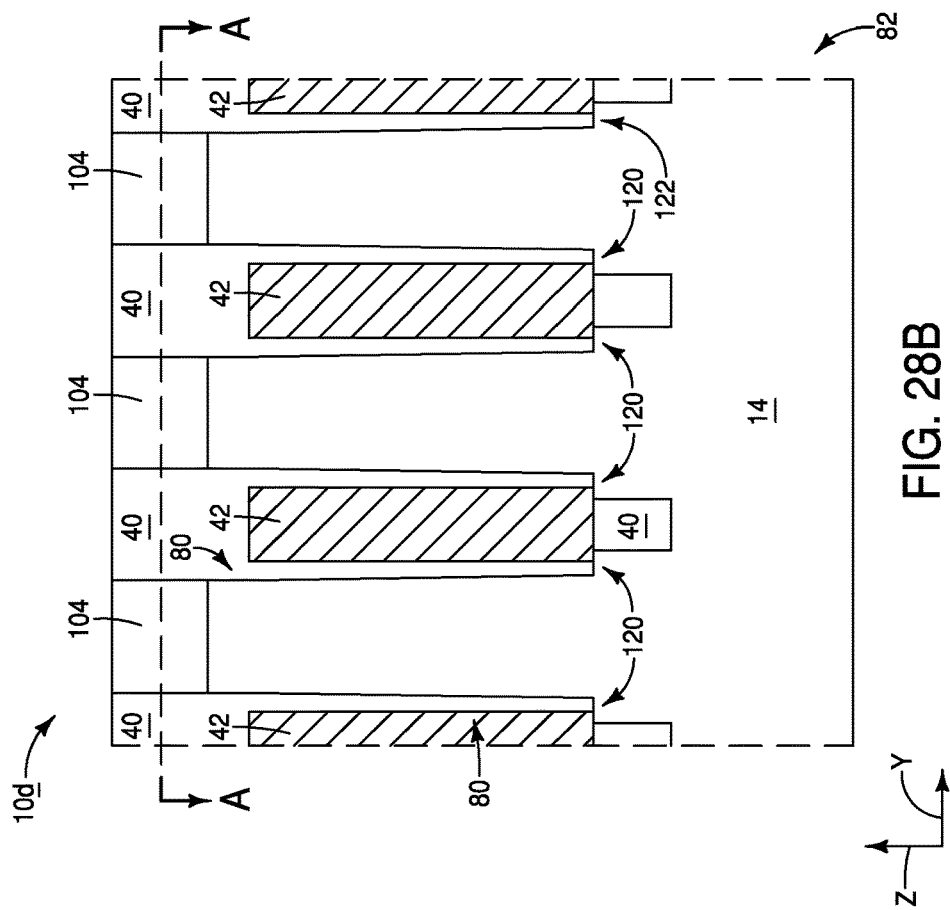
FIGS. 28A and 28B are a diagrammatic cross-sectional top-down view and a diagrammatic cross-sectional side view, respectively, of an example assembly at an example process stage of an example method for fabricating an example array of memory cells. The view of FIG. 28A is along the line A-A of FIG. 28B, and the view of FIG. 28B is along the line B-B of FIG. 28A.
Figure 28A:
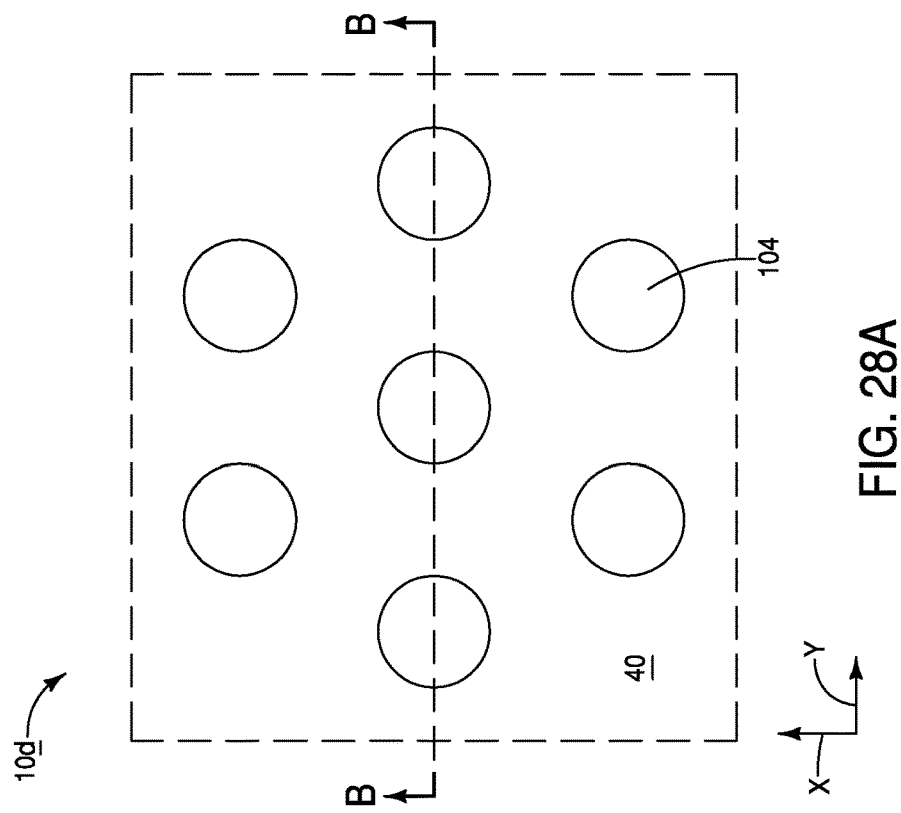

Referring to FIGS. 28A and 28B, a construction 10d is shown at a process stage that may follow that of FIGS. 21A and 21B. The configuration of FIGS. 28A and 28B differs from that of FIGS. 22A and 22B in that the shield material 42 punches through bottom regions of the insulative material 40 so that segments along an outer boundary of the shield material directly contact the semiconductor material 14 at interface regions 120.

Figure 29B:
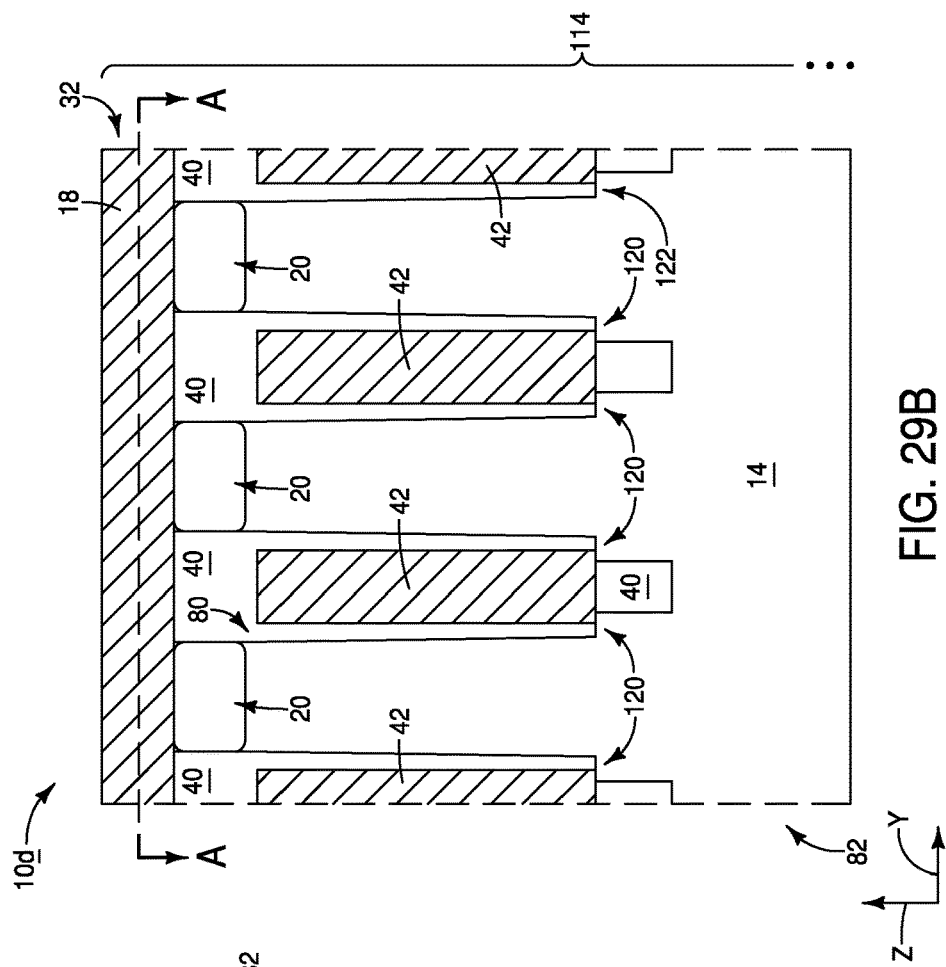
FIGS. 29A and 29B are a diagrammatic cross-sectional top-down view and a diagrammatic cross-sectional side view, respectively, of the example assembly of FIGS. 28A and 28B at an example process stage following that of FIGS. 28A and 28B. The view of FIG. 29A is along the line A-A of FIG. 29B, and the view of FIG. 29B is along the line B-B of FIG. 29A.
Figure 29A:
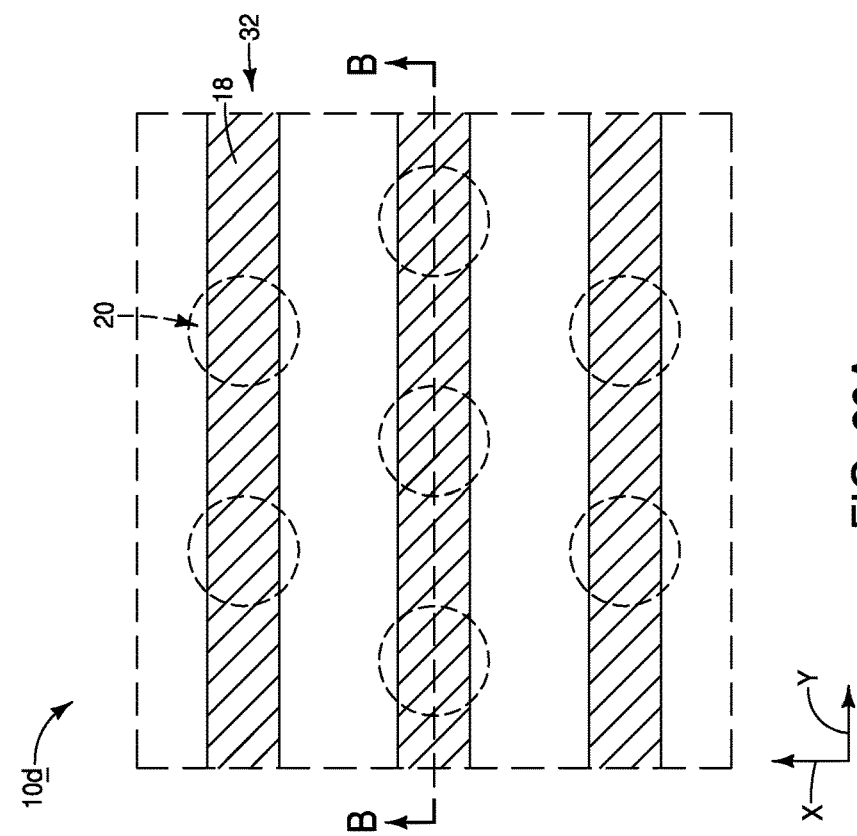

Referring to FIGS. 29A and 29B, the protective material 104 (FIGS. 28A and 28B) is removed, and the doped regions 20 are formed at tops of the semiconductor-material islands 80. Then, the bitlines 32 are formed over the doped regions 20. Portions of the doped regions 20 are shown in the view of FIG. 29A to assist the reader in visualizing the relationship of the bitlines to the regions 20, but are shown in dashed-line (phantom) view to indicate that they are out of the plane of the cross-section of FIG. 29A. The structures of FIGS. 29A and 29B form subassemblies 114 analogous to those described above. The regions under the bitlines 32 may be considered to include an underlying region 300 (not labeled in FIGS. 29A and 29B) analogous to the region 300 of FIGS. 1A and 1B.

Figure 30A:
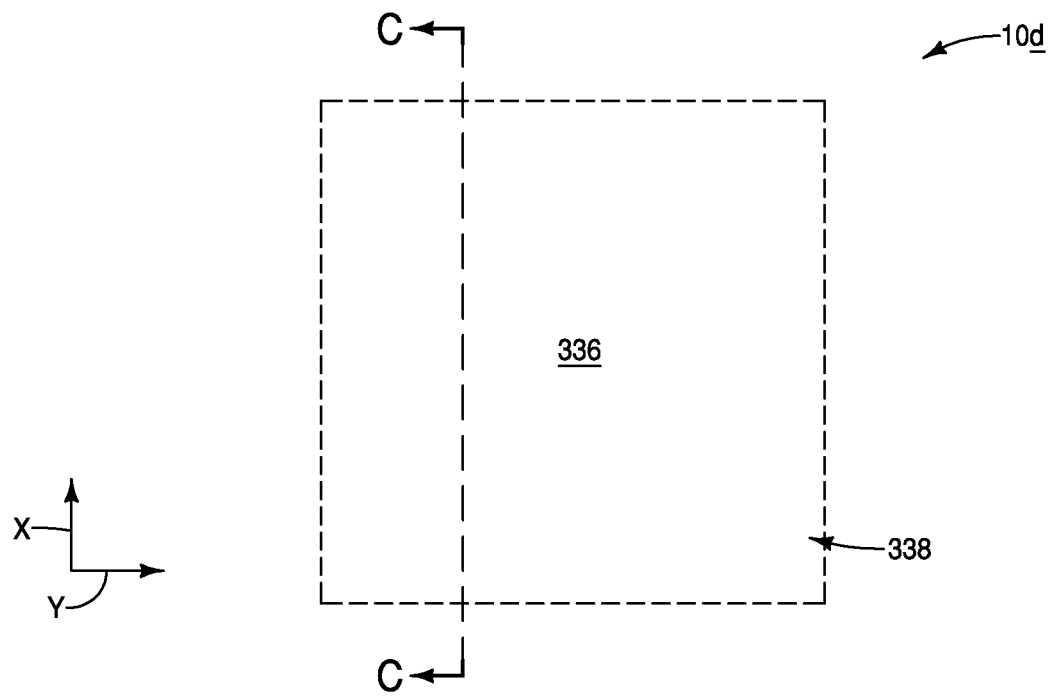
FIGS. 30A and 30C are a diagrammatic top view and a diagrammatic cross-sectional side view, respectively, of a region of the example assembly of FIGS. 28A and 28B at an example process stage following that of FIGS. 29A and 29B. The view of FIG. 30C is along the line C-C of FIG. 30A.
Figure 30C:
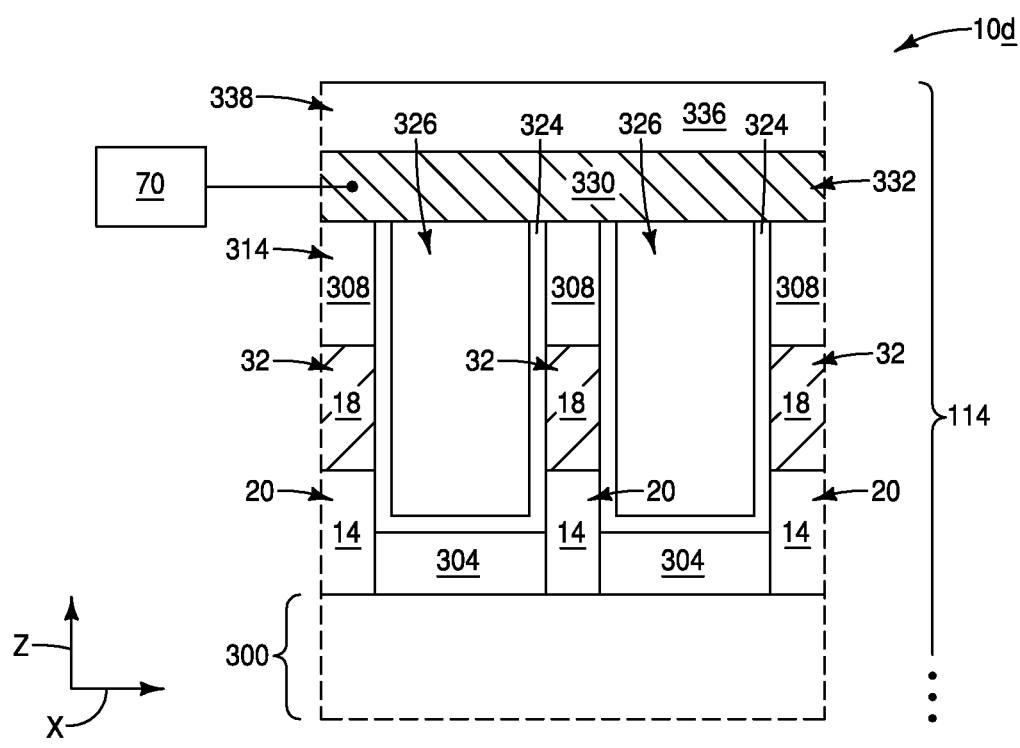

Referring to FIGS. 30A and 30C, processing of the type described above with reference to FIGS. 1-6 is utilized to form voids 326 between adjacent bitlines 32, and to form the conductive plate 332 over the bitlines. The plate 332 may be electrically grounded to the reference structure 70 (or to another suitable structure). The materials and structures of FIGS. 30A and 30C become part of the subassembly 114.

Referring to FIGS. 31A and 31B, the subassembly 114 is bonded to a handle structure 94 and inverted utilizing processing analogous to that described above with reference to FIGS. 10A and 10B.

The mass 82 (FIG. 29B) of semiconductor material 14 is removed with appropriate processing (e.g., CMP).

Figure 32B:
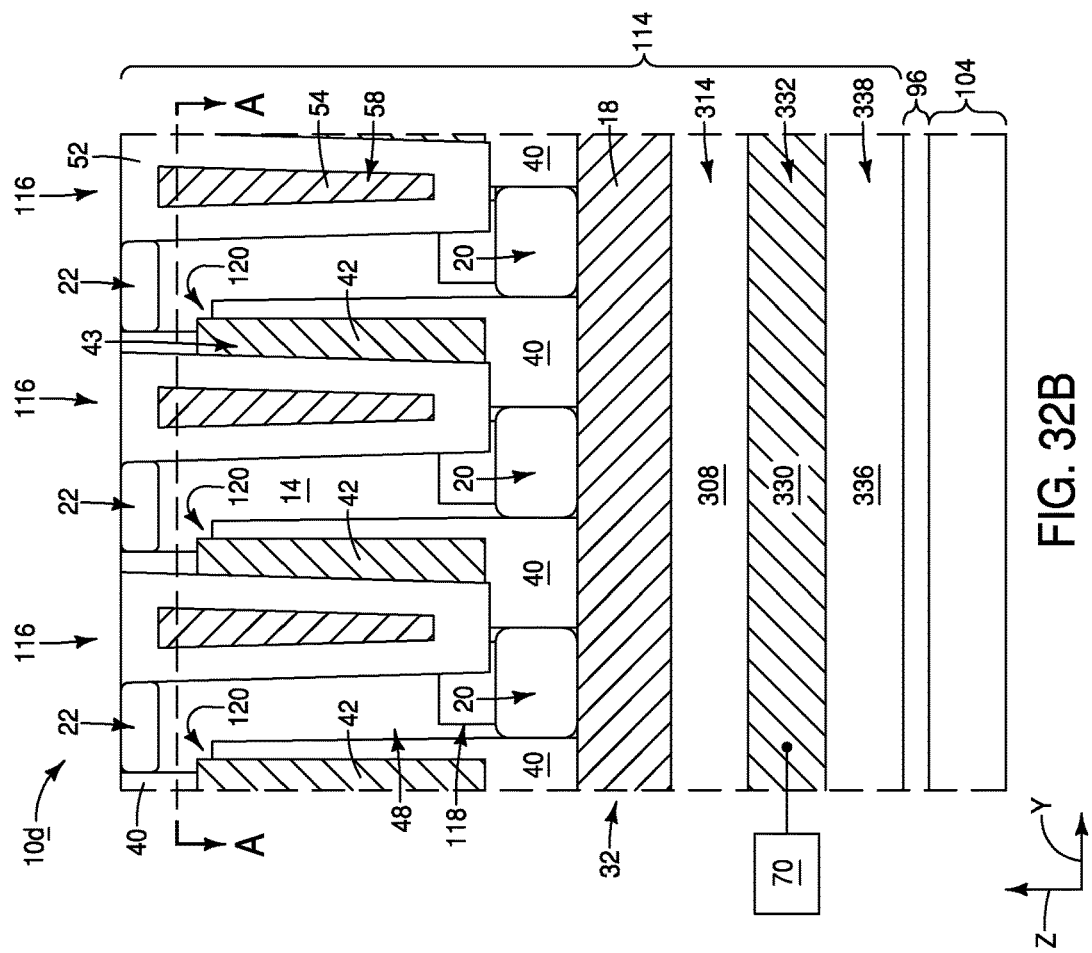
FIGS. 32A and 32B are a diagrammatic cross-sectional top-down view and a diagrammatic cross-sectional side view, respectively, of the example assembly of FIGS. 28A and 28B at an example process stage following that of FIGS. 31A and 31B. The view of FIG. 32A is along the line A-A of FIG. 32B, and the view of FIG. 32B is along the line B-B of FIG. 32A.
Figure 32A:
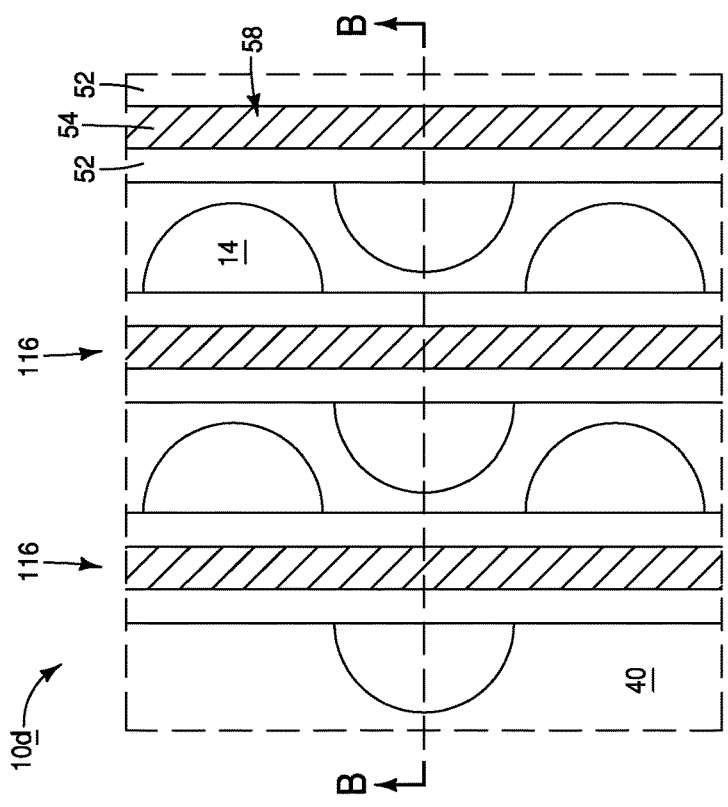

Referring to FIGS. 32A and 32B, the source/drain regions 22 are formed along upper portions of the semiconductor material 14.

The trenches 116 are formed to extend along the first direction of the x-axis. The trenches 116 pattern the semiconductor material 14 into the pillars 48.

The trenches 116 are lined with the gate dielectric material 52, and then the wordline material 54 is formed within such lined trenches and patterned into the wordlines 58. Subsequently, additional insulative material is formed over the wordlines. In the shown embodiment the additional insulative material is a same composition as material 52 (in other embodiments, the additional insulative material may have another composition).

The conductive shield material 42 is patterned into shield plates 43.

In the illustrated embodiment of FIGS. 32A and 32B, the doped extensions 118 are formed to extend from bottoms of the trenches 116 to the doped regions 20.

Referring to FIGS. 33A and 33B, capacitors 62 (shown as blocks) are electrically coupled with the source/drain regions 22. Insulative material 102 is provided between the capacitors 62. The shield plates 43 are coupled with the reference voltage 70.

The embodiment of FIG. 33B shows the interface regions 120 enabling the shield material 42 to directly contact the body regions 24 of access devices (transistors) in a manner analogous to that described above with reference to FIG. 19B.

The memory cells of the embodiment of FIGS. 33A and 33B may be configured to have lateral peripheries contained within a $4F^2$ area, as shown relative to FIG. 33A.

Another example embodiment for forming an example memory array is described with reference to FIGS. 34-39.

Referring to FIGS. 34A and 34B, a construction 10e comprises islands 80 of semiconductor material 14 extending upwardly from a mass 82 of the semiconductor material. The islands have doped regions 20. Such regions 20 are upper regions at the processing stage of FIG. 34B. In some embodiments, the doped regions 20 may be considered to correspond to first source/drain regions.

Insulative material 40 is formed to laterally surround the islands, and lines outer lateral surfaces 81 of the islands. The insulative material 40 may be referred to as a first insulative material to distinguish it from other insulative materials formed at subsequent process stages.

Conductive shield material 42 is formed between the lined islands.

Referring to FIGS. 35A and 35B, bitlines 32 are formed over the islands, and are electrically coupled with (i.e., electrically connected with) the doped regions 20. In some embodiments a planarized surface may extend across the doped regions 20 and the insulative material 40, and the bitlines may be formed along such planarized surface. The bitlines 32 comprise the bitline material 18 described above with reference to FIG. 1, and extend along the second direction of the y-axis.

The bitlines 32 are shown in dashed-line view in FIG. 35A to indicate that the bitlines are out of the plane relative to the cross-section of FIG. 35A.

In some embodiments the insulative material 40, the semiconductor material 14 and the conductive shield material 42 may be considered together to form a structure 84, and the bitlines 32 may be considered to be formed to extend across an upper surface of such structure. Notably, two bitlines extend across each of the islands, as shown relative to the top view of FIG. 35A. The bitlines 32 may be considered to form a pattern across the structure 84. The bitlines 32 are spaced from another by gaps 86. Such gaps are extended into the structure 84.

Referring to FIGS. 36A and 36C, processing of the type described above with reference to FIGS. 1-6 is utilized to form voids 326 between adjacent bitlines 32, and to form the conductive plate 332 over the bitlines. The materials and structures of FIGS. 36A and 36C become part of the subassembly 114.

Referring to FIGS. 37A and 37B, the subassembly 114 is bonded to a handle structure 94 through a bonding region 96, and is then inverted.

The mass 82 (FIG. 35B) of semiconductor material 14 is removed with appropriate processing (e.g., CMP), which exposes bottom regions 98 of the islands 80. The source/drain regions 22 are formed along the exposed bottom regions 98 of the islands 80, and in some embodiments may be formed by implanting appropriate dopant into the bottom regions of the islands.

Referring to FIGS. 38A and 38B, additional insulative material 40 is formed, and then trenches 100 are formed to extend into the bottoms of the islands 80. The trenches 100 subdivide the islands into the pillars 48. The trenches 100 may be referred to as second trenches. The second trenches 100 extend along the first direction of the x-axis.

The second trenches are lined with the gate dielectric material 52, and then the wordline material 54 is formed within such lined trenches and patterned into the wordlines 58. Subsequently, the insulative material 56 is formed over the wordlines.

Referring to FIGS. 39A and 39B, the capacitors 62 (shown as blocks) are electrically coupled with the source/drain regions 22. Insulative material 102 is provided between the capacitors 62. The cross-hatching of conductive material 56 is not shown in FIG. 39A in order to simplify the drawing.

The conductive shield material is patterned into shield plates 43, and such are electrically coupled with the reference structure 70.

The construction 10e of FIGS. 39A and 39B may be considered to correspond to an assembly comprising a memory array 60. The memory array 60 includes the bitlines 32 extending along the second direction of the y-axis, (i.e., extending along the columns 68 of the memory array 60), and includes the wordlines 58 extending along the first direction of the x-axis (i.e., extending along rows 66 of the memory array). The pillars 48 are arranged in the rows 66 and the columns 68 of the memory array 60. The pillars 48 along a given column 68 are those pillars coupled with a common bitline 32. The pillars 48 along a given row 66 are those pillars coupled with a common wordline. The wordlines 58 are labeled as 58a, 58b and 58c so that they may be distinguished from another. The rows 66 are labeled as 66a, 66b and 66c so that they may be distinguished from one another; with the row 66a comprising the pillars 48 associated with the wordline 58a, the row 66b comprising the pillars 48 associated with the wordline 58b, and the row 66c comprising the pillars associated with the wordline 58c. The individual pillars 48 are identified relative to a specific one of the rows 66a, 66b and 66c that the pillars are associated with. The pillars associated with the row 66a are labeled 166a, the pillars associated with row 66b are labeled 166b and the pillars associated with the row 66c are labeled 166c. Notably, each row comprises a first series (i.e., first set) of pillars on one side of a wordline, and a second series (i.e., second set) of pillars on an opposing side of the wordline. For instance, a pair of the pillars 166a are labeled 166a-1 to show that they are part of a first series on one side of the wordline 58a, and another pair of the pillars 166a is labeled 166a-2 to show that they are part of a second series on an opposing side of the wordline 58a. The pillars of the first set alternate with the pillars of the second set along the row 66a. Similarly, the pillars 166b comprise a first set 166b-1 and a second set 166b-2, and the pillars 166c comprise a first set 166c-1 and a second set 166c-2.

The opposing sides of the wordline 58 are identified as first and second sides (lateral surfaces) 55 and 57 along the cross-sectional views of FIGS. 39A and 39B.

Each of the semiconductor pillars 48 comprises a channel region 25 vertically disposed between the first and second source/drain regions 20 and 22. The wordlines 58 are adjacent to such channel regions, and are spaced from the channel regions by intervening insulative regions comprising the gate dielectric material 52. The gate dielectric material is between the first lateral surface 55 and the channel regions of the semiconductor pillars 48 of the first set (e.g., the pillars 166a-1 along the wordline 58a), and the gate dielectric material is between the second lateral surface 57 and the semiconductor pillars 48 of the second set (e.g., the pillars 166a-2 along the wordline 58a). The conductive shield material 42 is between the semiconductor pillars of the first and second sets.

The cross-section of FIG. 39B may be considered to be a cross-section along a column direction (i.e., along the y-axis direction). Such cross-section passes through a series of the first semiconductor pillars (specifically, pillars identified as 166a-1, 166b-1 and 166c-1), and through a series of the conductive plates 43 of the shield material 42. The wordlines (58a, 58b and 58c) along the cross-section have their first lateral surfaces 55 along the channel regions 25 of the semiconductor pillars, and are spaced from such channel regions by the gate dielectric material 52; and have their second lateral surfaces 57 along the conductive plates 43, and spaced from the conductive plates by the gate dielectric material 52. The illustrated shield plates 43 are angle plates along the cross-section, with bottom regions of the angle plates extending partially across the bottoms of the wordlines 58a-c.

The memory array 60 of FIGS. 39A and 39B comprises memory cells 130. In some embodiments, individual memory cells may be configured to have lateral peripheries contained within a 4F$^2$ area, as shown relative to FIG. 39A The memory arrays 60 described herein may be DRAM arrays, and may comprise memory cells having one transistor in combination with one capacitor (1T-1C memory cells). FIG. 40 schematically illustrates a portion of an example DRAM array 60. The bitlines (digit lines) 32 are shown to correspond to bitlines BL1, BL2, BL3 and BL4; and the wordlines 58 are shown to correspond to wordlines WL1, WL2, WL3 and WL4. Memory cells 130 extend across the array, with each of the memory cells including a capacitor 62 and a transistor (access device) 132. The access devices may comprise active regions within the pillars 48 described with reference to various embodiments herein; with such active regions including the pair of source/drain regions 20 and 22, and the channel region 25 between the source/drain regions. Each of the memory cells 130 within the memory array 60 of FIG. 40 is uniquely addressed through a combination of one of the wordlines and one of the bitlines. The memory array may include any suitable number of memory cells; and in some embodiments may comprise hundreds, millions, tens of millions, etc., of memory cells.

In some embodiments, a memory array 60 of any of the types described herein may be within a memory tier (i.e., memory deck) which is within a vertically-stacked arrangement of tiers (or decks). For instance, FIG. 41 shows a portion of an integrated assembly 140 comprising a vertically-stacked arrangement of tiers (labeled as tiers 1-4). The vertically-stacked arrangement may extend upwardly to include additional tiers. The tiers 1-4 may be considered to be examples of levels that are stacked one atop the other. The levels may be within different semiconductor dies, or at least two of the levels may be within the same semiconductor die.

The bottom tier (tier 1) may include control circuitry and/or sensing circuitry (e.g., may include wordline drivers, sense amplifiers, etc.); and in some applications may comprise CMOS circuitry (diagrammatically illustrated as CMOS circuitry 142). One or more of the upper tiers (tiers 2-4) may include a memory array, such as, for example, a memory array 60 of any of the types described herein. If multiple tiers comprise memory arrays, the memory arrays within the various tiers may be the same as one another (e.g., may all be DRAM arrays), or may be different relative to one another (e.g., some may be DRAM arrays, while others are NAND arrays). FIG. 41 diagrammatically indicates that a memory array 60 is within the second tier (tier 2), and shows an electrical connection 143 between the CMOS circuitry 142 of tier 1 and components of the memory array 60 of tier 2. In some embodiments, the CMOS circuitry 142 may be electrically coupled with wordlines and/or bitlines of the memory 60; and may comprise, for example, wordline drivers, sense amplifiers, etc.

The assemblies and structures discussed above may be utilized within integrated circuits (with the term "integrated circuit" meaning an electronic circuit supported by a semiconductor substrate); and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

The terms "dielectric" and "insulative" may be utilized to describe materials having insulative electrical properties. The terms are considered synonymous in this disclosure. The utilization of the term "dielectric" in some instances, and the term "insulative" (or "electrically insulative") in other instances, may be to provide language variation within this disclosure to simplify antecedent basis within the claims that follow, and is not utilized to indicate any significant chemical or electrical differences.

The particular orientation of the various embodiments in the drawings is for illustrative purposes only, and the embodiments may be rotated relative to the shown orientations in some applications. The descriptions provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections, unless indicated otherwise, in order to simplify the drawings.

When a structure is referred to above as being "on", "adjacent" or "against" another structure, it can be directly on the other structure or intervening structures may also be present. In contrast, when a structure is referred to as being "directly on", "directly adjacent" or "directly against" another structure, there are no intervening structures present. The terms "directly under", "directly over", etc., do not indicate direct physical contact (unless expressly stated otherwise), but instead indicate upright alignment.

Structures (e.g., layers, materials, etc.) may be referred to as "extending vertically" to indicate that the structures generally extend upwardly from an underlying base (e.g., substrate). The vertically-extending structures may extend substantially orthogonally relative to an upper surface of the base, or not.

Some embodiments include a memory device having a buried wordline, a shield plate, and an access device. The access device includes first and second diffusion regions and a channel region. The diffusion regions and the channel region are arranged vertically so that the channel region is between the first and second diffusion regions. The access device is adjacent to the wordline and the shield plate so that a part of the wordline is proximate a first side surface of the channel region with an intervention of a first insulating material therebetween, and a part of the shield plate is proximate a second side surface of the channel region with an intervention of a second insulating material therebetween.

Some embodiments include a memory array having bitlines spaced from one another by intervening voids. Wordlines are vertically offset from the bitlines and cross the bitlines. Memory cells are proximate locations where the wordlines cross the bitlines. Each of the memory cells is uniquely addressed by the combination of a wordline and a bitline. Lateral peripheries of each of the memory cells fit within an area of 4F$^2$.

Some embodiments include an integrated assembly having bitlines spaced from one another by intervening voids. Insulative supports are over the bitlines. A conductive plate is supported by the insulative supports and is proximate the bitlines to drain excess charge from the bitlines.

Some embodiments include an integrated assembly having a row of vertically-extending semiconductor pillars. Each of the semiconductor pillars comprises a transistor channel region vertically disposed between a first source/drain region and a second source/drain region. A wordline extends along the row of vertically-extending semiconductor pillars, and is adjacent to the transistor channel regions of the semiconductor pillars. The wordline has a first lateral surface and an opposing second lateral surface. The semiconductor pillars are subdivided amongst a first set along the first lateral surface, and a second set along the second lateral surface. The semiconductor pillars of the first set alternate with the semiconductor pillars of the second set along the row. A gate dielectric material is between the first lateral surface and the transistor channel regions of the semiconductor pillars of the first set, and between the second lateral surface and the transistor channel regions of the semiconductor pillars of the second set. A conductive shield material is between the semiconductor pillars of the first set, and between the semiconductor pillars of the second set. Bitlines are coupled with the first source/drain regions. The bitlines are spaced from one another by voids and are operatively proximate a conductive plate configured to drain excess charge from the bitlines. Storage elements are coupled with the second source/drain regions.

Some embodiments include a method of forming bitlines. Bitline material is formed over an underlying structure. The bitline material is patterned into bitlines. The bitlines extend along a first direction. The bitlines are spaced from one another along a second direction, orthogonal to the first direction, by voids. A capping material is formed over the voids. Wordlines are formed to be vertically offset from the bitlines and to cross the bitlines. Memory cells are formed proximate locations where the wordlines cross the bitlines. Each of the memory cells is uniquely addressed by the combination of a wordline and a bitline. Lateral peripheries of each of the memory cells fit within an area of 4F$^2$.

Some embodiments include a method of forming an integrated assembly. A stack is formed to have insulative material over bitline material. The stack is patterned into rails that extend along a first direction. The rails include the patterned bitline material as bitlines, and include the patterned insulative material as insulative supports over the bitlines. The rails are spaced from one another along a second direction, orthogonal to the first direction, by intervening voids. Sacrificial material is formed within the intervening voids. A conductive plate is formed over the insulative supports and the sacrificial material. The sacrificial material is removed from under the conductive plate to re-form the voids.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. An integrated assembly, comprising:
a row of vertically-extending semiconductor pillars; each of the semiconductor pillars comprising a transistor channel region vertically disposed between a first source/drain region and a second source/drain region;
a wordline extending along the row of vertically-extending semiconductor pillars, and being adjacent to the transistor channel regions of the semiconductor pillars; the wordline having a first lateral surface and an opposing second lateral surface; the semiconductor pillars being subdivided amongst a first set along the first lateral surface, and a second set along the second lateral surface; the semiconductor pillars of the first set alternating with the semiconductor pillars of the second set along the row;

a gate dielectric material between the first lateral surface and the transistor channel regions of the semiconductor pillars of the first set, and between the second lateral surface and the transistor channel regions of the semiconductor pillars of the second set;

a conductive shield material between the semiconductor pillars of the first set, and between the semiconductor pillars of the second set;

bitlines coupled with the first source/drain regions, the bitlines being spaced from one another by voids and being operatively proximate a conductive plate configured to drain excess charge from the bitlines; and storage elements coupled with the second source/drain regions.

2. The integrated assembly of claim 1 wherein the conductive shield material comprises metal.

3. The integrated assembly of claim 1 wherein the conductive shield material comprises conductively-doped semiconductor material.

4. The integrated assembly of claim 1 wherein the conductive shield material comprises conductively-doped silicon.

5. The integrated assembly of claim 1 wherein the conductive shield material and the conductive plate are coupled with a reference source having ground voltage.

6. The integrated assembly of claim 1 wherein the transistor channel regions are within body regions of the semiconductor pillars, and wherein the conductive shield material directly contacts the body regions.

7. The integrated assembly of claim 1 wherein the conductive shield material comprises one or more of the following various metals: titanium, tungsten, cobalt, nickel, platinum and ruthenium.

8. The integrated assembly of claim 1 wherein the conductive shield material comprises one or more of the following various metal-containing compositions: metal silicide, metal nitride and metal carbide.

9. The integrated assembly of claim 1 wherein the conductive shield material comprises one or more of the following various conductively-doped semiconductor materials: conductively-doped silicon, conductively-doped germanium and conductively-doped polycrystalline silicon.

10. The integrated assembly of claim 1 wherein the wordlines vertically offset from the bitlines and crossing the bitlines; and further comprising
memory cells proximate locations where the wordlines cross the bitlines; each of the memory cells being uniquely addressed by the combination of a wordline and a bitline; lateral peripheries of each of the memory cells fitting within an area of $4F^2$.

11. The memory array of claim 10 wherein the bitlines extend along a first direction and have a first width along a cross-section orthogonal to the first direction; and wherein the voids have a second width along the cross-section, with the second width being at least as large as the first width.

12. The memory array of claim 11 wherein the second width is greater than the first width.

13. The memory array of claim 12 wherein the second width is at least about double the first width.

14. The memory array of claim 1 wherein the voids have peripheries along a cross-section; the peripheries having bottom regions and sidewall regions; the bottom regions and sidewall regions of the peripheries of the voids being bounded by silicon nitride.

15. The integrated assembly of claim 10 wherein the voids have peripheries along a cross-section; the peripheries having top regions being bounded by conductive material.

16. The integrated assembly of claim 15 wherein the conductive material comprises the conductive plate.

17. The integrated assembly of claim 15 wherein the conductive material comprises metal nitride.

18. The integrated assembly of claim 17 wherein the metal nitride comprises titanium nitride.

19. The integrated assembly of claim 1, further comprising:
insulative supports over the bitlines; and
the conductive plate supported by the insulative supports.

20. The integrated assembly of claim 19 wherein the conductive plate is electrically coupled with a reference source.

21. The integrated assembly of claim 20 wherein the reference source has ground voltage.

22. The integrated assembly of claim 19 wherein the intervening voids extend to a lower surface of the conductive plate.

23. The integrated assembly of claim 19 wherein the conductive plate comprises metal nitride.

24. The integrated assembly of claim 19 wherein the conductive plate comprises titanium nitride.

25. The integrated assembly of claim 19 wherein the voids have peripheries along a cross-section; the peripheries having bottom regions and sidewall regions; the bottom regions and sidewall regions of the peripheries of the voids being bounded by silicon nitride.

26. The integrated assembly of claim 19 wherein the wordlines are vertically offset from the bitlines and crossing the bitlines; and further comprising
memory cells proximate locations where the wordlines cross the bitlines; each of the memory cells being uniquely addressed by the combination of a wordline and a bitline; lateral peripheries of each of the memory cells fitting within an area of $4F^2$.

* * * * *